US 9,513,560 B2

(12) United States Patent
Tanaka et al.

(10) Patent No.: US 9,513,560 B2
(45) Date of Patent: Dec. 6, 2016

(54) ILLUMINATION OPTICAL ASSEMBLY, EXPOSURE APPARATUS, AND DEVICE MANUFACTURING METHOD

(71) Applicant: Nikon Corporation, Chiyoda-ku, Tokyo (JP)

(72) Inventors: Hirohisa Tanaka, Tokyo (JP); Hiroshi Ooki, Tokyo (JP); Shinichi Nakajima, Tokyo (JP)

(73) Assignee: Nikon Corporation, Tokyo (JP)

( * ) Notice: Subject to any disclaimer, the term of this patent is extended or adjusted under 35 U.S.C. 154(b) by 143 days.

(21) Appl. No.: 14/261,194

(22) Filed: Apr. 24, 2014

(65) Prior Publication Data

US 2014/0307245 A1    Oct. 16, 2014

Related U.S. Application Data

(63) Continuation of application No. PCT/JP2012/076916, filed on Oct. 18, 2012.

(60) Provisional application No. 61/550,656, filed on Oct. 24, 2011.

(30) Foreign Application Priority Data

Jan. 12, 2012    (JP) ................................ 2012-004523

(51) Int. Cl.
*G03B 27/72* (2006.01)
*G03F 7/20* (2006.01)

(52) U.S. Cl.
CPC ....... *G03F 7/70091* (2013.01); *G03F 7/70566* (2013.01)

(58) Field of Classification Search
CPC .................. G03F 7/70091; G03F 7/70566

USPC ............................................... 355/71
See application file for complete search history.

(56) References Cited

U.S. PATENT DOCUMENTS

| 5,312,513 A | 5/1994 | Florence et al. |
| 5,867,302 A | 2/1999 | Fleming |

(Continued)

FOREIGN PATENT DOCUMENTS

| EP | 0779530 | 6/1997 |
| EP | 1420298 A2 | 5/2004 |

(Continued)

OTHER PUBLICATIONS

International Search Report from International Application No. PCT/JP2012/076916, Nov. 13, 2012.

*Primary Examiner* — Peter B Kim
(74) *Attorney, Agent, or Firm* — Shapiro, Gabor and Rosenberger, PLLC

(57) ABSTRACT

An illumination optical system can form a pupil intensity distribution with a desired beam profile. The illumination optical system for illuminating an illumination target surface with light from a light source is provided with a spatial light modulator which has a plurality of optical elements arrayed on a predetermined surface and individually controlled and which variably forms a light intensity distribution on an illumination pupil of the illumination optical system; a divergence angle providing member which is arranged in a conjugate space including a surface optically conjugate with the predetermined surface and which provides a divergence angle to an incident beam and emits the beam; and a polarizing member which is arranged at a position in the vicinity of the predetermined surface or in the conjugate space and which changes a polarization state of a partial beam of a propagating beam propagating in an optical path.

48 Claims, 32 Drawing Sheets

(56) References Cited

U.S. PATENT DOCUMENTS

| | | |
|---|---|---|
| 6,480,320 B2 | 11/2002 | Nasiri |
| 6,600,591 B2 | 7/2003 | Anderson et al. |
| 6,733,144 B2 | 5/2004 | Kwon |
| 6,885,493 B2 | 4/2005 | Ljungblad et al. |
| 6,891,655 B2 | 5/2005 | Grebinski et al. |
| 6,900,915 B2 | 5/2005 | Nanjyo et al. |
| 6,913,373 B2 | 7/2005 | Tanaka et al. |
| 7,095,546 B2 | 8/2006 | Mala et al. |
| 7,295,726 B1 | 11/2007 | Milanovic et al. |
| 7,424,330 B2 | 9/2008 | Duerr et al. |
| 7,567,375 B2 | 7/2009 | Enoksson et al. |
| 2005/0095749 A1 | 5/2005 | Krellmann et al. |
| 2007/0242247 A1 | 10/2007 | Shiraishi |
| 2007/0296936 A1 | 12/2007 | Kato et al. |
| 2008/0030707 A1 | 2/2008 | Tanaka et al. |
| 2008/0309901 A1 | 12/2008 | Rene Soemers et al. |
| 2009/0116093 A1 | 5/2009 | Tanitsu |
| 2009/0316132 A1 | 12/2009 | Tanitsu et al. |
| 2010/0020302 A1 | 1/2010 | Freimann |
| 2011/0069305 A1 | 3/2011 | Tanitsu et al. |
| 2011/0181852 A1 | 7/2011 | Bleidistel et al. |
| 2011/0188017 A1 | 8/2011 | Horn et al. |

FOREIGN PATENT DOCUMENTS

| | | |
|---|---|---|
| JP | H6-124873 | 5/1994 |
| JP | H10-303114 | 11/1998 |
| JP | 2006-113437 | 4/2006 |
| WO | WO 99/49504 | 9/1999 |

FROM CR

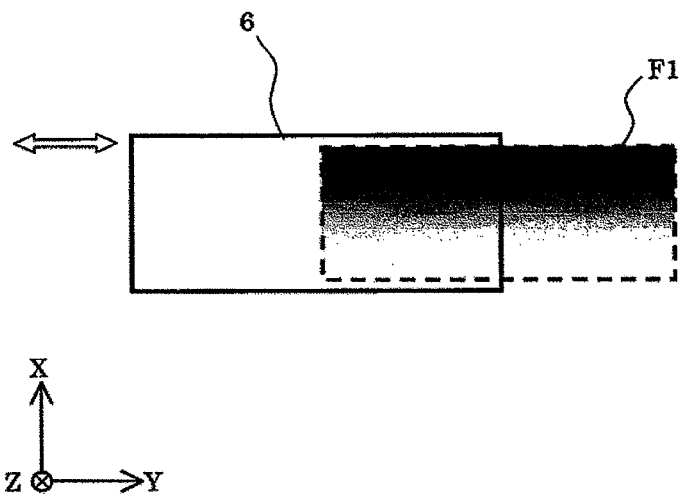
Fig.22A
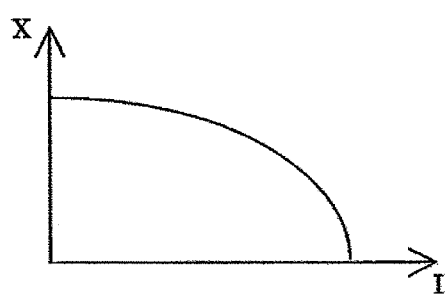 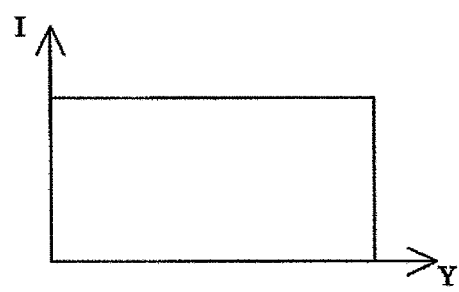
Fig.22B   Fig.22C

ILLUMINATION OPTICAL ASSEMBLY, EXPOSURE APPARATUS, AND DEVICE MANUFACTURING METHOD

TECHNICAL FIELD

The present invention relates to an illumination optical system, an exposure apparatus, and a device manufacturing method.

BACKGROUND ART

In an exposure apparatus used in manufacture of devices such as semiconductor devices, light emitted from a light source travels through a fly's eye lens as optical integrator to form a secondary light source (which is generally a predetermined light intensity distribution on an illumination pupil) as a substantial surface illuminant consisting of a large number of light sources. The light intensity distribution on the illumination pupil will be referred to hereinafter as "pupil intensity distribution." Furthermore, the illumination pupil is defined as a position such that by action of an optical system between the illumination pupil and an illumination target surface (a mask or a wafer in the case of the exposure apparatus), the illumination target surface is kept as a Fourier transform surface of the illumination pupil.

Light from the secondary light source is condensed by a condenser optical system and thereafter illuminates the mask with a predetermined pattern formed thereon, in a superimposed manner. Light transmitted by the mask travels through a projection optical system to be imaged on the wafer, whereby the mask pattern is projected (or transferred) onto the wafer. Since the pattern formed on the mask is micronized, it is indispensable to obtain a homogeneous illuminance distribution on the wafer, in order to implement accurate transfer of the microscopic patter onto the wafer.

There is the conventionally-proposed illumination optical system capable of continuously changing the pupil intensity distribution (and, in turn, an illumination condition) without use of a zoom optical system (e.g., cf. Patent Literature 1). This illumination optical system uses a movable multi-mirror composed of a large number of microscopic mirror elements which are arranged in an array pattern and inclination angles and inclination directions of which are individually driven and controlled, to divide an incident beam into microscopic units corresponding to respective reflective faces and deflect divided beams, thereby to convert a cross section of the beam into a desired shape or a desired size and, in turn, to realize a desired pupil intensity distribution.

CITATION LIST

Patent Literature

Patent Literature 1: U.S. Pat. Published Application No. 2009/0116093

SUMMARY OF INVENTION

Technical Problem

Since the conventional illumination optical system uses a spatial light modulator having a plurality of mirror elements postures of which are individually controlled, degrees of freedom are high for change in contour shape (which is a general concept embracing the size) of the pupil intensity distribution. However, for realizing a desired illumination condition suitable for transfer of a microscopic pattern, there are demands for forming the pupil intensity distribution with a desired beam profile, in addition to the desired contour shape.

The present invention has been accomplished in light of the above-described problem, and it is an object of the present invention to provide an illumination optical system capable of forming a pupil intensity distribution with a desired beam profile. It is another object of the present invention to provide an exposure apparatus and a device manufacturing method capable of transferring a microscopic pattern onto a photosensitive substrate under an appropriate illumination condition, using the illumination optical system for forming the pupil intensity distribution with the desired beam profile.

Solution to Problem

In order to solve the above problem, a first aspect provides an illumination optical system for illuminating an illumination target surface with light from a light source, the illumination optical system comprising:

a spatial light modulator which has a plurality of optical elements arrayed on a predetermined surface and individually controlled, and which variably forms a light intensity distribution on an illumination pupil of the illumination optical system;

a divergence angle providing member which is arranged in a conjugate space including a surface optically conjugate with the predetermined surface and which provides a divergence angle to an incident beam and emits the beam; and a polarizing member which is arranged in a predetermined space including the predetermined surface or in the conjugate space and which changes a polarization state of a partial beam of a propagating beam propagating in an optical path.

A second aspect provides an illumination optical system for illuminating an illumination target surface with light from a light source, the illumination optical system comprising:

a spatial light modulator which has a plurality of optical elements arrayed on a predetermined surface and individually controlled, and which variably forms a light intensity distribution on an illumination pupil of the illumination optical system; and a divergence angle providing member which is arranged in a conjugate space including a surface optically conjugate with the predetermined surface and which provides a divergence angle to at least a partial beam of a propagating beam propagating in an optical path, to generate a plurality of beams with different divergence angles.

A third aspect provides an exposure apparatus comprising the illumination optical system of the first aspect or the second aspect for illuminating a predetermined pattern, which implements exposure of a photosensitive substrate with the predetermined pattern.

A fourth aspect provides a device manufacturing method comprising:

performing the exposure of the photosensitive substrate with the predetermined pattern, using the exposure apparatus of the third aspect;

developing the photosensitive substrate on which the predetermined pattern has been transferred, to form a mask layer in a shape corresponding to the predetermined pattern on a surface of the photosensitive substrate; and processing the surface of the photosensitive substrate through the mask layer.

A fifth aspect provides an illumination optical system for illuminating an illumination target surface with light from a light source, the illumination optical system comprising:

an input device for implementing input of light quantity distribution information of a target image on a first surface;

a spatial light modulator having N (N is an integer larger than K) optical elements which guide the light from the light source to respective local regions at positions variable on the first surface and which can be divided into K (K is an integer of not less than 2) optical element groups;

K filter portions which control variables about states of the local regions in K groups guided to the first surface by the K optical element groups, group by group;

an arithmetic unit which determines N first values of the positions and N1 (N1 is an integer not more than N and larger than K) values of the variables of the local regions, depending upon an error between a first image obtained by arranging N aforementioned local regions on the first surface and the target image, which divides the N local regions into the K groups depending upon the N1 values of the variables, and which determines common second values as values of the variables for the respective K groups; and a condenser optical system which sets the positions of the corresponding local regions for the respective K optical elements, to the first values and sets the variables to the second values and which illuminates the illumination target surface with light from a light quantity distribution of a second image formed on the first surface.

A sixth aspect provides an exposure apparatus for illuminating a pattern with exposure light and implementing exposure of a substrate with the exposure light via the pattern and a projection optical system, the exposure apparatus comprising:

the illumination optical system of the fifth aspect, wherein the pattern is illuminated with the exposure light by the illumination optical system.

A seventh aspect provides a device manufacturing method comprising:

forming a pattern of a photosensitive layer on the substrate, using the exposure apparatus of the sixth aspect; and processing the substrate on which the pattern has been formed.

An eighth aspect provides a method for forming an image, the method comprising:

setting a target image on a first surface;

concerning N (N is an integer larger than K) local regions respective positions of which can be controlled on the first surface and which can be divided into K (K is an integer of not less than 2) groups variables about states of which can be controlled group by group, determining N first values of the positions and N1 (N1 is an integer not more than N and larger than K) values of the variables of the local regions, depending upon an error between a first image obtained by arranging the N local regions on the first surface and the target image;

dividing the N local regions into the K groups depending upon the N1 values of the variables; and determining common second values as values of the variables of the local regions in the K groups.

A ninth aspect provides an illumination method for illuminating an illumination target surface with light from a light source, the illumination method comprising:

forming a light quantity distribution of the light from the light source based on the target image on the first surface, using the image forming method of the eighth aspect; and guiding light from the first surface via a condenser optical system to the illumination target surface.

A tenth aspect provides an exposure method for illuminating a pattern with exposure light and implementing exposure of a substrate with the exposure light via the pattern and the projection optical system, wherein the pattern is illuminated with the exposure light by the illumination method of the ninth aspect.

An eleventh aspect provides a device manufacturing method comprising:

forming a pattern of a photosensitive layer on the substrate, using the exposure method of the tenth aspect; and processing the substrate on which the pattern has been formed.

BRIEF DESCRIPTION OF DRAWINGS

FIG. 22A, FIG. 22B, and FIG. 22C are drawings showing an example in which a light intensity distribution of a beam incident to a polarizing member is made inhomogeneous.

DESCRIPTION OF EMBODIMENTS

Figure 1:
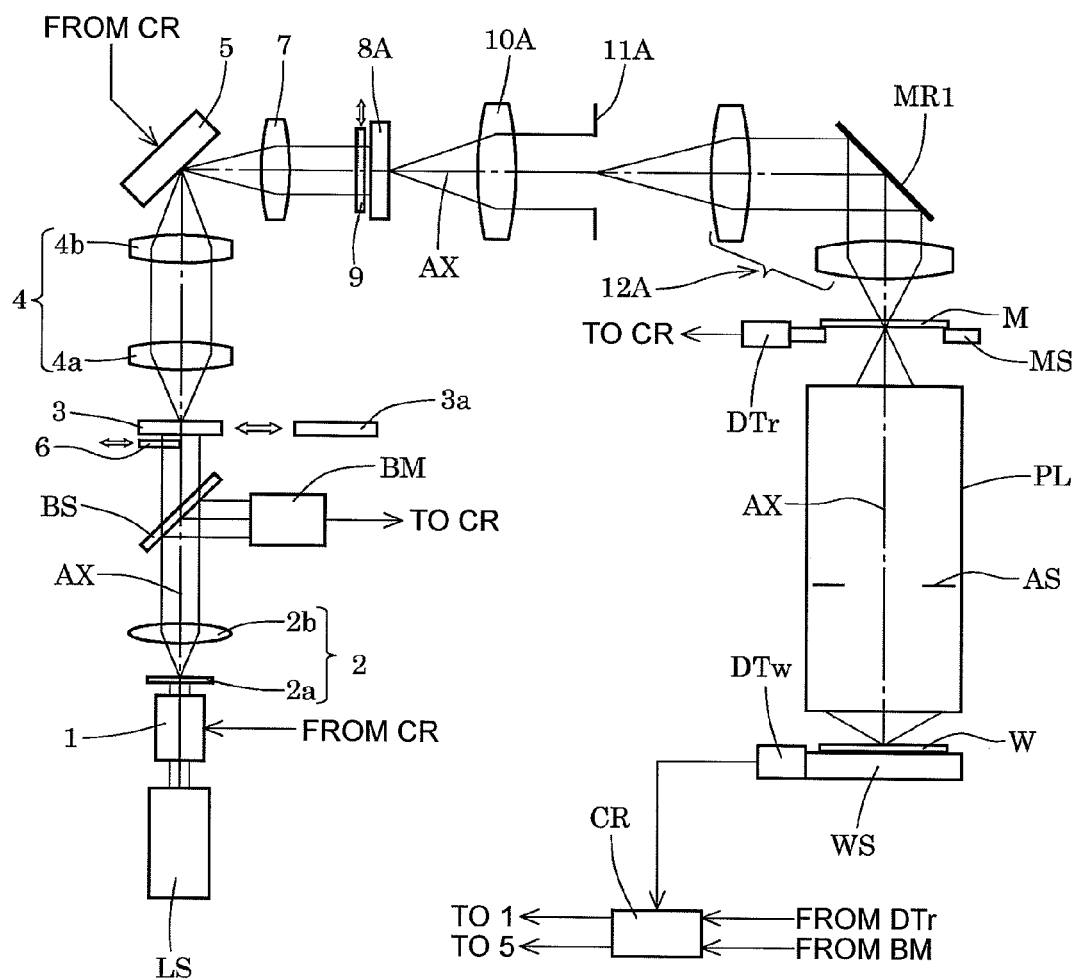
FIG. 1 is a drawing schematically showing a configuration of an exposure apparatus according to an embodiment.

Embodiments will be described below based on the accompanying drawings. FIG. 1 is a drawing schematically showing a configuration of an exposure apparatus according to an embodiment. In FIG. 1, the Z-axis is set along a direction of a normal to a transfer surface (exposure surface) of a wafer W being a photosensitive substrate, the Y-axis in a direction parallel to the plane of FIG. 1 in the transfer surface of the wafer W, and the X-axis in a direction perpendicular to the plane of FIG. 1 in the transfer surface of the wafer W.

Referring to FIG. 1, exposure light (illumination light) is supplied from a light source LS in the exposure apparatus of the present embodiment. Examples of the light source LS to be used herein include an ArF excimer laser light source which supplies light at the wavelength of 193 nm, a KrF excimer laser light source which supplies light at the wavelength of 248 nm, and so on. The light emitted in the +Z-direction from the light source LS travels through a beam sending unit 1, a lens array 2a, and a relay optical system 2b to impinge on a diffractive optical element 3. The diffractive optical element 3 is configured so as to be freely inserted into or retracted from the optical path and functions as a divergence angle providing member which provides a divergence angle to an incident beam and emits the beam.

The light having passed through the diffractive optical element 3 travels through a reimaging optical system 4 consisting of a front lens unit 4a and a rear lens unit 4b, to impinge on a spatial light modulator 5. The spatial light modulator 5, as described below, has a plurality of mirror elements arrayed in a predetermined surface and individually controlled, and a drive unit for individually controlling and driving postures of the plurality of mirror elements, based on a control signal from a control system CR. An array surface of the mirror elements of the spatial light modulator 5 (which will be referred to hereinafter as "array surface of the spatial light modulator") is located at a position approximately optically conjugate with the diffractive optical element 3, through the reimaging optical system 4. It is noted herein that the array surface of the spatial light modulator as the predetermined surface can be regarded as being located in a predetermined space which is a space in an optical path between optical elements with power adjacent to the array surface. Furthermore, the predetermined space can also be regarded as an optical path between the optical element with power adjacent to the array surface on the entrance side of the light with respect to the array surface of the spatial light modulator and the optical element with power adjacent to the array surface on the exit side of the light with respect to the array surface of the spatial light modulator.

The beam sending unit 1 has functions to guide the incident beam from the light source LS to the diffractive optical element 3 (and in turn to the spatial light modulator 5) while converting the incident beam into a beam with a cross section of appropriate size and shape, and to actively correct positional variation and angular variation of the light impinging on the array surface of the spatial light modulator 5. The lens array 2a is composed, for example, of a plurality of lens elements arranged lengthwise and crosswise and densely along a plane perpendicular to the optical axis AX and implements wavefront division of the beam coming from the light source LS through the beam sending unit 1, into a plurality of beams.

The plurality of beams resulting from the wavefront division by the lens array 2a travel through the relay optical system 2b to be superimposed on the entrance plane of the diffractive optical element 3 and in turn travel through the reimaging optical system 4 to be superimposed on the array surface of the spatial light modulator 5. Namely, the lens array 2a as wavefront division element and the relay optical system 2b constitute a light intensity homogenizing member 2 for improving homogeneity of an intensity distribution of the light incident to the diffractive optical element 3. Furthermore, the lens array 2a, relay optical system 2b, and reimaging optical system 4 constitute a light intensity homogenizing member for making homogeneity in the array surface of an intensity distribution of the light incident to the array surface of the spatial light modulator 5, higher than homogeneity of an intensity distribution of the light incident to the lens array 2a, on the plane where the lens array 2a is located. Here, focal positions of the respective lens elements of the lens array 2a (or positions of divergence origins of the beams resulting from the wavefront division) are approximately coincident with a front focal position of the relay optical system 2b, and a rear focal position of the relay optical system 2b is approximately coincident with the entrance plane of the diffractive optical element 3. Furthermore, the reimaging optical system 4 has a function to keep a surface where the diffractive optical element 3 is located, optically conjugate with the array surface of the spatial light modulator 5.

A beam splitter BS is arranged in the optical path between the relay optical system 2b and the diffractive optical element 3 and light extracted from the illumination optical path by the beam splitter BS is incident to a beam monitor BM. The beam monitor BM measures a position in the array surface of the light incident to the spatial light modulator 5, an angle to the array surface of the light incident to the spatial light modulator 5, and a light intensity distribution on the array surface of the spatial light modulator 5, based on the light extracted from the illumination optical path. The beam splitter BS to be used can be, for example, an amplitude division type beam splitter or a polarization beam splitter.

The result of the measurement by the beam monitor BM is supplied to the control system CR. The control system CR controls the beam sending unit 1 and the spatial light modulator 5, based on the output from the beam monitor BM. The beam monitor BM may be provided with a first imaging unit having a photoelectric conversion surface arranged at a position optically conjugate with the array surface of the spatial light modulator 5 (a position being approximately in an optical Fourier transform relation with the lens array 2a), for measuring the position of incidence and the light intensity distribution of the light on the array surface of the spatial light modulator 5 and with a second imaging unit having a photoelectric conversion surface arranged at a position being approximately in an optical Fourier transform relation with the array surface of the spatial light modulator 5 (a position being approximately optically conjugate with the lens array 2a), for measuring the angle of incidence of light on the array surface of the light incident to the spatial light modulator 5. The internal configuration of the beam monitor BM is disclosed, for example, in U.S. Pat. Published Application No. 2011/0069305.

A half wave plate 6 is provided in a configuration wherein it is freely inserted into or retracted from a partial optical path of the illumination optical path (or movable in the Y-directions in FIG. 1) at a position immediately in front of the diffractive optical element 3. The half wave plate 6 functions as a polarizing member for changing a polarization state of a partial beam of a propagating beam propagating in the illumination optical path. The configuration and action of the spatial light modulator 5 will be described later. Furthermore, the cooperative action of the diffractive optical element 3 as divergence angle providing member and the half wave plate 6 as polarizing member with the spatial light modulator 5 will be described later.

The light emitted into the +Y-direction from the spatial light modulator 5 travels through a relay optical system 7 to impinge on a micro fly's eye lens (or on a fly's eye lens) 8A. The relay optical system 7 has its front focal position located in the vicinity of the array surface of the spatial light modulator 5 and its rear focal position located in the vicinity of an entrance plane of the micro fly's eye lens 8A, and sets the array surface of the spatial light modulator 5 and the entrance plane of the micro fly's eye lens 8A in an optical Fourier transform relation. Therefore, the light having traveled via the spatial light modulator 5, as described below, variably forms a light intensity distribution according to the postures of the mirror elements on the entrance plane of the micro fly's eye lens 8A.

A polarization conversion unit 9 configured so as to be freely inserted into or retracted from the illumination optical path is provided at a position immediately in front of the micro fly's eye lens 8A. The polarization conversion unit 9 has a function to convert linearly-polarized incident light with a polarization direction along a predetermined direction into emergent light in a circumferential polarization state or into emergent light in a radial polarization state. The configuration and action of the polarization conversion unit 9 will be described later.

The micro fly's eye lens 8A is, for example, an optical element consisting of a large number of microscopic lenses with a positive refracting power arrayed lengthwise and crosswise and densely and is constructed by subjecting a plane-parallel plate to an etching process to form a microscopic lens group. In the micro fly's eye lens, different from a fly's eye lens consisting of mutually isolated lens elements, the large number of microscopic lenses (microscopic refractive faces) are integrally formed without being isolated from each other. However, the micro fly's eye lens is an optical integrator of the same wavefront division type as the fly's eye lens in the sense that the lens elements are arranged lengthwise and crosswise.

The rectangular microscopic refractive faces as unit wavefront division faces in the micro fly's eye lens 8A are of a rectangular shape similar to a shape of an illumination field to be formed on the mask M (and in turn to a shape of an exposure region to be formed on the wafer W). It is noted that, for example, a cylindrical micro fly's eye lens can also be used as the micro fly's eye lens 8A. The configuration and action of the cylindrical micro fly's eye lens are disclosed, for example, in U.S. Pat. No. 6,913,373.

The beam incident to the micro fly's eye lens 8A is two-dimensionally divided by the large number of microscopic lenses and a secondary light source with much the same light intensity distribution as a light intensity distribution formed on the entrance plane (which is a substantial surface illuminant consisting of a large number of small light sources: pupil intensity distribution) is formed on its rear focal plane or on an illumination pupil in the vicinity thereof. Light from the secondary light source formed on the illumination pupil immediately behind the micro fly's eye lens 8A travels through a condenser optical system 10A to illuminate a mask blind 11A in a superimposed manner. It is noted herein that a front focal position of the condenser optical system 10A may be located at the position of the secondary light source formed immediately behind the micro fly's eye lens 8A and a rear focal position of the condenser optical system 10A may be set at a setting plane of the mask blind 11A.

In this way, a rectangular illumination field depending on the shape and focal distance of the entrance faces (wavefront division faces) of the rectangular microscopic refractive faces of the micro fly's eye lens 8A is formed on the mask blind 11A as illumination field stop. An illumination aperture stop with an aperture (light transmitting portion) of a shape corresponding to the secondary light source may be arranged at or near the rear focal plane of the micro fly's eye lens 8A, i.e., at a position approximately optically conjugate with an entrance pupil plane of a below-described projection optical system PL.

A beam passing through the rectangular aperture (light transmitting portion) of the mask blind 11A is subject to focusing action of an imaging optical system 12A and is reflected into the −Z-direction by an optical path bending mirror MR1 arranged in the optical path of the imaging optical system 12A, thereafter to illuminate the mask M with a predetermined pattern thereon in a superimposed manner. Namely, the imaging optical system 12A keeps the rectangular aperture of the mask blind 11A optically conjugate with the mask M and forms an image of the rectangular aperture of the mask blind 11A on the mask M.

A beam transmitted by the mask M held on a mask stage MS travels through the projection optical system PL to form an image of the mask pattern on the wafer (photosensitive substrate) W held on a wafer stage WS. In this manner, one-shot exposure or scanning exposure is performed while two-dimensionally driving and controlling the wafer stage WS in a plane (XY plane) perpendicular to the optical axis AX of the projection optical system PL and, in turn, two-dimensionally driving and controlling the wafer W, whereby each of exposure regions on the wafer W is sequentially exposed with the pattern on the mask M.

The exposure apparatus of the present embodiment is provided with a first pupil intensity distribution measuring unit DTr for measuring a pupil intensity distribution on an exit pupil plane of the illumination optical system, based on the light having traveled via the illumination optical system (1 to 12A), a second pupil intensity distribution measuring unit DTw for measuring a pupil intensity distribution on a pupil plane of the projection optical system PL (exit pupil plane of the projection optical system PL), based on light having traveled via the projection optical system PL, and the control system CR for controlling the spatial light modulator 5, based on at least one of the measurement results by the first and second pupil intensity distribution measuring units DTr, DTw, and for totally controlling the operation of the exposure apparatus.

The first pupil intensity distribution measuring unit DTr is provided, for example, with an imaging unit having a photoelectric conversion surface arranged at a position optically conjugate with the exit pupil position of the illumination optical system and measures the pupil intensity distribution about points on the illumination target surface by the illumination optical system (the pupil intensity distribution formed at the exit pupil position of the illumination optical system by light beams impinging on the respective points). Furthermore, the second pupil intensity distribution measuring unit DTw is provided, for example, with an imaging unit having a photoelectric conversion surface arranged at a position optically conjugate with the exit pupil position of the projection optical system PL and measures the pupil intensity distribution about points on the image plane of the projection optical system PL (the pupil intensity distribution formed at the exit pupil position of the projection optical system PL by light beams impinging on the respective points).

For the detailed configuration and action of the first and second pupil intensity distribution measuring units DTr, DTw, reference can be made, for example, to the specification of U.S. Pat. Published Application No. 2008/0030707. Furthermore, for the pupil intensity distribution measuring units, reference can also be made to the disclosure of U.S. Pat. Published Application No. 2010/0020302.

In the present embodiment, the mask M arranged on the illumination target surface of the illumination optical system (and in turn the wafer W) is illuminated by Kohler illumination, using as a light source the secondary light source formed by the micro fly's eye lens 8A. For this reason, the position where the secondary light source is formed is optically conjugate with the position of the aperture stop AS of the projection optical system PL and the plane where the secondary light source is formed can be called an illumination pupil plane of the illumination optical system. Furthermore, an image of this forming plane of the secondary light source can be called an exit pupil plane of the illumination optical system. Typically, the illumination target surface (the surface where the mask M is located, or the surface where the wafer W is located in the case where the illumination optical system is considered as including the projection optical system PL) is an optical Fourier transform surface for the illumination pupil plane. The pupil intensity distribution is a light intensity distribution (luminance distribution) on the illumination pupil plane of the illumination optical system or on a plane optically conjugate with the illumination pupil plane.

When the number of wavefront divisions by the micro fly's eye lens 8A is relatively large, a high correlation is demonstrated between a global light intensity distribution formed on the entrance plane of the micro fly's eye lens 8A and a global light intensity distribution (pupil intensity distribution) of the entire secondary light source. For this reason, the entrance plane of the micro fly's eye lens 8A and planes optically conjugate with the entrance plane can also be called illumination pupil planes and light intensity distributions on these planes can also be referred to as pupil intensity distributions. In the configuration of FIG. 1, the relay optical system 7 and the micro fly's eye lens 8A constitute a means for forming the pupil intensity distribution on the illumination pupil immediately behind the micro fly's eye lens 8A, based on the beam having traveled via the spatial light modulator 5.

Figure 2:
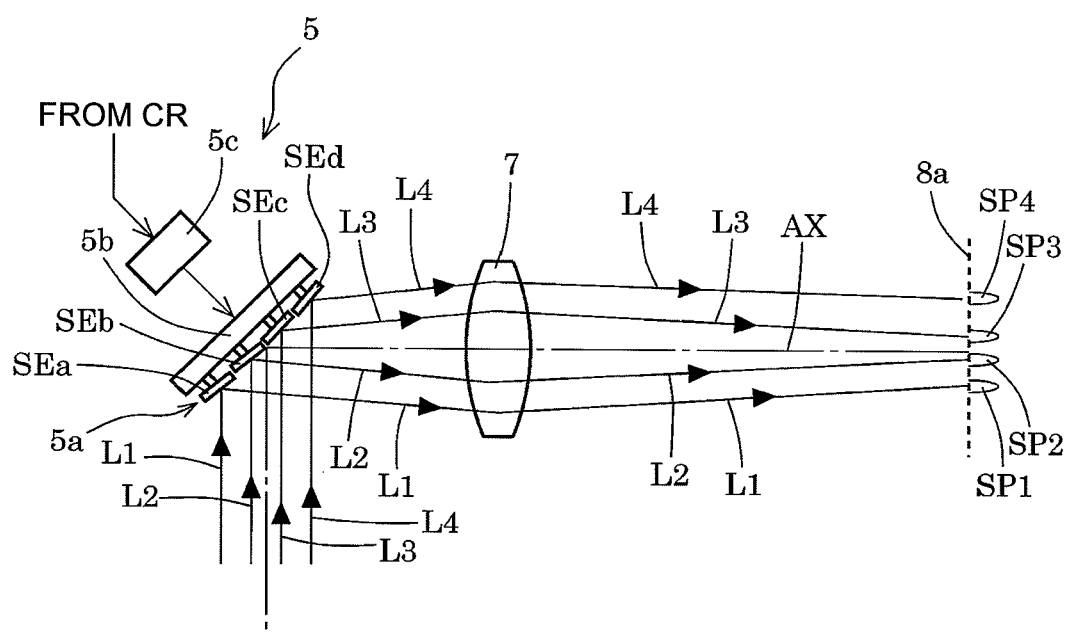
FIG. 2 is a drawing for illustrating a configuration and action of a spatial light modulator.
Figure 2:
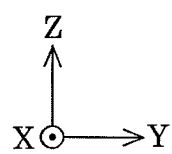

Next, the configuration and action of the spatial light modulator 5 will be described specifically. The spatial light modulator 5 is provided, as shown in FIG. 2, with a plurality of mirror elements 5a arrayed in a predetermined surface, a base 5b holding the plurality of mirror elements 5a, and a drive unit 5c for individually controlling and driving postures of the mirror elements 5a through a cable (not shown) connected to the base 5b. FIG. 2 shows the optical path from the spatial light modulator 5 to the entrance plane 8a of the micro fly's eye lens 8A, without illustration of the polarization conversion unit 9.

Figure 3:
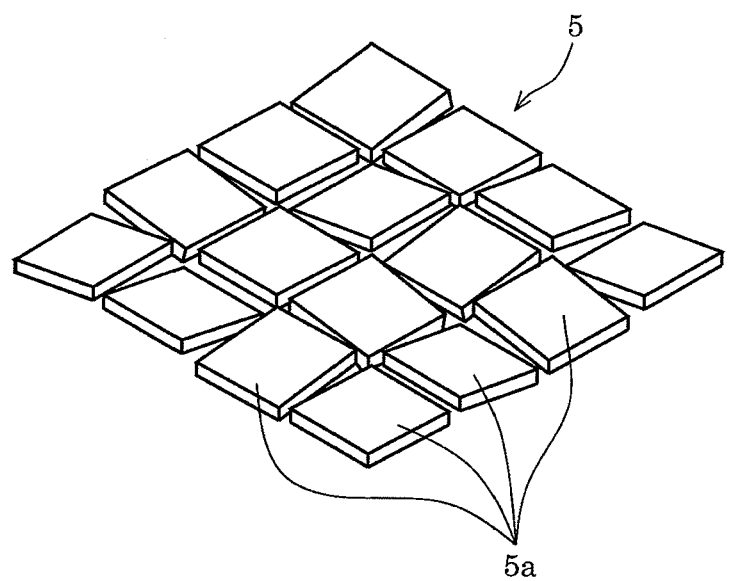
FIG. 3 is a partial perspective view of major part of the spatial light modulator.

In the spatial light modulator 5, the postures of the mirror elements 5a each are changed by action of the drive unit 5c operating based on instructions from the control system CR, whereby each of the mirror elements 5a is set in a predetermined orientation. The spatial light modulator 5 is provided, as shown in FIG. 3, with the plurality of microscopic mirror elements 5a arrayed two-dimensionally and variably provides incident light with spatial modulation depending on its position of incidence and emits the modulated light. For simplicity of the description and illustration, FIGS. 2 and 3 show the configuration example wherein the spatial light modulator 5 has the mirror elements 5a as many as 4×4=16 elements, but in fact it has the mirror elements 5a far more than the sixteen mirror elements. For example, the spatial light modulator 5 may have the mirror elements 5a as many as about 4,000 to 10,000 mirror elements.

Referring to FIG. 2, of a ray group incident to the spatial light modulator 5, a ray L1 impinges on a mirror element SEa out of the plurality of mirror elements 5a and a ray L2 on a mirror element SEb different from the mirror element SEa. Similarly, a ray L3 impinges on a mirror element SEc different from the mirror elements SEa, SEb and a ray L4 on a mirror element SEd different from the mirror elements SEa-SEc. The mirror elements SEa-SEd provide the respective rays L1-L4 with respective spatial modulations set depending on their positions.

The spatial light modulator 5 is configured so that in a standard state in which the reflective faces of all the mirror elements 5a are set along one plane, a ray incident along a direction parallel to the optical axis AX of the reimaging optical system 4 is reflected on the spatial light modulator 5 and thereafter travels in a direction parallel to the optical axis AX of the relay optical system 7. Furthermore, as described above, the array surface of the mirror elements 5a of the spatial light modulator 5 and the entrance plane 8a of the micro fly's eye lens 8A are located in the optical Fourier transform relation through the relay optical system 7.

Therefore, the rays reflected by the mirror elements SEa-SEd of the spatial light modulator 5 while being provided with a predetermined angle distribution form predetermined light intensity distributions SP1 to SP4 on the entrance plane 8a of the micro fly's eye lens 8A. Namely, while the relay optical system 7 is arranged with its front focal position located at the array surface of the spatial light modulator 5 and its rear focal position located at the entrance plane 8a of the micro fly's eye lens 8A, it converts angles provided to the respective emergent rays by the mirror elements SEa-SEd of the spatial light modulator 5, to positions on the entrance plane 8a being the far field (Fraunhofer diffraction region) of the spatial light modulator 5. In this manner, the light intensity distribution (pupil intensity distribution) of the secondary light source formed by the micro fly's eye lens 8A becomes a distribution corresponding to the light intensity distribution formed on the entrance plane 8a of the micro fly's eye lens 8A by the spatial light modulator 5 and the relay optical system 7. It is noted that the front focal position of the relay optical system 7 may be located at a position off the array surface of the spatial light modulator 5 as long as it resides in the aforementioned predetermined space. Furthermore, the rear focal position of the relay optical system 7 may be located in the vicinity of the entrance plane 8a without need for being located exactly at the position of the entrance plane 8a of the micro fly's eye lens 8A.

The spatial light modulator 5, as shown in FIG. 3, is a movable multi-mirror including the mirror elements 5a which are a large number of microscopic reflective elements arrayed regularly and two-dimensionally along one plane with their planar reflective faces facing up. Each mirror element 5a is movable and an inclination of its reflective face, which is defined by an inclination angle and an inclination direction of the reflective face, is independently controlled by action of the drive unit 5c operating based on a control signal from the control system CR. Each mirror element 5a can be continuously or discretely rotated by a desired rotation angle about two directions parallel to its reflective face and perpendicular to each other, as rotation axes. Namely, the inclination of the reflecting face of each mirror element 5a can be two-dimensionally controlled.

In the case where the reflecting face of each mirror element 5a is discretely rotated, it is preferable to control it by switching the rotation angle in a plurality of states (e.g., . . . , −2.5°, −2.0°, . . . 0°, +0.5° . . . +2.5°, . . . ). FIG. 3 shows the mirror elements 5a with their contour shape of square shape, but the contour shape of the mirror elements 5a is not limited to the square shape. However, in view of light utilization efficiency, it is possible to adopt a shape allowing an array with gaps between the mirror elements 5a as small as possible (shape permitting the closest packing). In addition, in view of light utilization efficiency, the gaps between two adjacent mirror elements 5a can be kept down to the necessary minimum.

In the present embodiment, the spatial light modulator 5 to be used is, for example, the spatial light modulator in which each of the orientations of the plurality of mirror elements 5a arrayed two-dimensionally is continuously changed. Such a spatial light modulator to be used herein can be one of the spatial light modulators disclosed, for example, in European Patent Application Publication EP 779530, U.S. Pat. No. 5,867,302, U.S. Pat. No. 6,480,320, U.S. Pat. No. 6,600,591, U.S. Pat. No. 6,733,144, U.S. Pat. No. 6,900,915, U.S. Pat. No. 7,095,546, U.S. Pat. No. 7,296,726, U.S. Pat. No. 7,424,330, U.S. Pat. No. 7,567,375, U.S. Pat. Published Application No. 2008/0309901, U.S. Pat. Published Application No. 2011/0181852, U.S. Pat. Published Application No. 2011/188017, and Japanese Patent Application Laid-Open Publication No. 2006-113437. It is noted that the orientations of the mirror elements 5a arrayed two-dimensionally may be controlled so as to have a plurality of discrete stages.

In the spatial light modulator 5, the postures of the mirror elements 5a each are changed by action of the drive unit 5c operating in accordance with a control signal from the control system CR, whereby each of the mirror elements 5a is set in a predetermined orientation. Rays reflected at respective predetermined angles by the mirror elements 5a of the spatial light modulator 5 form a desired pupil intensity distribution on the illumination pupil of the entrance plane 8a of the micro fly's eye lens 8A and, in turn, on the illumination pupil immediately behind the micro fly's eye lens 8A. Furthermore, a desired pupil intensity distribution is also formed at positions of other illumination pupils optically conjugate with the illumination pupil immediately behind the micro fly's eye lens 8A, i.e., at the pupil position of the imaging optical system 12A and at the pupil position of the projection optical system PL (the position where the aperture stop AS is located).

As described above, the spatial light modulator 5 variably forms the pupil intensity distribution on the illumination pupil immediately behind the micro fly's eye lens 8A. The relay optical system 7 constitutes a distribution forming optical system for imaging the far field pattern formed in the far field by the mirror elements 5a of the spatial light modulator 5, on the illumination pupil of the entrance plane 8a of the micro fly's eye lens 8A. This distribution forming optical system converts a distribution of angular directions of emergent beams from the spatial light modulator 5, into a position distribution on the cross section of the emergent beam from the distribution forming optical system.

Figure 4:
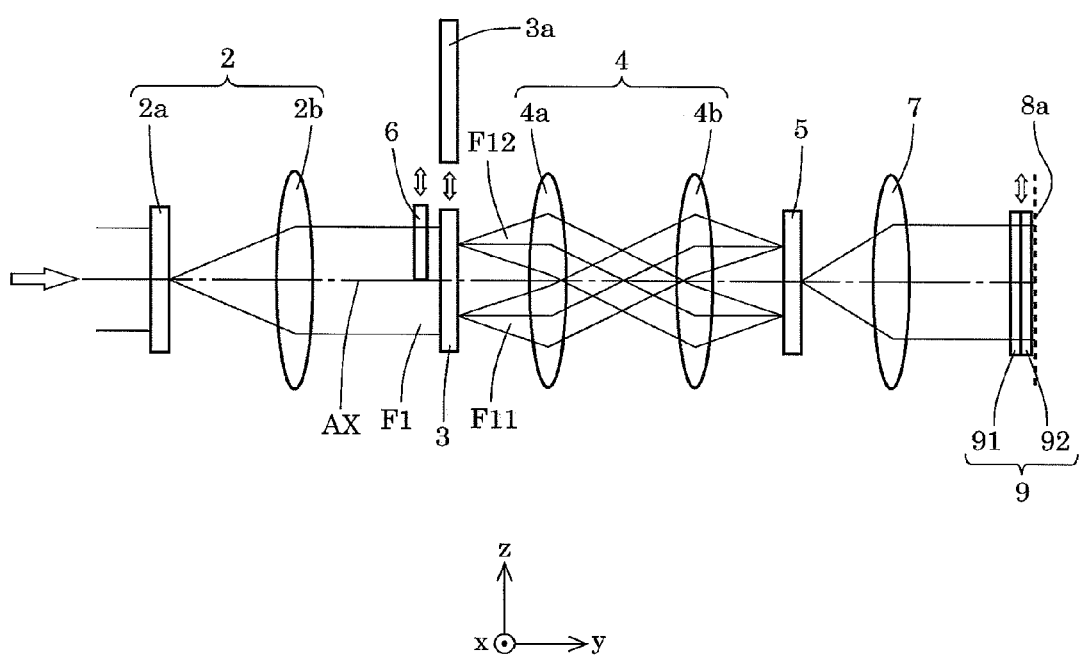
FIG. 4 is a drawing showing linear development of an optical path from a lens array to an entrance plane of a micro fly's eye lens.

FIG. 4 is a drawing showing linear development of the optical path from the lens array 2a to the entrance plane 8a of the micro fly's eye lens 8A. FIG. 4 shows the spatial light modulator 5 as a transmission type spatial light modulator and x-axis, y-axis, and z-axis are set in a direction perpendicular to the plane of the drawing, in a direction of the optical axis AX extending horizontally on the plane of the drawing, and in a vertical direction on the plane of the drawing, respectively. In FIG. 4, the half wave plate 6 is arranged at the position immediately in front of the diffractive optical element 3, i.e., at the position approximately optically conjugate with the array surface of the spatial light modulator 5, so as to act on a beam propagating in the optical path in the +z-direction from the xy plane including the optical axis AX. The half wave plane 6 is arranged so that its entrance plane and exit plane are perpendicular to the optical axis AX.

It is assumed below, for easier understanding of the description, that a parallel beam having a rectangular cross section with light intensity homogenized by action of the light intensity homogenizing member 2 is incident to the diffractive optical element 3 and that the light having traveled via the light intensity homogenizing member 2 is linearly polarized light polarized in the z-direction (which will be referred to hereinafter as "z-directionally linearly polarized light"). The half wave plate 6 is arranged so that the orientation of its optic axis is set in a direction at 45° to the x-direction and the z-direction in the xz plane, so as to, with incidence of z-directionally linearly polarized light thereto, emit x-directionally linearly polarized light with the polarization direction along the x-direction resulting from +90° rotation (90° clockwise rotation on the plane of FIG. 5) of the z-direction.

Figure 5:
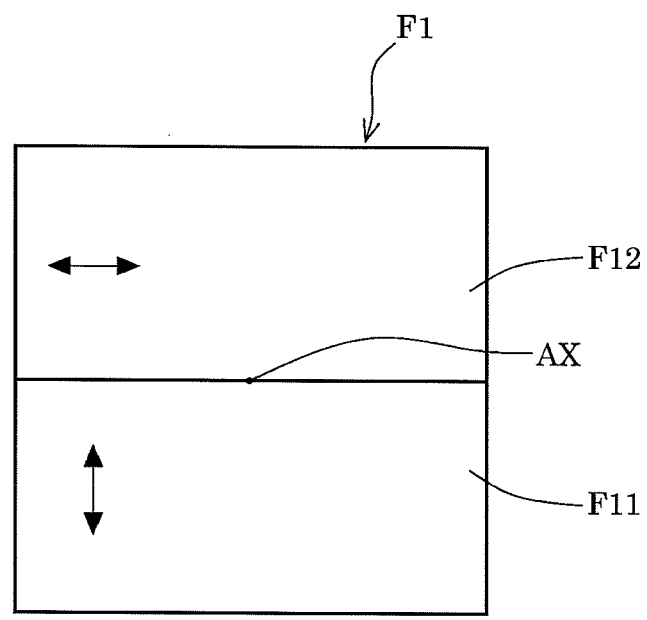
FIG. 5 is a drawing showing regions and polarization states of respective beams incident to a diffractive optical element.

Therefore, as shown in FIG. 5, a first beam F11 incident to the region in the −z-direction from the xy plane including the optical axis AX, of the beam F1 incident to the diffractive optical element 3 (parallel beam F1 of z-directionally linearly polarized light having the rectangular cross section centered on the optical axis AX) is not subject to the action of the half wave plate 6 and thus is emergent as z-directionally linearly polarized light. On the other hand, a second beam F12 incident to the region in the +z-direction from the xy plane including the optical axis AX is subject to the action of the half wave plate 6, thereby to turn into x-directionally linearly polarized light.

The diffractive optical element 3 has such a characteristic that when a parallel beam is incident thereto, it converts the parallel beam into a divergent beam with a predetermined divergence angle and emits the divergent beam. If the parallel beam is not incident to the diffractive optical element 3 in the embodiment, the incident beam with an angle distribution is further provided with a divergence angle. Namely, the diffractive optical element 3 provides a required divergence angle to the incident beams F11 and F12 and emits them. Specifically, the diffractive optical element 3 provides the same divergence angle across all azimuth directions to the incident beams F11 and F12.

Figure 6:
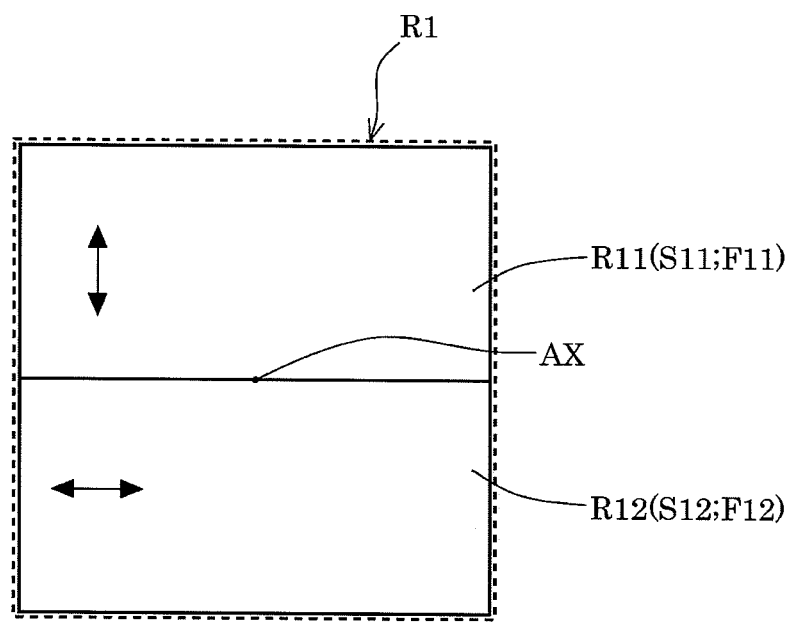
FIG. 6 is a drawing showing regions and polarization states of respective beams incident to the spatial light modulator.
Figure 6:
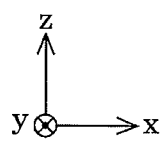

The first beam F11 and the second beam F12 provided with the divergence angle travel through the reimaging optical system 4 to impinge on the spatial light modulator 5. Namely, as shown in FIG. 6, the first beam F11 impinges on a first region R11 in the +z-direction from the xy plane including the optical axis AX, of an effective reflective region R1 in the array surface of the spatial light modulator 5. The second beam F12 impinges on a second region R12 in the −z-direction from the xy plane including the optical axis AX, of the effective reflective region R1.

Figure 7:
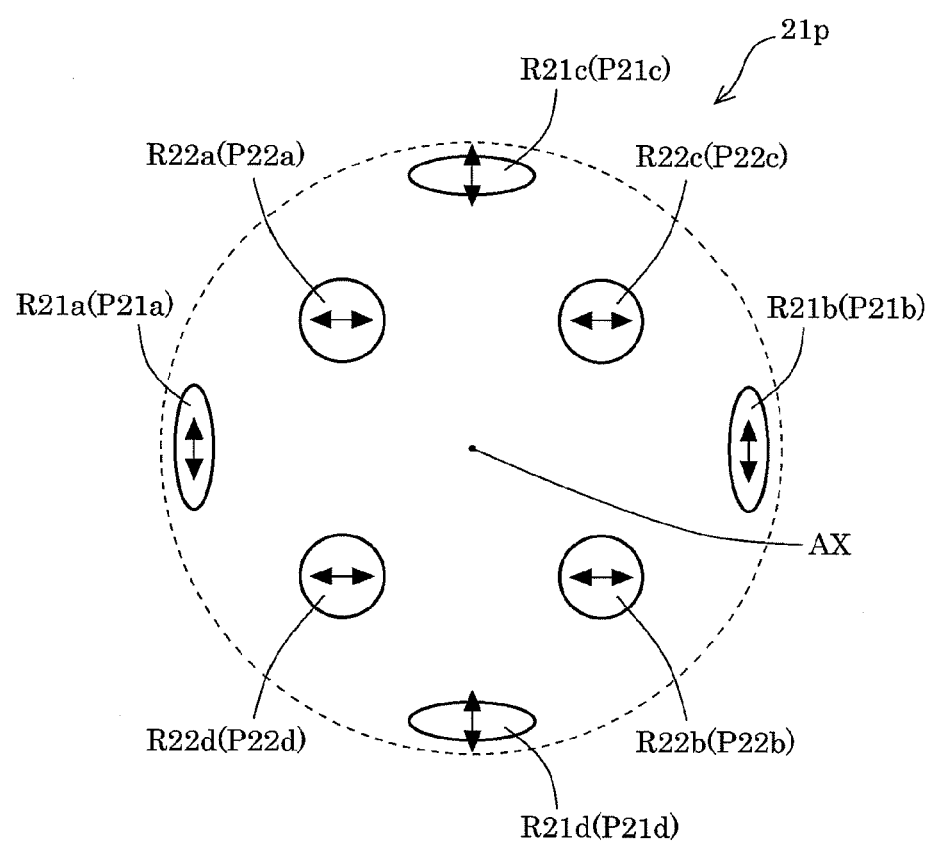
FIG. 7 is a drawing showing an octupolar pupil intensity distribution obtained in a case where the diffractive optical element and a polarization conversion unit are retracted from the optical path.

Now, Let us consider a case where the diffractive optical element 3 and the polarization conversion unit 9 are retracted from the optical path; as shown in FIG. 7, the drive unit 5c of the spatial light modulator 5 controls each of the postures of the mirror elements 5a belonging to a first mirror element group S11 so that light having traveled via the first mirror element group S11 located in the first region R11 is guided to four outside pupil regions R21a, R21b, R21c, and R21d on the entrance plane 8a of the micro fly's eye lens 8A.

A pair of pupil regions R21a, R21b are, for example, regions arranged with a space in the x-direction on both sides of the optical axis AX. A pair of pupil regions R21c, R21d are, for example, regions arranged with a space in the z-direction on both sides of the optical axis AX.

The drive unit 5c controls each of the postures of the mirror elements 5a belonging to a second mirror element group S12 so that light having traveled via the second mirror element group S12 located in the second region R12 is guided to four inside pupil regions R22a, R22b, R22c, and R22d on the entrance plane 8a. A pair of pupil regions R22a, R22b are, for example, regions arranged with a space in a direction at 45° to the +x-direction and the −z-direction on both sides of the optical axis AX. A pair of pupil regions R22c, R22d are, for example, regions arranged with a space in a direction at 45° to the +x-direction and the +z-direction on both sides of the optical axis AX.

In this manner, when the diffractive optical element 3 and the polarization conversion unit 9 are retracted from the optical path, the spatial light modulator 5 forms an octupolar light intensity distribution 21p consisting of eight substantial surface illuminants P21a, P21b; P21c, P21d; P22a, P22b; P22c, P22d, on the illumination pupil of the entrance plane 8a of the micro fly's eye lens 8A. Namely, the first beam F11 travels via the first mirror element group S11 of the spatial light modulator 5 to form the surface illuminants P21a-P21d covering the pupil regions R21a-R21d. The light forming the surface illuminants P21a-P21d is z-directionally linearly polarized light because it does not pass through the half wave plate 6.

The second beam F12 travels via the second mirror element group S12 of the spatial light modulator 5 to form the surface illuminants P22a-P22d covering the pupil regions R22a-R22d. The light forming the surface illuminants P22a-P22d is x-directionally linearly polarized light because it passes through the half wave plate 6. Furthermore, an octupolar pupil intensity distribution corresponding to the light intensity distribution 21p is also formed at the position of the illumination pupil immediately behind the micro fly's eye lens 8A, at the pupil position of the imaging optical system 12A, and at the pupil position of the projection optical system PL.

The control system CR can be constructed, for example, of a so-called workstation (or a microcomputer) or the like composed of a CPU (central processing unit), a ROM (read only memory), a RAM (random access memory), and so on and can totally control the entire apparatus. Furthermore, the control system CR may have external equipment, for example, including a storage unit consisting of a hard disc, input devices including a keyboard and a pointing device such as a mouse, a display device such as a CRT display (or a liquid crystal display), and a drive unit for an information storage medium such as CD (compact disc), DVD (digital versatile disc), MO (magneto-optical disc), or FD (flexible disc).

The storage unit may store information about pupil intensity distributions (illumination light source shapes) with an imaged state of a projection image projected on the wafer W by the projection optical system PL being optimal (e.g., with aberration or the line width falling within a tolerable range), control information on the illumination optical system corresponding thereto and, particularly, on the mirror elements of the spatial light modulator 5, and so on. An information storage medium storing programs for executing below-described setting of pupil intensity distribution (CD-ROM in the below description for convenience) and the like may be set in the drive unit. These programs may be installed in the storage unit. The control system CR reads these programs onto the memory as occasion demands.

The control system CR can control the spatial light modulator 5, for example, by the following procedure. The pupil intensity distribution can be expressed, for example, in a format in which the pupil plane is divided into a plurality of grid-like sections and the distribution is expressed as numerical values using light intensities and polarization states of the respective sections (bitmap format in a broad sense). When it is assumed herein that the number of mirror elements of the spatial light modulator 5 is N and the number of sections resulting from the division of the pupil intensity distribution is M, the pupil intensity distribution (secondary light source) is foamed (or set) by guiding N rays reflected by the individual mirror elements, in appropriate combinations to the M sections, or, by appropriately superimposing the N rays on M bright spots composed of the M sections.

First, the control unit CR reads information about the pupil intensity distribution 21p as a target from the storage unit. Next, it calculates how many rays are needed for forming an intensity distribution in each of polarization states, from the information about the pupil intensity distribution 21p thus read out. Then the control unit CR virtually divides the plurality of mirror elements 5a of the spatial light modulator 5 into two mirror element groups S11 and S12 each consisting of a necessary number of mirror elements, and sets the partial regions R11 and R12 where the respective mirror element groups S11 and S12 are located.

The control unit CR drives the mirror elements 5a in the first mirror element group S11 located in the partial region R11 of the spatial light modulator 5 to implement such a setting that light from the first mirror element group S11 travels toward the pupil regions R21a-R21d covered by the surface illuminants P21a-P21d. Similarly, the control unit CR drives the mirror elements 5a in the second mirror element group S12 located in the partial region R12 of the spatial light modulator 5 to implement such a setting that light from the second mirror element group S12 travels toward the pupil regions R22a-R22d covered by the surface illuminants P22a-P22d. Furthermore, the control unit CR controls the position in the Y-direction of the half wave plate 6 so that the beam traveling toward the partial region R12 of the spatial light modulator 5 passes through the half wave plate 6 as polarizing member (or so that the edge in the X-direction of the half wave plate 6 is located at a boundary between the partial regions R11 and R12).

Figure 8:
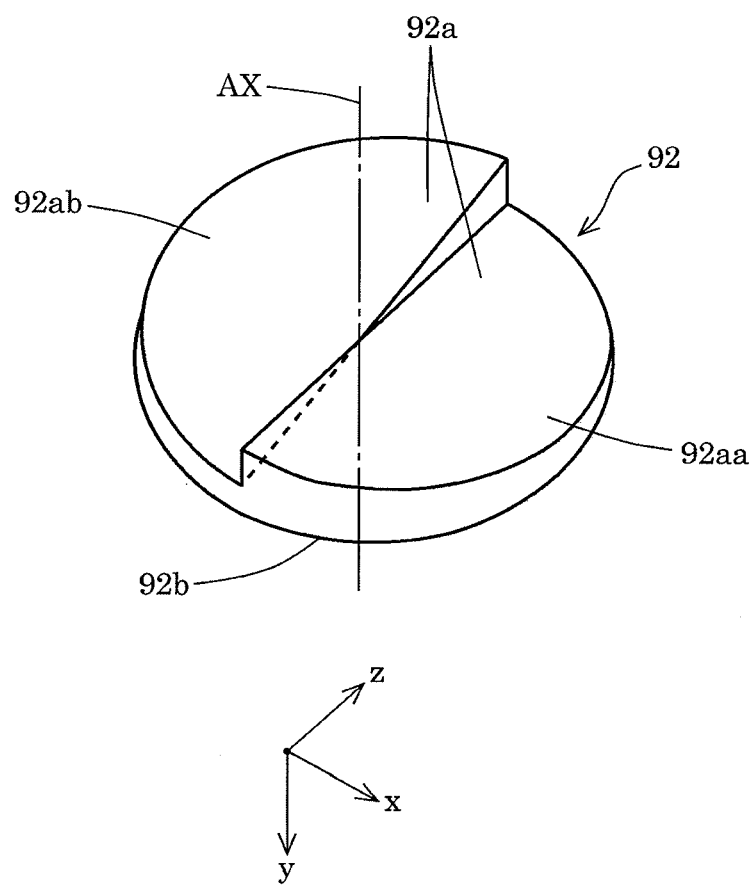
FIG. 8 is a perspective view schematically showing a characteristic surface shape of a polarization conversion member in the polarization conversion unit.

FIG. 8 is a perspective view schematically showing a characteristic surface shape of a polarization conversion member in the polarization conversion unit. The polarization conversion unit 9, as shown in FIG. 4, has a correction member 91 and a polarization conversion member 92 in order from the light entrance side (light source side). The polarization conversion member 92 is made of a crystal material being an optical material with optical rotatory power, e.g., rock crystal and has a form in which the thickness continuously varies along the circumferential direction of a circle centered on the optical axis AX. As an example, an entrance-side surface 92a of the polarization conversion member 92 is formed in a surface shape with a linear level difference as shown in FIG. 8 and an exit-side (mask-side) surface 92b is formed in a planar shape.

Specifically, the entrance-side surface 92a of the polarization conversion member 92 has the linear level difference extending across the entire surface 92a along the z-direction while passing the optical axis AX. A semicircular face 92aa on the +x-directional side with respect to this level difference is formed so that the thickness linearly increases from the +z-directional side to the −z-directional side along the circumferential direction of a semicircle centered on the optical axis AX. On the other hand, a semicircular face 92ab on the −x-directional side with respect to the level difference is formed so that the thickness linearly increases from the −z-directional side to the +z-directional side along the circumferential direction of a semicircle centered on the optical axis AX.

When we now consider a circular column (cylindrical) coordinate system wherein the xz plane perpendicular to the optical axis AX is set as a reference plane and the origin is set at the position of the optical axis AX on the reference plane, the semicircular face 92aa on the +x-directional side with respect to the level difference and the semicircular face 92ab on the −x-directional side with respect to the level difference have the curved shape in which the thickness in the optical-axis direction (y-direction) varies depending only on deviations being azimuth angles about the optical axis AX. The correction member 91 is arranged next on the entrance side to the polarization conversion member 92 and is made of an optical material having the same refractive index as the polarization conversion member 92, i.e., rock crystal.

The correction member 91 has a required surface shape for functioning as a compensator to compensate for light deflection action (change in traveling direction of light) by the polarization conversion member 92. Specifically, an entrance-side face of the correction member 91 is formed in a planar shape and an exit-side face has a surface shape complementary to the surface shape of the entrance-side surface 92a of the polarization conversion member 92. The correction member 91 is arranged so that its crystallographic optic axis becomes parallel or perpendicular to the polarization direction of incident light, so as not to change the polarization state of passing light. The polarization conversion member 92 is set so that its crystallographic optic axis becomes approximately coincident with the optical axis AX (i.e., approximately coincident with the y-direction being the traveling direction of incident light), in order to change the polarization state of incident light.

In the polarization conversion unit 9, the thickness distribution of the polarization conversion member 92 is set so that, for example, when a beam of z-directionally linearly polarized light with an annular cross section is incident thereto, an annular beam is formed in a continuous circumferential polarization state immediately behind the polarization conversion member 92. Namely, the polarization conversion member 92 is formed so as to convert the z-directionally linearly polarized light impinging on an arbitrary point on its entrance surface 92a, into linearly polarized light with the polarization direction along a tangent direction to a circle centered on the optical axis AX and passing the point of incidence.

As a result, for example, when a beam of x-directionally linearly polarized light with an annular cross section is incident to the polarization conversion unit 9, an annular beam is formed in a continuous radial polarization state immediately behind the polarization conversion member 92. Namely, the polarization conversion member 92 is formed so as to convert x-directionally linearly polarized light impinging on an arbitrary point on its entrance surface 92a, into linearly polarized light with the polarization direction along a radial direction of a circle centered on the optical axis AX and passing the point of incidence. It is noted that the polarization conversion member 92 may have a form in which the thickness intermittently (stepwise) varies along the circumferential direction of the circle entered on the optical axis AX. The polarization conversion member 92 of this kind to be used can be, for example, the polarization conversion member disclosed in U.S. Pat. Published Application No. 2009/0316132.

Figure 9:
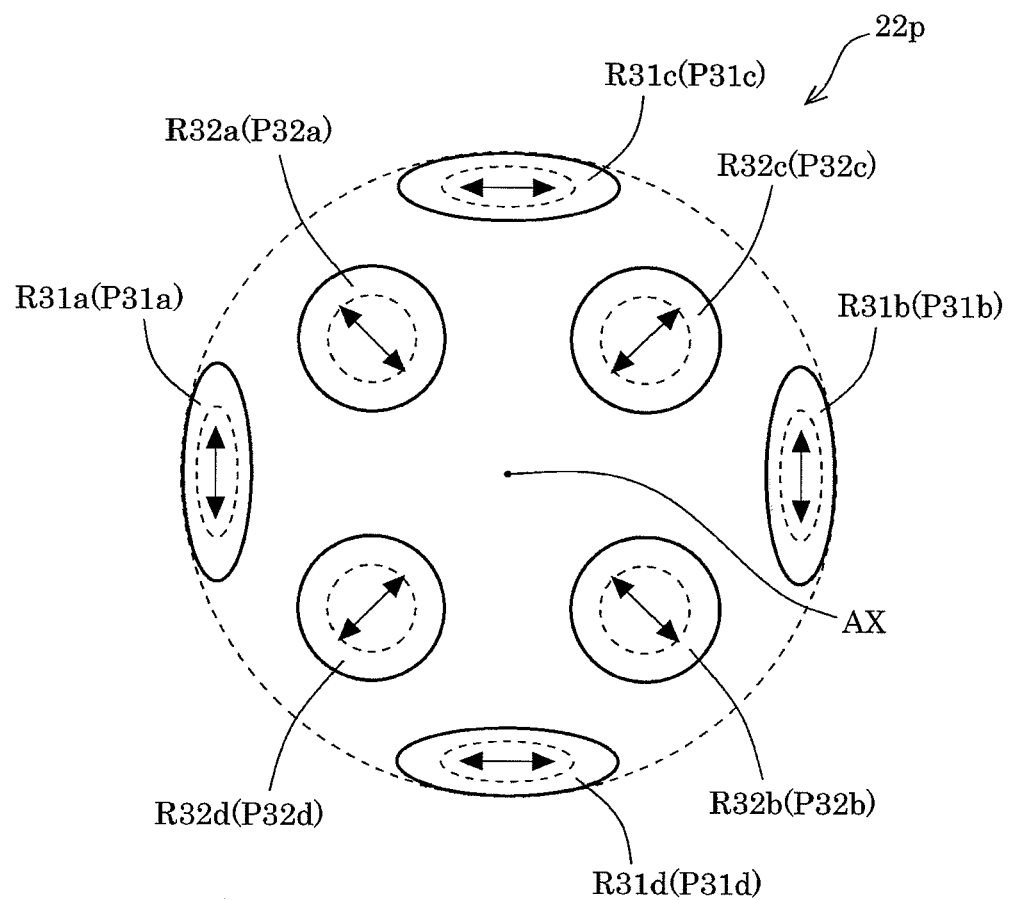
FIG. 9 is a drawing showing an octupolar pupil intensity distribution obtained in a case where the diffractive optical element and the polarization conversion unit are placed in the optical path.

Therefore, when the diffractive optical element 3 and the polarization conversion unit 9 are placed in the optical path, an octupolar light intensity distribution 22p consisting of light intensity distributions P31a, P31b, P31c, and P31d in a quadrupolar pattern and in a circumferential polarization state and light intensity distributions P32a, P32b, P32c, and P32d in a quadrupolar pattern and in a radial polarization state is formed, as shown in FIG. 9, on the illumination pupil of the entrance plane 8a of the micro fly's eye lens 8A. Furthermore, an octupolar pupil intensity distribution corresponding to the light intensity distribution 22p is also formed at the position of the illumination pupil immediately behind the micro fly's eye lens 8A, at the pupil position of the imaging optical system 12A, and at the pupil position of the projection optical system PL.

Regions R31a, R31b, R31c, and R31d covered by the surface illuminants P31a-P31d are located at positions corresponding to the regions R21a-R21d in FIG. 7 (which are indicated by dashed lines in FIG. 9) and have shapes obtained by similarly enlarging the regions R21a-R21d depending on the magnitude of the divergence angle provided by the diffractive optical element 3. Similarly, regions R32a, R32b, R32c, and R32d covered by the surface illuminants P32a-P32d are located at positions corresponding to the regions R22a-R22d in FIG. 7 (which are indicated by dashed lines in FIG. 9) and have shapes obtained by similarly enlarging the regions R22a-R22d depending on the magnitude of the divergence angle provided by the diffractive optical element 3.

In general, in the case of circumferential polarization illumination based on an annular or multi-polar (dipolar, quadrupolar, octupolar, etc.) pupil intensity distribution in a circumferential polarization state, light impinging on the wafer W as a final illumination target surface is in a polarization state with the principal component of s-polarized light. Here, the s-polarized light refers to linearly polarized light with the polarization direction along a direction normal to the plane of incidence (which is polarized light with the electric vector oscillating in the direction normal to the plane of incidence). The plane of incidence is defined as a plane including, with light arriving at a boundary surface of a medium (illumination target surface: surface of wafer W), a normal to the boundary surface at the arrival point and a direction of incidence of the light. As a result, the circumferential polarization illumination improves optical performance of the projection optical system (depth of focus and others) and allows acquisition of a mask pattern image with high contrast on the wafer (photosensitive substrate).

On the other hand, in the case of radial polarization illumination based on an annular or multi-polar pupil intensity distribution in a radial polarization state, light impinging on the wafer W as a final illumination target surface is in a polarization state with the principal component of p-polarized light. Here, the p-polarized light is linearly polarized light with the polarization direction along a direction parallel to the plane of incidence defined as described above (which is polarized light with the electric vector oscillating in the direction parallel to the plane of incidence). As a result, the radial polarization illumination keeps low the reflectance of light on a resist applied to the wafer W and allows acquisition of a good mask pattern image on the wafer (photosensitive substrate).

Figure 10:
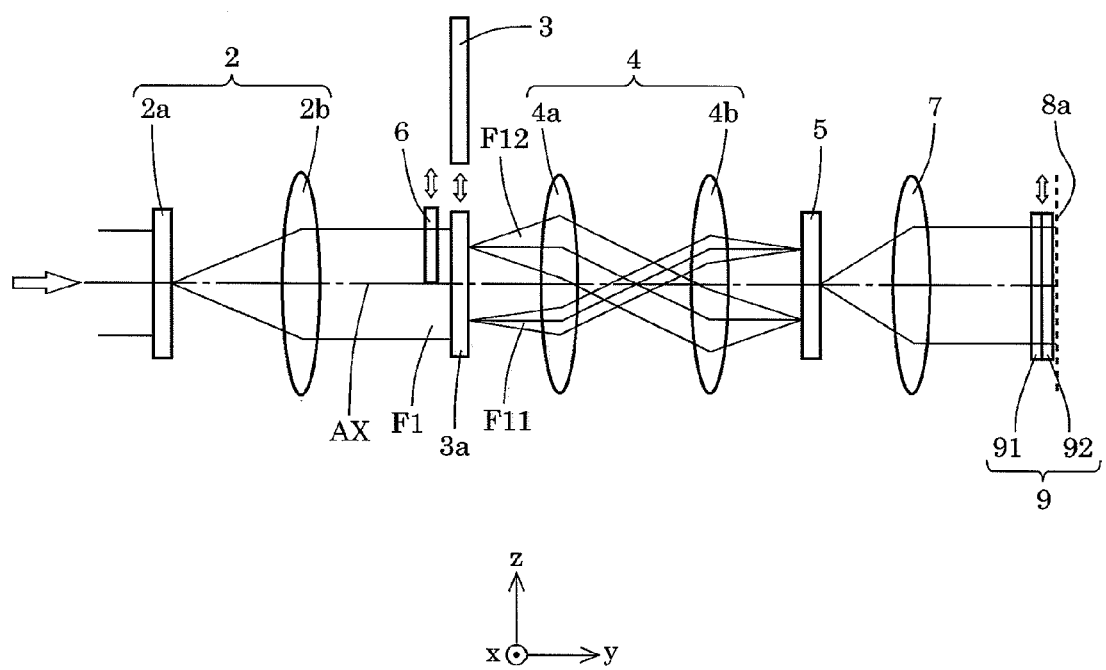
FIG. 10 is a drawing showing a state in which another diffractive optical element is placed in the optical path.

In the present embodiment, the diffractive optical element 3 is configured so as to be interchangeable with another diffractive optical element 3a having a different characteristic. Examples of a method for switching the diffractive optical elements include the well-known turret method, slide method, and so forth. The diffractive optical element 3a, as shown in FIG. 10, provides mutually different divergence angles to the incident beams F11 and F12 and emits them. Specifically, the diffractive optical element 3a provides a smaller divergence angle across all the azimuth directions to the incident beam F11 than the diffractive optical element 3 does, and the same divergence angle across all the azimuth directions to the incident beam F12 as the diffractive optical element 3 does.

In other words, the diffractive optical element 3a has a first region (region of incidence of the beam F11) with a characteristic to convert a parallel beam incident thereto, into a first divergent beam with a first divergence angle, and a second region (region of incidence of the beam F12) with a characteristic to convert a parallel beam incident thereto, into a second divergent beam with a second divergence angle larger than the first divergence angle. In still another expression, the diffractive optical element 3a provides the divergence angles to the propagating beam propagating in the optical path, to generate the beams F11, F12 with the different divergence angles and these beams are emitted from the diffractive optical element 3a so as to pass at mutually different positions on the surface where the diffractive optical element 3a is placed. In yet another expression, the diffractive optical element 3a makes a distribution on the exit plane of divergence angles from the exit plane with incidence of a parallel beam to the diffractive optical element 3a, different from a distribution on the exit plane of divergence angles from the exit plane with incidence of a parallel beam to the diffractive optical element 3.

Figure 11:
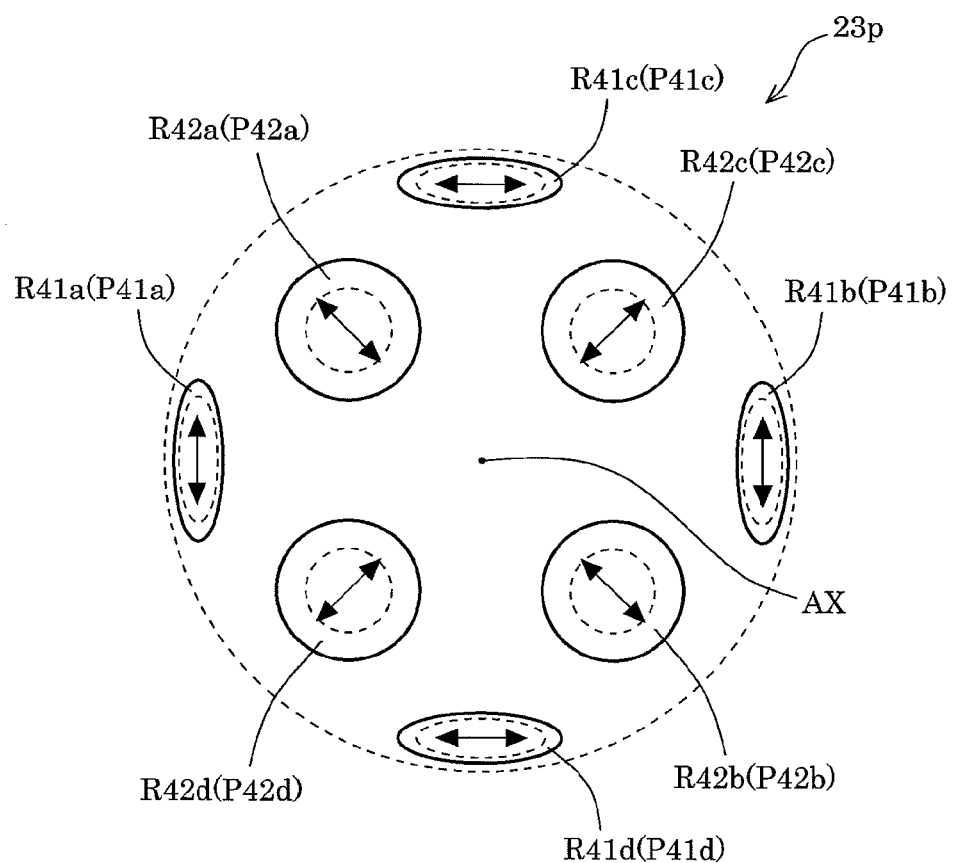
FIG. 11 is a drawing showing an octupolar pupil intensity distribution obtained in the state of FIG. 10.

Therefore, when the diffractive optical element 3a is arranged in the optical path instead of the diffractive optical element 3, an octupolar light intensity distribution 23p consisting of light intensity distributions P41a, P41b, P41c, and P41d in a quadrupolar pattern and in a circumferential polarization state and light intensity distributions P42a, P42b, P42c, and P42d in a quadrupolar pattern and in a radial polarization state is formed, as shown in FIG. 11, on the illumination pupil of the entrance plane 8a of the micro fly's eye lens 8A.

Regions R41a, R41b, R41c, and R41d covered by the surface illuminants P41a-P41d are located at positions corresponding to the regions R21a-R21d in FIG. 7 (which are indicated by dashed lines in FIG. 11) and have shapes obtained by similarly enlarging the regions R21a-R21d at a relatively small magnification depending on the relatively small divergence angle provided by the diffractive optical element 3a. Similarly, regions R42a, R42b, R42c, and R42d covered by the surface illuminants P42a-P42d are located at positions corresponding to the regions R22a-R22d in FIG. 7 (which are indicated by dashed lines in FIG. 11) and have shapes obtained by similarly enlarging the regions R22a-R22d at a relatively large magnification depending on the relatively large divergence angle provided by the diffractive optical element 3a. In the example of FIG. 10, the direction of the change in degree of provision of the divergence angles in the diffractive optical element 3a (the z-direction in the drawing) was the same direction as the moving direction of the half wave plane 6 as polarizing member, but the direction of the change in degree of provision of the divergence angles in the diffractive optical element 3a may be a direction perpendicular to the moving direction of the half wave plate 6.

Figure 12:
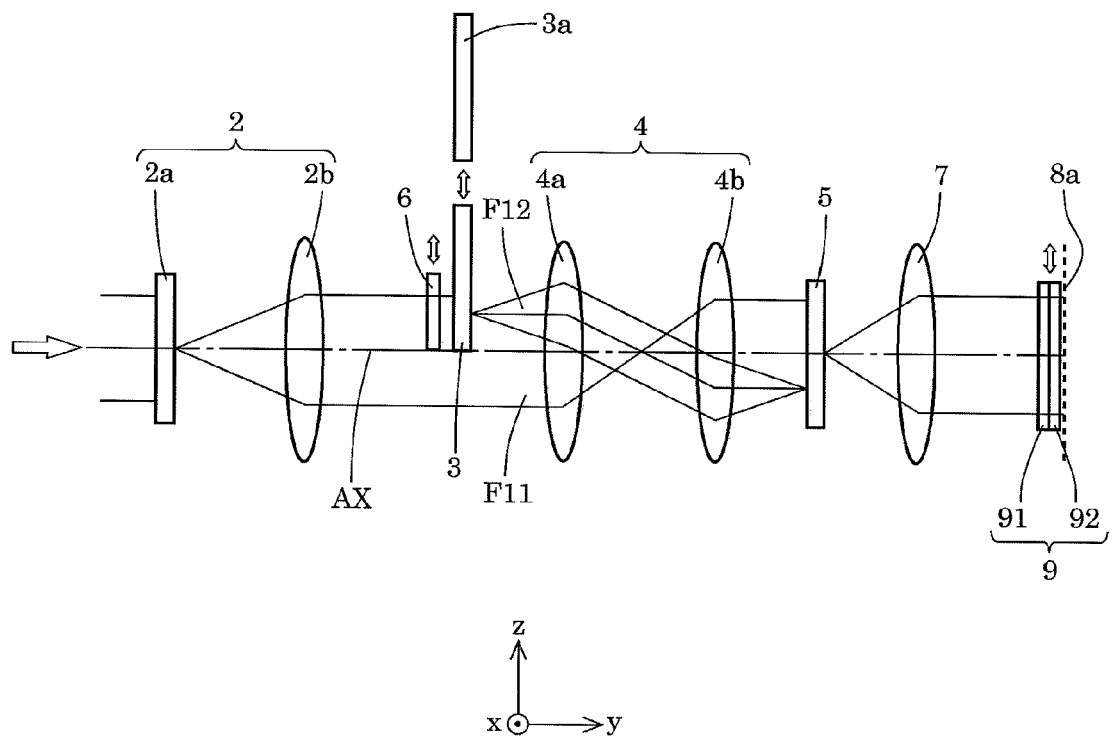
FIG. 12 is a drawing showing a state in which the diffractive optical element is placed so as to act only on a part of a propagating beam.

FIG. 12 is a drawing showing a state in which the diffractive optical element 3 is arranged so as to act only on a part of the propagating beam. In this case, the diffractive optical element 3 provides the required divergence angle across all the azimuth directions only to the incident beam F12. In other words, the diffractive optical element 3 provides the divergence angle to the partial beam F12 of the propagating beam propagating in the optical path, to generate the beams F11, F12 with the different divergence angles.

Figure 13:
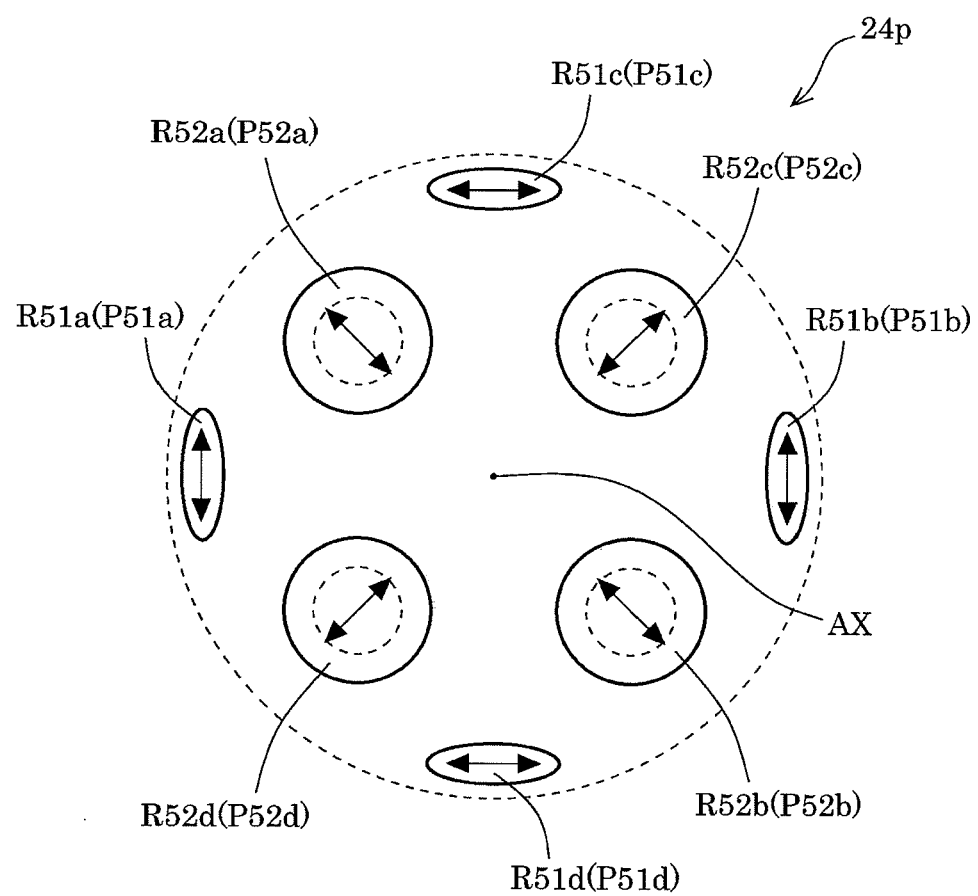
FIG. 13 is a drawing showing an octupolar pupil intensity distribution obtained in the state of FIG. 12.

Therefore, when the diffractive optical element 3 is arranged so as to act only on the beam F12, an octupolar light intensity distribution 24p consisting of light intensity distributions P51a, P51b, P51c, and P51d in a quadrupolar pattern and in a circumferential polarization state and light intensity distributions P52a, P52b, P52c, and P52d in a quadrupolar pattern and in a radial polarization state is formed, as shown in FIG. 13, on the illumination pupil of the entrance plane 8a of the micro fly's eye lens 8A.

Regions R51a, R51b, R51c, and R51d covered by the surface illuminants P51a-P51d are coincident with the regions R21a-R21d in FIG. 7. On the other hand, regions R52a, R52b, R52c, and R52d covered by the surface illuminants P52a-P52d are located at positions corresponding to the regions R22a-R22d in FIG. 7 (which are indicated by dashed lines in FIG. 13) and have shapes obtained by similarly enlarging the regions R22a-R22d depending on the divergence angle provided by the diffractive optical element 3.

Figure 14:
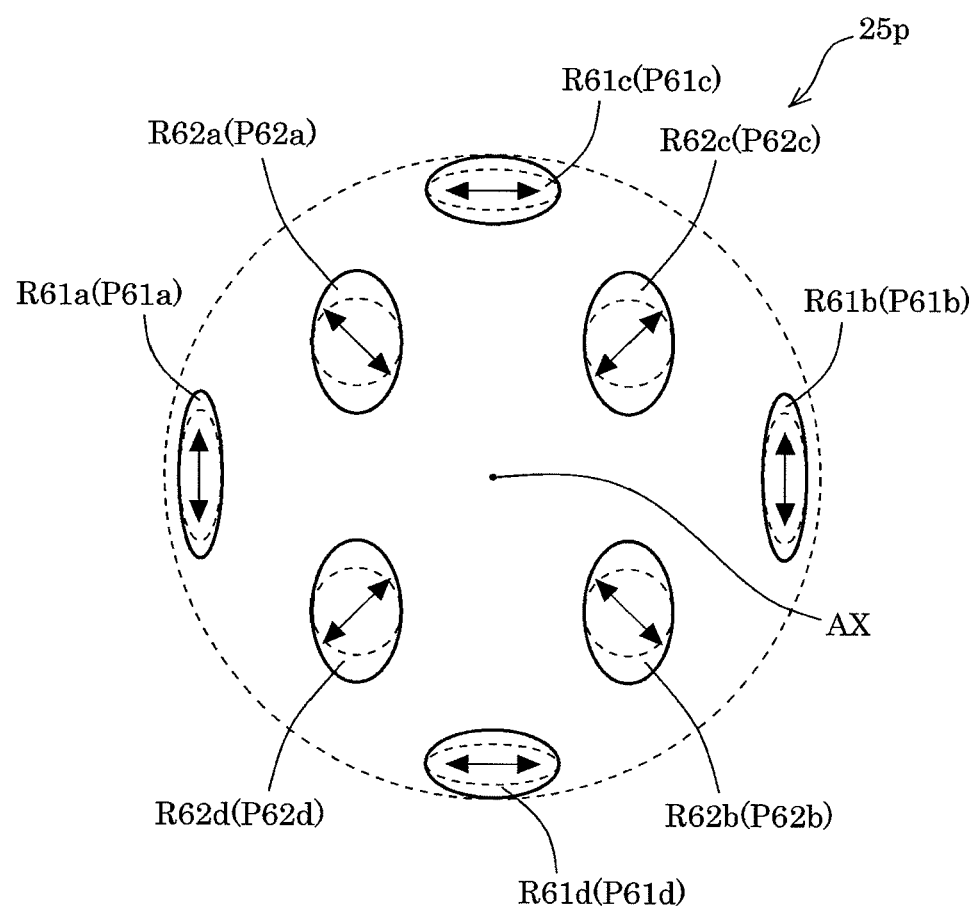
FIG. 14 is a drawing showing an octupolar pupil intensity distribution obtained in a case where in the configuration of FIG. 4 the diffractive optical element provides a divergence angle along one plane.

In the above description, the diffractive optical element 3, 3a provides the required divergence angle(s) across all the azimuth directions to the incident beam, but it is also possible to adopt a configuration wherein the diffractive optical element 3, 3a provides the divergence angle(s), for example, along the yz plane but does not provide the divergence angle(s) along the xy plane. Specifically, when in the configuration of FIG. 4 the diffractive optical element 3 provides the divergence angle along the yz plane but does not provide the divergence angle along the xy plane, an octupolar light intensity distribution 25p consisting of light intensity distributions P61a, P61b, P61c, and P61d in a quadrupolar pattern and in a circumferential polarization state and light intensity distributions P62a, P62b, P62c, and P62d in a quadrupolar pattern and in a radial polarization state is formed, as shown in FIG. 14, on the illumination pupil of the entrance plane 8a of the micro fly's eye lens 8A.

Regions R61a, R61b, R61c, and R61d covered by the surface illuminants P61a-P61d are located at positions corresponding to the regions R21a-R21d in FIG. 7 (which are indicated by dashed lines in FIG. 14) and have shapes obtained by enlarging the regions R21a-R21d only in the z-direction depending on the magnitude of the divergence angle provided by the diffractive optical element 3. Similarly, regions R62a, R62b, R62c, and R62d covered by the surface illuminants P62a-P62d are located at positions corresponding to the regions R22a-R22d in FIG. 7 (which are indicated by dashed lines in FIG. 14) and have shapes obtained by enlarging the regions R22a-R22d only in the z-direction depending on the magnitude of the divergence angle provided by the diffractive optical element 3.

Figure 15:
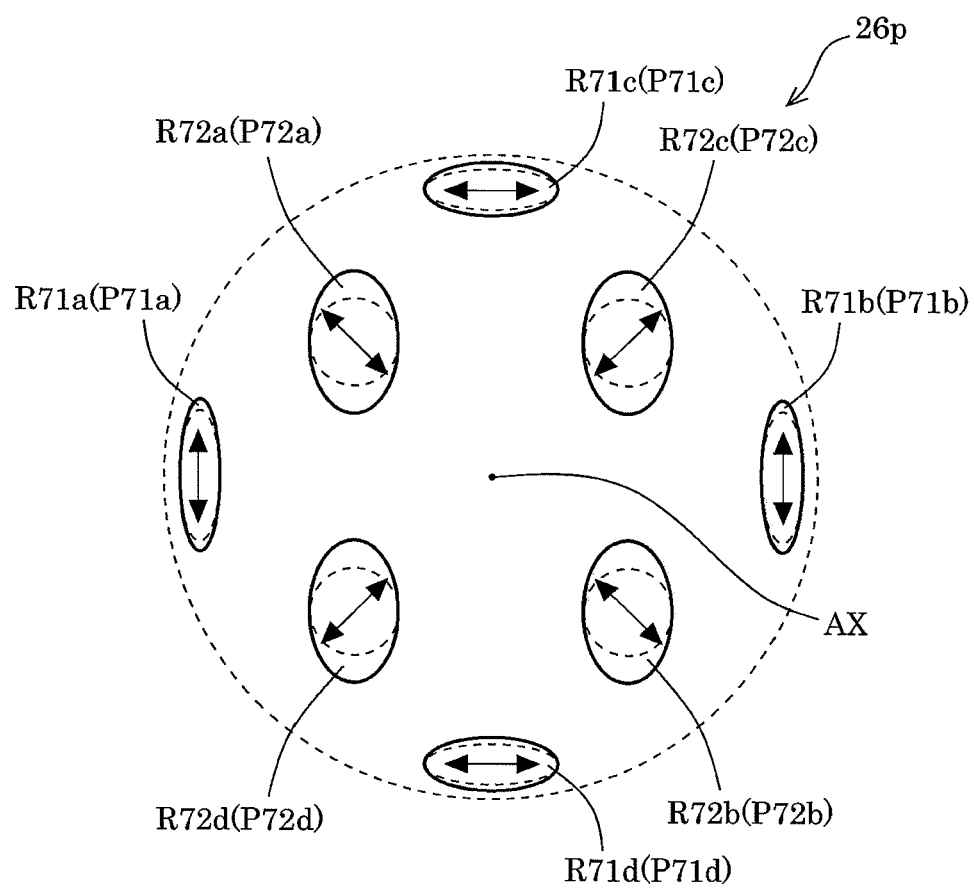
FIG. 15 is a drawing showing an octupolar pupil intensity distribution obtained in a case where in the configuration of FIG. 10 the diffractive optical element provides divergence angles along one plane.

When in the configuration of FIG. 10 the diffractive optical element 3a provides the divergence angles along the yz plane but does not provide the divergence angles along the xy plane, an octupolar light intensity distribution 26p consisting of light intensity distributions P71a, P71b, P71c, and P71d in a quadrupolar pattern and in a circumferential polarization state and light intensity distributions P72a, P72b, P72c, and P72d in a quadrupolar pattern and in a radial polarization state is formed, as shown in FIG. 15, on the illumination pupil of the entrance plane 8a of the micro fly's eye lens 8A.

Regions R71a, R71b, R71c, and R71d covered by the surface illuminants P71a-P71d are located at positions corresponding to the regions R21a-R21d in FIG. 7 (which are indicated by dashed lines in FIG. 15) and have shapes obtained by enlarging the regions R21a-R21d at the relatively small magnification only in the z-direction depending on the relatively small divergence angle provided by the diffractive optical element 3a. Similarly, regions R72a, R72b, R72c, and R72d covered by the surface illuminants P72a-P72d are located at positions corresponding to the regions R22a-R22d in FIG. 7 (which are indicated by dashed lines in FIG. 15) and have shapes obtained by enlarging the regions R22a-R22d at the relatively large magnification only in the z-direction depending on the relatively large divergence angle provided by the diffractive optical element 3a.

Figure 16:
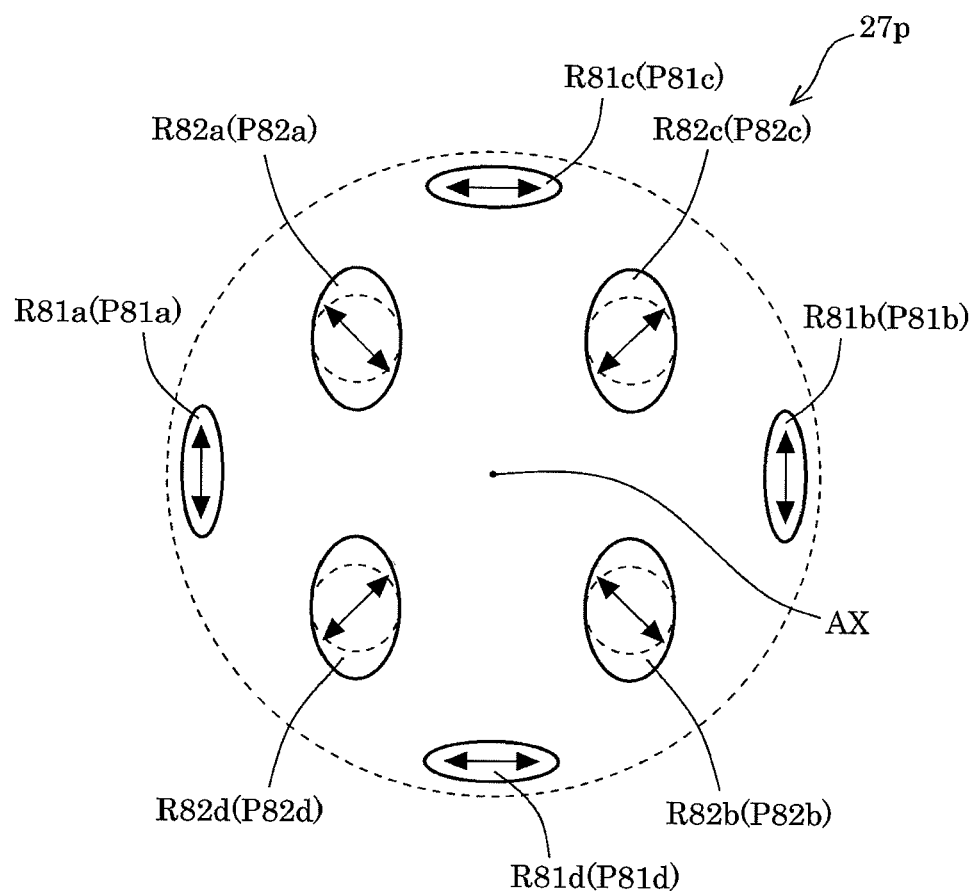
FIG. 16 is a drawing showing an octupolar pupil intensity distribution obtained in a case where in the configuration of FIG. 12 the diffractive optical element provides a divergence angle along one plane.

When in the configuration of FIG. 12 the diffractive optical element 3 provides the divergence angle along the yz plane but does not provide the divergence angle along the xy plane, an octupolar light intensity distribution 27p consisting of light intensity distributions P81a, P81b, P81c, and P81d in a quadrupolar pattern and in a circumferential polarization state and light intensity distributions P82a, P82b, P82c, and P82d in a quadrupolar pattern and in a radial polarization state is formed, as shown in FIG. 16, on the illumination pupil of the entrance plane 8a of the micro fly's eye lens 8A.

Regions R81a, R81b, R81c, and R81d covered by the surface illuminants P81a-P81d are coincident with the region R21a-R21d in FIG. 7. On the other hand, regions R82a, R82b, R82c, and R82d covered by the surface illuminants P82a-P82d are located at positions corresponding to the regions R22a-R22d in FIG. 7 (which are indicated by dashed lines in FIG. 16) and have shapes obtained by enlarging the regions R22a-R22d only in the z-direction depending on the divergence angle provided by the diffractive optical element 3.

Figure 17:
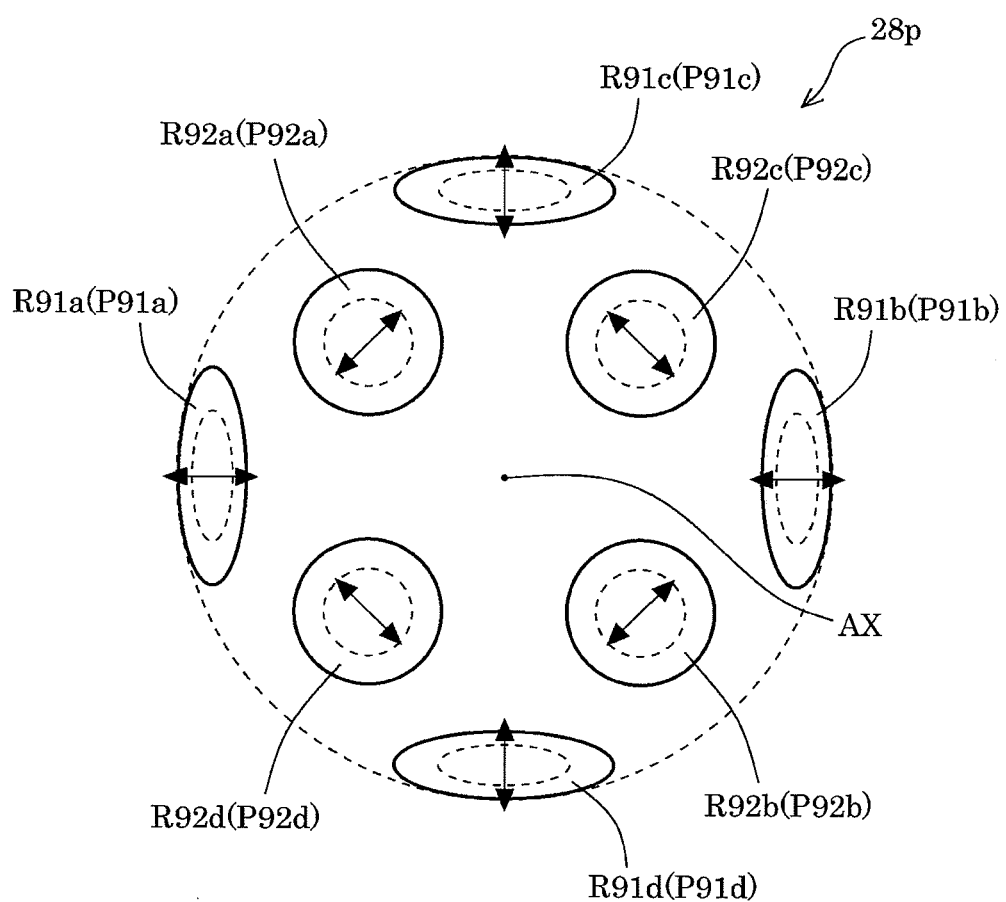
FIG. 17 is a drawing showing an octupolar pupil intensity distribution consisting of outside surface illuminants in a quadrupolar pattern and in a radial polarization state and inside surface illuminants in a quadrupolar pattern and in a circumferential polarization state.

In the above description, the light intensity distributions 22p-27p are formed with the outside quadrupolar surface illuminants in the circumferential polarization state and with the inside quadrupolar surface illuminates in the radial polarization state. However, for example, when the configuration of FIG. 4 is modified so that the light through the light intensity homogenizing member 2 is set to be the x-directionally linearly polarized light or so that the half wave plate 6 is arranged so as to act on the beam F11 propagating in the optical path in the −z-direction from the xy plane including the optical axis AX, it is feasible to form an octupolar light intensity distribution 28p consisting of light intensity distributions P91a, P91b, P91c, and P91d in a quadrupolar pattern and in a radial polarization state and light intensity distributions P92a, P92b, P92c, and P92d in a quadrupolar pattern and in a circumferential polarization state, as shown in FIG. 17.

Furthermore, although illustration is omitted, for example, the configuration of FIG. 10 and the configuration of FIG. 12 can be modified so that the light through the light intensity homogenizing member 2 is set to be the x-directionally linearly polarized light or so that the half wave plate 6 is arranged so as to act on the beam F11 propagating in the optical path in the −z-direction from the xy plane including the optical axis AX, whereby it is feasible to form an octupolar light intensity distribution consisting of outside surface illuminants in a quadrupolar pattern and in a radial polarization state and inside surface illuminants in a quadrupolar pattern and in a circumferential polarization state.

In the above description, the polarization conversion unit 9 is used to form the octupolar light intensity distribution 22p consisting of the light intensity distributions P31a-P31d in the quadrupolar pattern and in the circumferential polarization state and the light intensity distributions P32a-P32d in the quadrupolar pattern and in the radial polarization state as shown in FIG. 9. However, without the use of the polarization conversion unit 9, the octupolar light intensity distribution 22p can be formed, for example, by using three half wave plates 6, 6a, and 6b as shown in FIG. 18.

Figure 18:
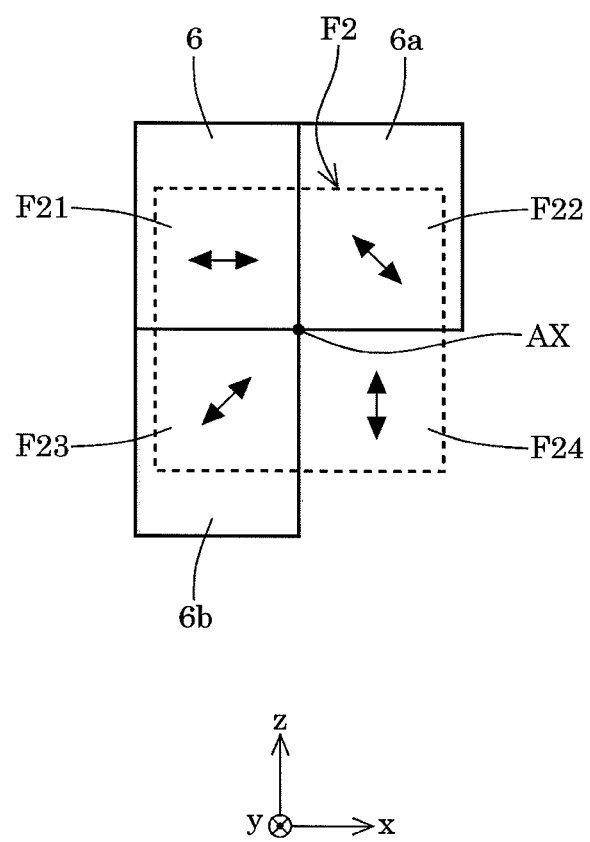
FIG. 18 is a drawing showing an example in which the same pupil intensity distribution as in FIG. 9 is formed by use of three half wave plates.

In the example shown in FIG. 18, the three half wave plates 6, 6a, and 6b with mutually different polarization conversion characteristics are arranged in juxtaposition at the position immediately in front of the diffractive optical element 3. As an example, the half wave plates 6, 6a, and 6b are arranged so that quarter beams F21, F22, and F23 of a propagating beam F2 propagating in the optical path are incident to the half wave plates 6, 6a, and 6b, respectively. Therefore, the rest quarter beam F24 of the propagating beam F2 travels without passing through any one of the half wave plates 6, 6a, and 6b, to reach the diffractive optical element 3.

The half wave plate 6, as described above, has its crystallographic optic axis set in such a direction that when the z-directionally linearly polarized light is incident thereto, it emits the x-directionally linearly polarized light with the polarization direction along the x-direction resulting from +90° rotation (90° clockwise rotation on the plane of FIG. 18) of the z-direction. The half wave plate 6a has its crystallographic optic axis set in such a direction that when the z-directionally linearly polarized light is incident thereto, it emits −45° obliquely linearly polarized light with the polarization direction along a −45° oblique direction resulting from −45° rotation (45° counterclockwise rotation on the plane of FIG. 18) of the z-direction.

The half wave plate 6b has its crystallographic optic axis set in such a direction that when the z-directionally linearly polarized light is incident thereto, it emits +45° obliquely linearly polarized light with the polarization direction along a +45° oblique direction resulting from +45° rotation of the z-direction. In the example shown in FIG. 18, the first beam F21 travels through the half wave plate 6 to become x-directionally linearly polarized light and then travels via a first mirror element group of the spatial light modulator 5 to form the surface illuminants P31c, P31d covering the pupil regions R31c, R31d.

The second beam F22 travels through the half wave plate 6a to become −45° obliquely linearly polarized light and then travels via a second mirror element group of the spatial light modulator 5 to form the surface illuminants P32a, P32b covering the pupil regions R32a, R32b. The third beam F23 travels through the half wave plate 6b to become +45° obliquely linearly polarized light and then travels via a third mirror element group of the spatial light modulator 5 to form surface illuminants P32c, P32d covering pupil regions R32c, R32d.

The fourth beam F24 travels as the z-directionally linearly polarized light without being subject to the action of the half wave plates 6, 6a, 6b and then travels via a fourth mirror element group of the spatial light modulator 5 to form the surface illuminants P31a, P31b covering the pupil regions R31a, R31b. Similarly, without the use of the polarization conversion unit 9, it is also possible to form the octupolar light intensity distributions 23p-28p, for example, using a polarizing member consisting of a plurality of polarizing elements such as the three half wave plates 6, 6a, and 6b.

In FIG. 18 the half wave plates 6 and 6a are adjacent in the x-direction and the half wave plates 6 and 6b are adjacent in the z-direction, but the arrangement of the three half wave plates 6, 6a, and 6b can be modified in various ways. Namely, at least two half wave plates out of the three half wave plates 6, 6a, and 6b may be arranged with a space between them along the xz plane.

In the above description, the octupolar light intensity distributions 21p-28p are formed on the entrance plane 8a of the micro fly's eye lens 8A and in turn on the illumination pupil immediately behind the micro fly's eye lens 8A. However, without being limited to the octupolar patterns, it is possible to form other multi-polar (e.g., quadrupolar, hexapolar, or the like) pupil intensity distributions, annular pupil intensity distributions, or the like by the action of the spatial light modulator 5. Namely, since the present embodiment is provided with the spatial light modulator 5 having the large number of mirror elements 5a the postures of which are individually controlled, degrees of freedom are high about change in the contour shape of the pupil intensity distribution (which is a broad concept embracing the size).

In addition, since the present embodiment is provided with the half wave plate 6 (6a, 6b) arranged at the position approximately optically conjugate with the array surface of the spatial light modulator 5 and the polarization conversion unit 9 arranged in the optical path according to needs, degrees of freedom are also high about change in polarization states of the pupil intensity distribution. Furthermore, since the present embodiment is provided with the diffractive optical element 3 (3a) as the divergence angle providing member arranged at the position approximately optically conjugate with the array surface of the spatial light modulator 5, the pupil intensity distribution can be formed with a desired beam profile. This will be described below with reference to FIG. 19.

Figure 19:
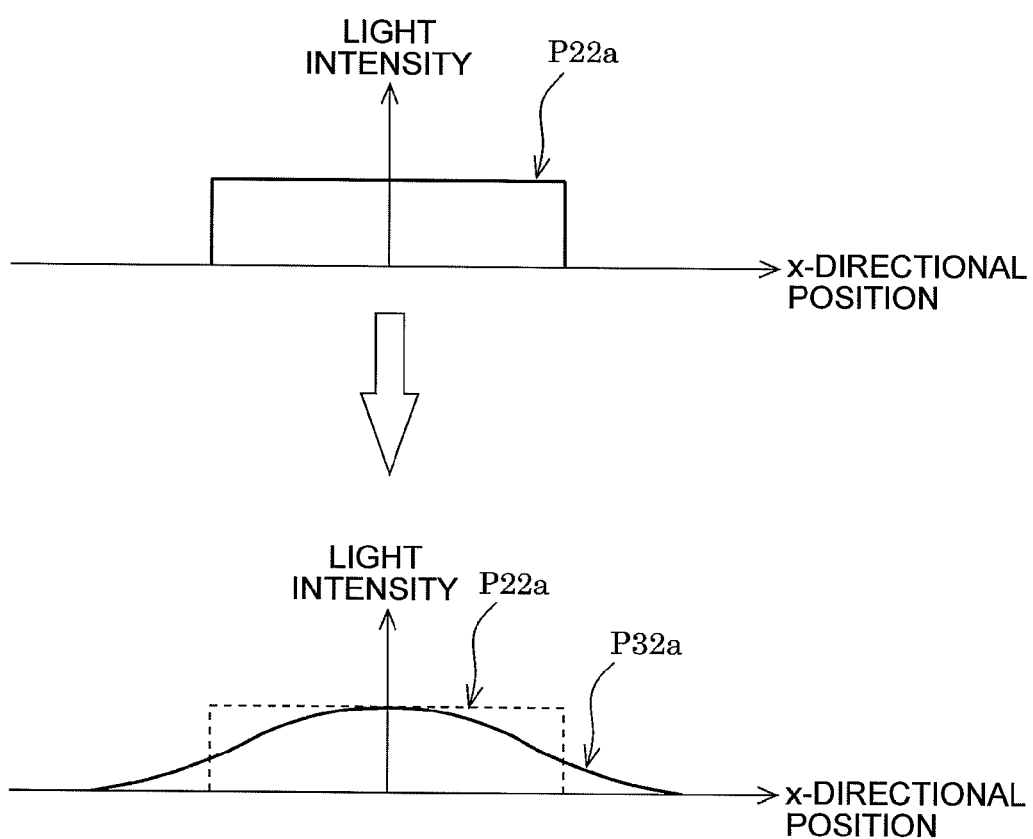
FIG. 19 is a drawing schematically showing a situation in which a pupil intensity distribution with a desired beam profile is formed by action of a divergence angle providing member.

The upper drawing of FIG. 19 schematically shows, about the surface illuminant P22a in the pupil intensity distribution 21p in FIG. 7, a beam profile (cross-sectional distribution of light intensity) along a cross section extending in the x-direction while passing a center thereof. In general, when the size of the reflective faces of the mirror elements forming the spatial light modulator is relatively large, a beam profile of each surface illuminant forming the pupil intensity distribution tends to be a top-hat type as shown in the upper drawing of FIG. 19.

In the present embodiment, since the diffractive optical element 3 is arranged so as to be approximately optically conjugate with the array surface of the spatial light modulator 5, the provision of the divergence angle to the incident beam by the diffractive optical element 3 is nothing but provision of the divergence angle to the incident beam to each mirror element 5a of the spatial light modulator 5. In addition, the distribution of angular directions of emergent beams from the spatial light modulator 5 is converted into the position distribution on the illumination pupil of the entrance plane 8a of the micro fly's eye lens 8A through the relay optical system 7.

Therefore, the surface illuminant P22a in the pupil intensity distribution 21p obtained with the diffractive optical element 3 as the divergence angle providing member being retracted from the optical path is changed into the surface illuminant P32a in the pupil intensity distribution 22p shown in FIG. 9, by the divergence angle providing action of the diffractive optical element 3 inserted in the optical path.

Namely, the region 32a covered by the surface illuminant P32a comes to have a shape resulting from similar enlargement of the region R22a covered by the surface illuminant P22a, depending on the magnitude of the divergence angle provided to the incident beam F12 by the diffractive optical element 3.

As a result, with the similar enlargement change of the contour shape of the surface illuminant P32a from the contour shape of the surface illuminant P22a by the divergence angle providing action of the diffractive optical element 3, the beam profile of the surface illuminant P32a also demonstrates a characteristic change from the top-hat type beam profile of the surface illuminant P22a. Specifically, the beam profile along the cross section extending in the x-direction while passing the center of the surface illuminant P32a comes to have such a characteristic that the light intensity gently decreases from the center toward the periphery, as shown in the lower drawing of FIG. 19.

The change in the characteristic of the beam profile with change of the contour shape also applies to the other surface illuminants P31a-P31d, P32b-P32d resulting from the enlargement of the contour shape by the divergence angle providing action of the diffractive optical element 3 in the pupil intensity distribution 22p. Furthermore, it also applies to the surface illuminants resulting from the enlargement of the contour shape by the divergence angle providing action of the diffractive optical element 3 or 3a in the other pupil intensity distributions 23p-28p.

Furthermore, the degree of the change in the characteristic of the beam profile with change of the contour shape of an arbitrary surface illuminant in the pupil intensity distribution is dependent on the magnitude of the divergence angle provided to the beam forming the surface illuminant, by the divergence angle providing member. In other words, by locating the divergence angle providing member that provides the required divergence angle to a beam forming an arbitrary surface illuminant in the pupil intensity distribution, in the optical path, the beam profile of the surface illuminant can be changed into a desired characteristic.

As described above, the illumination optical system (1 to 12A) of the present embodiment can form the pupil intensity distribution having a desired beam profile, on the illumination pupil immediately behind the micro fly's eye lens 8A. The exposure apparatus (1 to WS) of the present embodiment can accurately transfer a fine pattern onto the wafer W under an appropriate illumination condition realized according to the characteristic of the pattern of the mask M to be transferred, using the illumination optical system (1 to 12A) for forming the pupil intensity distribution with the desired beam profile.

In the above-described embodiment, the light with the inhomogeneous beam profile emitted from the light source LS is changed into the light with improved homogeneity of the intensity distribution by the action of the light intensity distribution homogenizing member 2, and the homogenized light is incident to the array surface of the spatial light modulator 5. Namely, by the action of the light intensity distribution homogenizing member 2, the light intensity distribution of the beam impinging on each mirror element 5a of the spatial light modulator 5 is homogenized and, in turn, the light intensity distribution of the beam emerging from each mirror element 5a is also homogenized. As a result, improvement is achieved in controllability of the spatial light modulator 5 to drive the large number of mirror elements 5a in forming the pupil intensity distribution.

In the above embodiment, the light intensity homogenizing member 2 is used to supply the light with the approximately homogenous intensity distribution to the diffractive optical element 3a. However, for example in FIG. 10, light beams with mutually different light intensities may be supplied to the first region to convert the incident beam into the first divergent beam and the second region to convert the incident beam into the second divergent beam. Here, since the first divergence angle of the first divergent beam is larger than the second divergence angle of the second divergent beam, if light with an approximately homogenous light intensity distribution is guided to the array surface of the spatial light modulator 5, the luminance of the regions R42a-R42d on the pupil generated by the second divergent beam via the spatial light modulator 5 becomes lower than the luminance of the regions R41a-R41d on the pupil generated by the first divergent beam via the spatial light modulator 5. In that case, light with the light intensity of the second region of the diffractive optical element 3a larger than the light intensity of the first region can be guided to the diffractive optical element 3a.

A light intensity distribution setting member to be used for setting the light from the light source to the light intensity distribution in which the light intensity to the second region is larger than the light intensity to the first region of the diffractive optical element 3a which can be regarded as the divergence angle providing member as described above, can be a combination of the relay optical system 2b with an element wherein a wedge-shaped optical member is provided on the exit side of each of the lens array 2a as the wavefront division element, a combination of the relay optical system 2b with a diffractive optical element for forming a stepped light intensity distribution in the far field, or the like.

Furthermore, the control unit CR receives supply of the monitor result (measurement result) of the light intensity distribution on the array surface of the spatial light modulator 5 from the beam monitor BM as occasion demands. In this case, the control unit CR refers to the monitor result about the light intensity distribution by the beam monitor BM when needed and appropriately controls the spatial light modulator 5 depending upon temporal variation of the beam profile of the light supplied from the light source LS, whereby a desired pupil intensity distribution can be formed on a stable basis.

In the above description, the lens array 2a as wavefront division element and the relay optical system 2b are used as the light intensity homogenizing member arranged in the optical path between the light source LS and the spatial light modulator 5 and configured to improve the homogeneity of the intensity distribution of the light incident to the array surface of the spatial light modulator 5. However, the light intensity homogenizing member can also be configured, for example, using an internal reflection type optical integrator (typically, a rod type integrator). Furthermore, the light intensity homogenizing member can also be configured using as the wavefront division element, for example, a diffractive optical element array or a reflective element array obtained by replacing the plurality of lens elements of the lens array 2a with diffractive faces or reflective faces having a function equivalent to that of these lens elements.

It is important in the light intensity distribution homogenizing member that the homogeneity of the light intensity distribution of the beam emerging from the member be better than that of the light intensity distribution of the beam incident to the member, and the light intensity distribution of the beam emerging from the member does not always have to be perfectly homogenous. The light intensity distribution homogenizing member may be located on the light source side with respect to a middle point of the optical path between the light source and the spatial light modulator.

In the above description, the diffractive optical element 3 is used as the divergence angle providing member for providing the divergence angle to the incident beam and emitting it. However, without having to be limited to the diffractive optical element, or without having to be limited to this, the divergence angle providing member can also be configured using a refractive element, e.g., like a lens array, or a reflective element, e.g., like a mirror array, or a scattering element, e.g., like a diffuser plate, or the like.

In the above description, the half wave plate 6 arranged in the optical path in which the partial beam of the propagating beam travels is used as the polarizing member. However, without having to be limited to the half wave plate, the polarizing member can also be configured, for example, using a quarter wave plate, an azimuth rotator, or the like arranged in the optical path in which a partial beam of the propagating beam travels. In other words, an element that converts the polarization state of incident light into another polarization state without substantial loss of light quantity can be used as the polarizing member. When the polarizing member used is one with the quarter wave plate, it can set a polarization state of an arbitrary surface illuminant in the pupil intensity distribution to a desired elliptic polarization.

The azimuth rotator has a form of a plane-parallel plate and is made of a crystal material being an optical material with optical rotatory power, e.g., rock crystal. Furthermore, the azimuth rotator is arranged so that its entrance plane (and in turn its exit plane) is perpendicular to the optical axis AX and so that its crystallographic optic axis is approximately coincident with the direction of the optical axis AX (or approximately coincident with the traveling direction of incident light). When the polarizing member is one with the azimuth rotator, it can set a polarization state of an arbitrary surface illuminant in the pupil intensity distribution to a desired linear polarization. Here, an optical material with optical rotatory power can be regarded as an element that provides a phase difference between a right-handed circular polarization component and a left-handed circular polarization component incident to the optical material, and a wave plate can be regarded as an element that provides a phase difference between mutually orthogonal polarization components incident to the wave plate. In this manner, the polarizing member can be regarded as a member that provides a phase difference between a certain specific polarization component of light incident to the polarizing member and another polarization component in a polarization state different from that of the certain specific polarization component.

Figure 20:
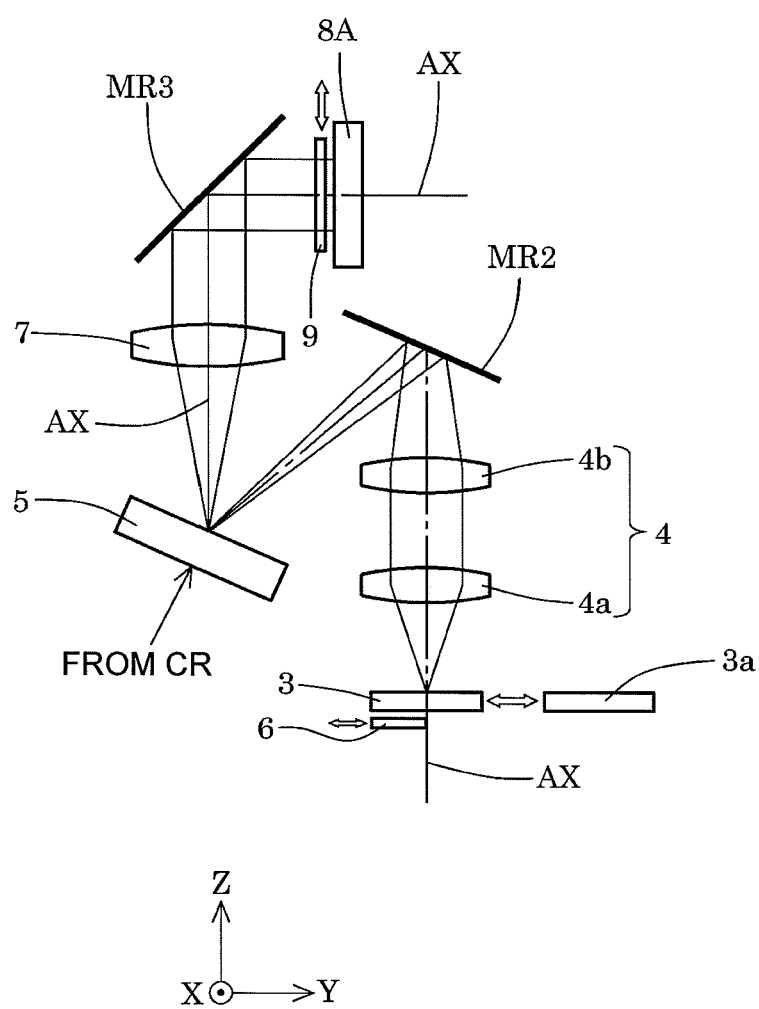
FIG. 20 is a drawing showing a major configuration of an example in which an entrance optical axis and an exit optical axis are arranged to make an angle smaller than 45° with an array surface of the spatial light modulator.

In FIG. 1, for easier understanding of the illustration of the entire apparatus and the action of the spatial light modulator 5, the optical axis AX of the reimaging optical system 4 and the optical axis AX of the relay optical system 7 are arranged to make 45° with the array surface of the spatial light modulator 5. However, without having to be limited to this configuration, it is also possible to adopt a configuration, for example as shown in FIG. 20, wherein a pair of optical path bending mirrors MR2, MR3 are set in whereby the optical axis AX of the reimaging optical system 4 as entrance optical axis and the optical axis AX of the relay optical system 7 as exit optical axis are arranged to make an angle smaller than 45° with the array surface of the spatial light modulator 5. FIG. 20 shows the major configuration along the optical path from the half wave plate 6 to the micro fly's eye lens 8A.

The above description shows the example in which the diffractive optical element 3 as divergence angle providing member is located at the position approximately optically conjugate with the array surface of the spatial light modulator 5. However, without having to be limited to this, the divergence angle providing member may be arranged in a conjugate space including a surface optically conjugate with the array surface of the spatial light modulator. Here, the "conjugate space" refers to a space between an optical element with a power adjacent on the front side to a conjugate position optically conjugate with the array surface of the spatial light modulator and an optical element with a power adjacent on the back side to the conjugate position. It is noted that a plane-parallel plate or a planar mirror without power may exist in the "conjugate space."

The above description shows the example in which the half wave plate 6 as polarizing member is located at the position approximately optically conjugate with the array surface of the spatial light modulator 5. However, without having to be limited to it, the polarizing member may be located at a position in the vicinity of the array surface of the spatial light modulator, or in the conjugate space including the surface optically conjugate with the array surface of the spatial light modulator.

Figure 21:
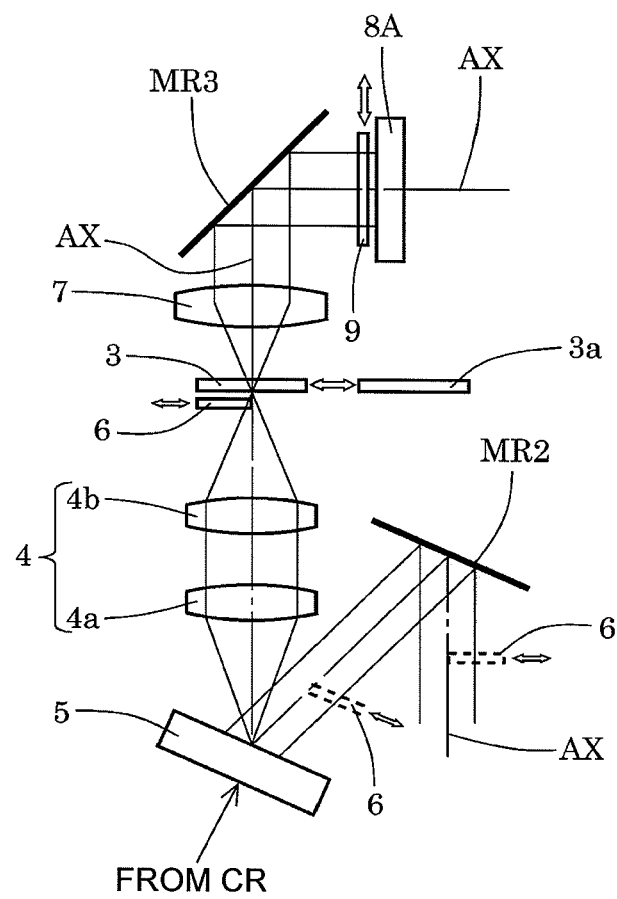
FIG. 21 is a drawing showing a major configuration of an example in which the diffractive optical element is arranged on the illumination target surface side of the spatial light modulator.

The above description shows the example in which the diffractive optical element 3 as divergence angle providing member and the half wave plate 6 as polarizing member are located at the position approximately optically conjugate with the array surface of the spatial light modulator 5 in the optical path on the light source side with respect to the spatial light modulator 5. However, without having to be limited to it, the same effect as in the above embodiment can also be achieved, for example as shown in FIG. 21, by locating the diffractive optical element 3 and the half wave plate 6 at a position approximately optically conjugate with the array surface of the spatial light modulator 5 in the optical path on the illumination target surface side with respect to the spatial light modulator 5. Alternatively, the half wave plate 6 may be located in the parallel optical path on the light source side with respect to the spatial light modulator 5, as indicated by dashed lines in FIG. 21. FIG. 21 shows the major configuration along the optical path from the optical path bending mirror MR2 or the half wave plate 6 to the micro fly's eye lens 8A.

In this manner, the positional relationship among the divergence angle providing member, the polarizing member, and the spatial light modulator can be modified in various forms. Namely, when attention is focused on the arrangement of the divergence angle providing member, it can be arranged in the conjugate space including the surface optically conjugate with the array surface of the spatial light modulator in the optical path on the light source side with respect to the spatial light modulator or in a conjugate space including a surface optically conjugate with the array surface of the spatial light modulator in the optical path on the illumination target surface side with respect to the spatial light modulator.

When attention is focused on the arrangement of the polarizing member, it can be arranged, without having to be limited to the adjacent position on the light source side of the divergence angle providing member, at an adjacent position on the illumination target surface side of the divergence angle providing member, at an adjacent position on the light source side of the spatial light modulator, at an adjacent position on the illumination target surface side of the spatial light modulator, in the conjugate space including the surface optically conjugate with the array surface of the spatial light modulator in the optical path on the light source side with respect to the spatial light modulator, or in the conjugate space including the surface optically conjugate with the array surface of the spatial light modulator in the optical path on the illumination target surface side with respect to the spatial light modulator.

However, when the half wave plate 6 as polarizing member is arranged in the optical path on the light source side with respect to the spatial light modulator 5 as in the above embodiment, we can enjoy the effect that the arrangement simplifies the correspondence relationship between the plurality of beams in different polarization states generated through the half wave plate 6 and the plurality of mirror element groups in the spatial light modulator 5 and in turn facilitates the control of the spatial light modulator 5. Furthermore, when the half wave plate 6 as polarizing member is arranged in the optical path on the light source side with respect to the diffractive optical element 3 as divergence angle providing member, we can enjoy the effect that the emergent light can be obtained in a desired linear polarization state, based on the incident light with a relatively small divergence angle.

The light intensity distribution of the beam incident to the surface where the half wave plate 6 as polarizing member is arranged does not have to be the even distribution (top-hat distribution). For example, it may be a light intensity distribution in which light intensity varies in a direction perpendicular to the moving direction of the half wave plate 6.

FIG. 22A is a drawing showing a relation between the half wave plate 6 as polarizing member and the beam F1 incident to the half wave plate 6, FIG. 22B a drawing showing a light intensity distribution in an X-directional cross section of the beam F1, and FIG. 22C a drawing showing a light intensity distribution in a Y-directional cross section of the beam F1.

When the light intensity distribution in the moving direction of the half wave plate 6 as polarizing member is nearly even, as shown in FIG. 22, there is an advantage that it becomes easier to perform, for example, control to change the position of the half wave plate 6 for changing the areas intensity ratio of a plurality of polarization states in the pupil intensity distribution.

In the above embodiment, the spatial light modulator 5 capable of individually controlling the orientations (angles: inclinations) of the reflective faces arrayed two-dimensionally is used as a spatial light modulator with a plurality of mirror elements arrayed two-dimensionally and controlled individually. However, without having to be limited to this, it is also possible, for example, to use a spatial light modulator capable of individually controlling heights (positions) of the reflective faces arrayed two-dimensionally. The spatial light modulator of this kind to be used can be one of the spatial light modulators disclosed, for example, in U.S. Pat. No. 5,312,513 and in FIG. 1d in U.S. Pat. No. 6,885,493. In these spatial light modulators, a two-dimensional height distribution is formed whereby incident light is subject to the same action as that of a diffractive surface. The aforementioned spatial light modulator with, the plurality of reflective faces arrayed two-dimensionally may be modified, for example, according to the disclosures in U.S. Pat. No. 6,891,655 and in U.S. Pat. Published Application No. 2005/0095749.

In the above embodiment the spatial light modulator 5 is provided with the plurality of mirror elements 5a arrayed two-dimensionally in the predetermined surface, but, without having to be limited to this, it is also possible to use a transmission type spatial light modulator with a plurality of transmissive optical elements arrayed in a predetermined surface and controlled individually.

In the above embodiment, the mask can be replaced with a variable pattern forming device which forms a predetermined pattern on the basis of predetermined electronic data. The variable pattern forming device applicable herein can be, for example, a spatial light modulation element including a plurality of reflective elements driven based on predetermined electronic data. The exposure apparatus using the spatial light modulation element is disclosed, for example, in U.S. Pat. Published Application No. 2007/0296936. Besides the reflection type spatial light modulators of the non-emission type as described above, it is also possible to apply a transmission type spatial light modulator or a self-emission type image display device.

The exposure apparatus of the foregoing embodiment is manufactured by assembling various sub-systems including their respective components as set forth in the scope of claims in the present application, so as to maintain predetermined mechanical accuracy, electrical accuracy, and optical accuracy. For ensuring these various accuracies, the following adjustments are carried out before and after the foregoing assembling process: adjustment for achieving the optical accuracy for various optical systems; adjustment for achieving the mechanical accuracy for various mechanical systems; adjustment for achieving the electrical accuracy for various electrical systems. The assembling steps from the various sub-systems into the exposure apparatus include mechanical connections, wire connections of electric circuits, pipe connections of pneumatic circuits, etc. between the various sub-systems. It is needless to mention that there are assembling steps of the individual sub-systems, before the assembling steps from the various sub-systems into the exposure apparatus. After completion of the assembling steps from the various sub-systems into the exposure apparatus, overall adjustment is carried out to ensure various accuracies as the entire exposure apparatus. The manufacture of the exposure apparatus may be performed in a clean room in which the temperature, cleanliness, etc. are controlled.

Figure 23:
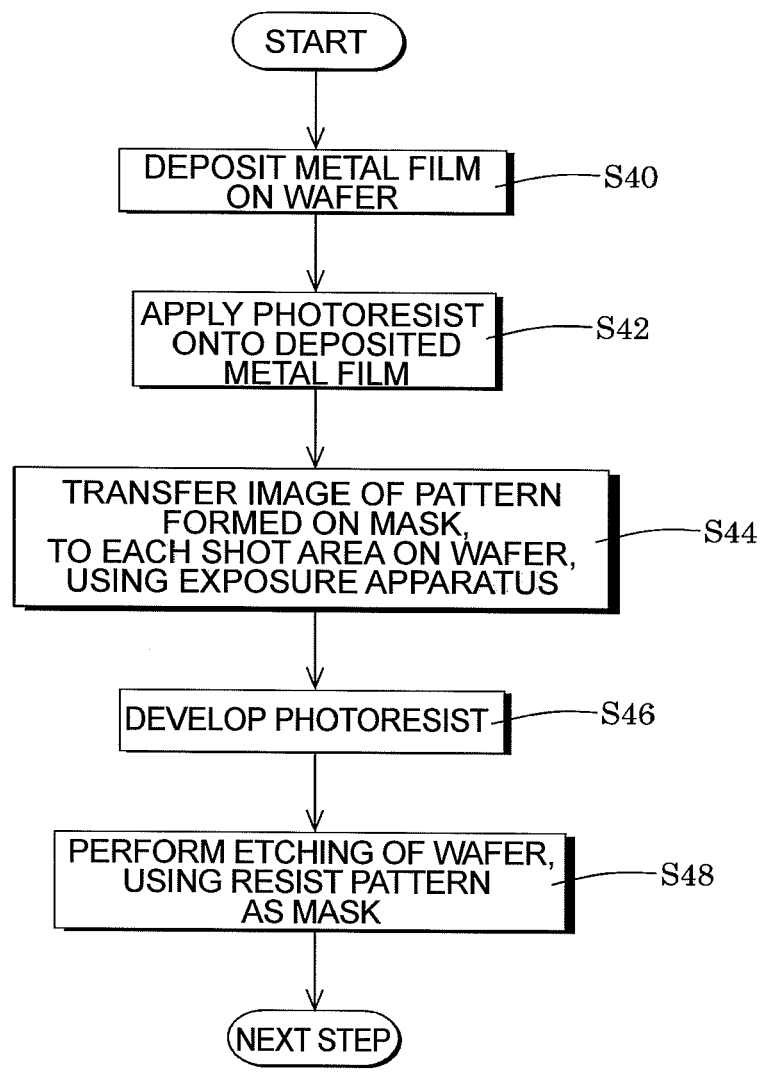
FIG. 23 is a flowchart showing manufacturing steps of semiconductor devices.

The following will describe a device manufacturing method using the exposure apparatus according to the above-described embodiment. FIG. 23 is a flowchart showing manufacturing steps of semiconductor devices. As shown in FIG. 23, the manufacturing steps of semiconductor devices include depositing a metal film on a wafer W to become a substrate of semiconductor devices (step S40) and applying a photoresist as a photosensitive material onto the deposited metal film (step S42). The subsequent steps include transferring a pattern formed on a mask (reticle) M, to each shot area on the wafer W, using the projection exposure apparatus of the above embodiment (step S44: exposure step), and developing the wafer W after completion of the transfer, i.e., developing the photoresist on which the pattern has been transferred (step S46: development step).

Thereafter, using the resist pattern made on the surface of the wafer W in step S46, as a mask, processing such as etching is carried out on the surface of the wafer W (step S48: processing step). The resist pattern herein is a photoresist layer in which depressions and projections are formed in a shape corresponding to the pattern transferred by the projection exposure apparatus of the above embodiment and which the depressions penetrate throughout. Step S48 is to process the surface of the wafer W through this resist pattern. The processing carried out in step S48 includes, for example, at least either etching of the surface of the wafer W or deposition of a metal film or the like. In step S44, the projection exposure apparatus of the above embodiment performs the transfer of the pattern onto the wafer W coated with the photoresist, as a photosensitive substrate or plate P.

Figure 24:
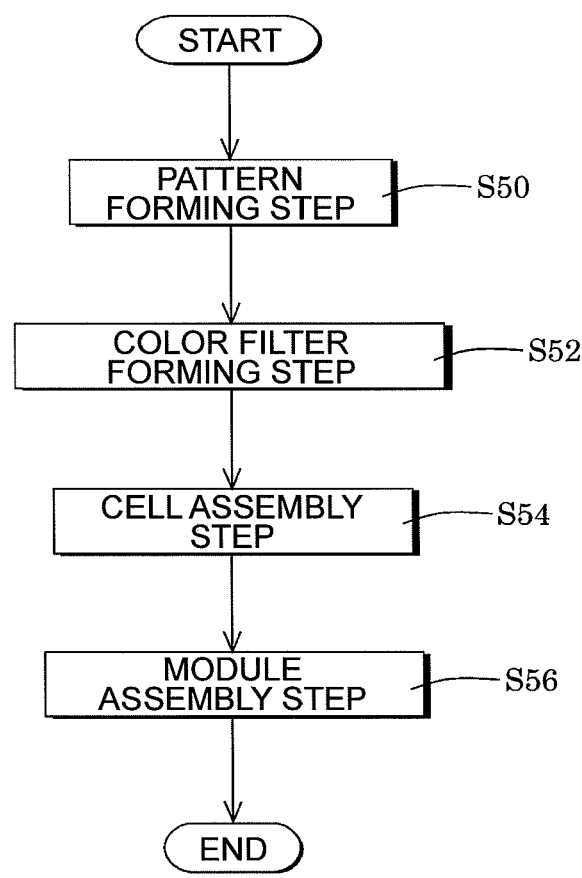
FIG. 24 is a flowchart showing manufacturing steps of a liquid crystal device such as a liquid crystal display device.

FIG. 24 is a flowchart showing manufacturing steps of a liquid crystal device such as a liquid crystal display device. As shown in FIG. 24, the manufacturing steps of the liquid crystal device include sequentially performing a pattern forming step (step S50), a color filter forming step (step S52), a cell assembly step (step S54), and a module assembly step (step S56). The pattern forming step of step S50 is to form predetermined patterns such as a circuit pattern and an electrode pattern on a glass substrate coated with a photoresist, as a plate P, using the projection exposure apparatus of the above embodiment. This pattern forming step includes an exposure step of transferring a pattern to a photoresist layer, using the projection exposure apparatus of the above embodiment, a development step of performing development of the plate P on which the pattern has been transferred, i.e., development of the photoresist layer on the glass substrate, to make the photoresist layer in a shape corresponding to the pattern, and a processing step of processing the surface of the glass substrate through the developed photoresist layer.

The color filter forming step of step S52 is to form a color filter in which a large number of sets of three dots corresponding to R (Red), G (Green), and B (Blue) are arrayed in a matrix pattern, or in which a plurality of filter sets of three stripes of R, G, and B are arrayed in a horizontal scan direction. The cell assembly step of step S54 is to assemble a liquid crystal panel (liquid crystal cell), using the glass substrate on which the predetermined pattern has been formed in step S50, and the color filter formed in step S52. Specifically, for example, a liquid crystal is poured into between the glass substrate and the color filter to form the liquid crystal panel. The module assembly step of step S56 is to attach various components such as electric circuits and backlights for display operation of this liquid crystal panel, to the liquid crystal panel assembled in step S54.

The present invention is not limited just to the application to the exposure apparatus for manufacture of semiconductor devices, but can also be widely applied, for example, to the exposure apparatus for display devices such as liquid crystal display devices formed with rectangular glass plates, or plasma displays, and to the exposure apparatus for manufacture of various devices such as imaging devices (CCDs and others), micro machines, thin film magnetic heads, and DNA chips. Furthermore, the present invention is also applicable to the exposure step (exposure apparatus) for manufacture of masks (photomasks, reticles, etc.) on which mask patterns of various devices are formed, by the photolithography process.

The above-described embodiment uses the ArF excimer laser light (wavelength: 193 nm) or the KrF excimer laser light (wavelength: 248 nm) as the exposure light, but, without having to be limited to this, the present invention can also be applied to other appropriate laser light sources, e.g., an $F_2$ laser light source which supplies laser light at the wavelength of 157 nm.

In the foregoing embodiment, it is also possible to apply a technique of filling the interior of the optical path between the projection optical system and the photosensitive substrate with a medium having the refractive index larger than 1.1 (typically, a liquid), which is so called a liquid immersion method. In this case, it is possible to adopt one of the following techniques as a technique of filling the interior of the optical path between the projection optical system and the photosensitive substrate with the liquid: the technique of locally filling the optical path with the liquid as disclosed in International Publication WO99/49504; the technique of moving a stage holding the substrate to be exposed, in a liquid bath as disclosed in Japanese Patent Application Laid-open No. H06-124873; the technique of forming a liquid bath of a predetermined depth on a stage and holding the substrate therein as disclosed in Japanese Patent Application Laid-open No. H10-303114, and so on. The teachings of International Publication WO99/49504, Japanese Patent Application Laid-open No. H06-124873, and Japanese Patent Application Laid-open No. H10-303114 are incorporated herein by reference.

In the foregoing embodiment, the present invention is applied to the illumination optical system for illuminating the mask (or wafer) in the exposure apparatus, but, without having to be limited to this, the present invention is also applicable to ordinary illumination optical assemblies for illuminating the illumination target surface other than the mask (or wafer).

Incidentally, formation of a certain light quantity distribution (pupil shape) on the pupil plane of the illumination optical system with the use of the spatial light modulator can also be regarded as a method for forming a certain image (light quantity distribution) by combining a large number of microscopic patterns (microscopic regions) formed on the pupil plane by reflections from the large number of mirror elements of the spatial light modulator, in a predetermined array. On this occasion, because the number of mirror elements is large, a problem is, with a certain target pupil shape given, how efficiently an array of positions of all microscopic patterns for obtaining the pupil shape (setting values of inclination angles of corresponding mirror elements) is to be calculated.

Furthermore, it is also possible to irradiate the array of the large number of mirror elements with the illumination light, for example, through a plurality of optical filters which are arranged in parallel and the respective transmittances of which can be controlled in a plurality of stages, thereby to divide the array of mirror elements into a plurality of groups, and to control light quantities of respective microscopic patterns group by group. When states such as the light quantities of microscopic patterns on the pupil plane can be controlled group by group as described above, a problem is how efficiently a combination of variables about the states along with the positions of the respective patterns is to be calculated.

In light of such circumstances, a further problem to be solved is as follows: in forming, for example, a target light quantity distribution or a light quantity distribution close to a target image or the like by a combination of a plurality of microscopic patterns or microscopic regions or the like, the problem is to enable efficient calculation of a combination of positions and states of the microscopic patterns or the microscopic regions or the like.

The below will describe the second embodiment as to a control method about the operation of the spatial light modulator, with reference to FIGS. 25 to 31.

Figure 25:
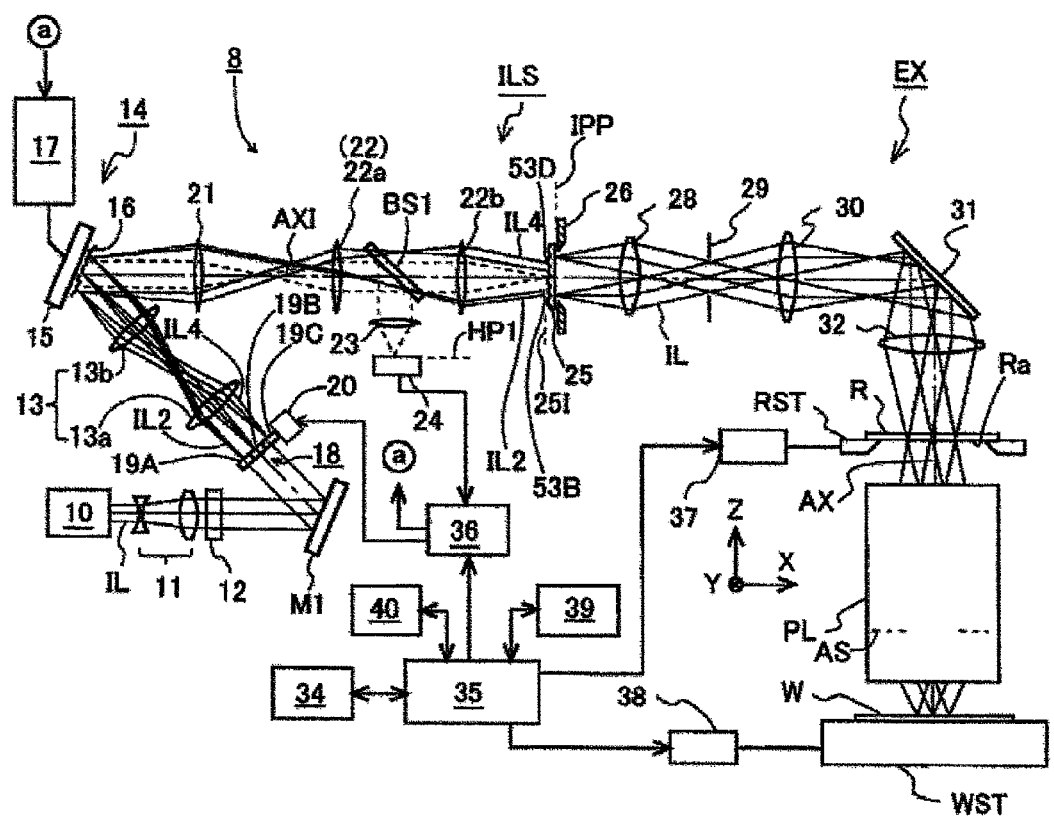
FIG. 25 is a drawing showing a schematic configuration of an exposure apparatus according to an example of a second embodiment.

FIG. 25 shows a schematic configuration of the exposure apparatus EX according to the second embodiment. The exposure apparatus EX is a scanning exposure type exposure apparatus (projection exposure apparatus) consisting of a scanning stepper (scanner) as an example. In FIG. 25, the exposure apparatus EX is provided with a light source 10 for generating illumination light for exposure (exposure light) IL, and an illumination optical system ILS for illuminating a reticle surface Ra (illumination target surface) being a pattern surface of a reticle R (mask) with the illumination light IL from the light source 10. Furthermore, the exposure apparatus EX is provided with a reticle stage RST for moving the reticle R, a projection optical system PL for projecting an image of a pattern of the reticle R onto a surface of a wafer W (photosensitive substrate), a wafer stage WST for moving the wafer W, a main control system 35 consisting of a computer for totally controlling the operation of the entire apparatus, various control systems, and so on.

The description hereinbelow will be based on such a coordinate system that the Z-axis is set in parallel with the optical axis AX of the projection optical system PL, the X-axis is set along a direction parallel to the plane of FIG. 25 in a plane perpendicular to the Z-axis, and the Y-axis is set along a direction perpendicular to the plane of FIG. 25. In the second embodiment, scanning directions of the reticle R and the wafer W during exposure are directions (Y-directions) parallel to the Y-axis. Furthermore, the description will be based on such definition that directions of rotation about axes parallel to the X-axis, Y-axis, and Z-axis (inclination directions) are defined as $\theta x$ direction, $\theta y$ direction, and $\theta z$ direction.

The light source 10 used herein is an ArF excimer laser light source which emits pulses of 193 nm-wavelength linearly polarized laser light as an example. It is noted that the light source 10 applicable herein can also be, for example, a KrF excimer laser light source which supplies laser light at the wavelength of 248 nm, or a harmonic generator which generates a harmonic of laser light emitted from a solid-state laser light source (YAG laser, semiconductor laser, or the like).

In FIG. 25, the linearly polarized illumination light IL consisting of the laser light emitted from the light source 10 controlled by an unshown power supply unit travels via a transfer optical system including a beam expander 11, a polarization optical system 12 for adjusting a polarization direction and a polarization state, and an optical path bending mirror M1, to impinge as a nearly parallel beam on an illumination region 50 (cf. FIG. 27) in which a first set, a second set, and a third set of diffractive optical element groups 19A, 19B, and 19C can be set. Each of the diffractive optical element groups 19A-19C has a plurality of diffractive optical elements (DOEs) arranged as adjacent in a direction traversing the optical path of the illumination light IL. A divergence angle varying unit 18 is configured including the diffractive optical element groups 19A-19C, and a drive mechanism 20 for setting any diffractive optical elements (DOEs hereinafter) in the diffractive optical element groups 19A-19C in the illumination optical path, or for setting the illumination optical path in a transparent state with no DOE being set therein.

Figure 27:
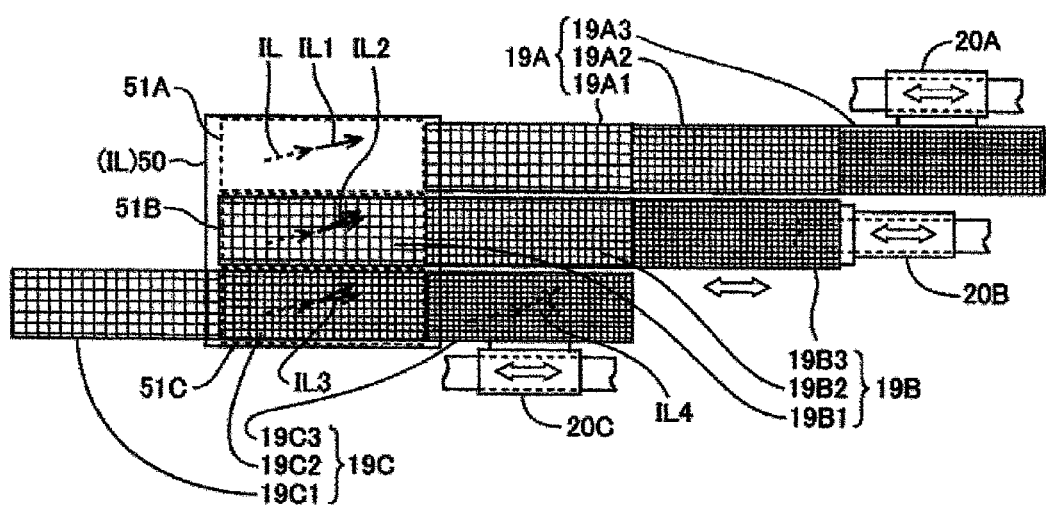
FIG. 27 is a drawing showing arrangement of three sets of diffractive optical element groups in FIG. 25.

As shown in FIG. 27, the diffractive optical element group 19A has first, second, and third DOEs 19A1, 19A2, and 19A3 which are coupled so as to be able to cross a first region 51A, out of mutually approximately identical rectangular first, second, and third regions 51A, 51B, 51C obtained by dividing the illumination region 50 (illumination optical path) of the illumination light IL into three nearly equal sections, in the longitudinal direction and each of which has much the same size as the region 51A. The DOEs 19A1-19A3 are coupled to a movable portion 20A integrally movable along a guide portion and the movable portion 20A moves the DOEs 19A1-19A3 in the longitudinal direction whereby it can set any one of the DOEs 19A1-19A3 in the region 51A or set the region 51A in a transparent state.

Similarly, the diffractive optical element groups 19B, 19C have DOEs 19B1, 19B2, 19B3 and 19C1, 19C2, 19C3, respectively, which are similarly coupled in the longitudinal direction in the same configuration as the DOEs 19A1, 19A2, and 19A3. Concerning the DOEs 19B1-19B3 and 19C1-19C3, they can be moved in the longitudinal direction by movable portions 20B and 20C, respectively, whereby any one of them can be set in regions 51B and 51C or the region 51B or 51C can be set in the transparent state. The operation of the movable portions 20A-20C is controlled by an illumination control unit 36 under control of a main control system 35 in FIG. 25. The drive mechanism 20 in FIG. 25 is configured including the movable portions 20A-20C.

In FIG. 27, when the regions 51A-51C are transparent, the illumination light IL being incident to the regions 51A-51C and consisting of the nearly parallel beam indicated by dotted lines, passes directly through the regions 51A-51C as illumination light IL1 indicated by a solid line. When the DOEs 19A1, 19B1, and 19C1 of a mutually identical configuration are set in the regions 51A, 51B, and 51C, the illumination light IL incident to the DOEs 19A1-19C1 is converted into illumination light IL2 with a first opening angle, and it passes through the regions 51A-51C. Furthermore, when the DOEs 19A2, 19B2, 19C2 or 19A3, 19B3, 19C3 of a mutually identical configuration are set in the regions 51A, 51B, and 51C, the illumination light IL incident to these DOEs is converted into illumination light IL3 or IL4 with a second opening angle (>first opening angle) or with a third opening angle (>second opening angle), respectively, and it passes through the regions 51A-51C.

The DOEs 19A1-19A3 and others can be manufactured by forming a two-dimensional uneven pattern of an interference fringe shape on a face of an optically transparent glass substrate or synthetic resin substrate by a photolithography step or an embossing step or the like. The uneven pattern of the DOE 19A2 is finer than the pattern of the DOE 19A1 and the uneven pattern of the DOE 19A3 is finer than the pattern of the DOE 19A2. In the second embodiment, by setting any DOEs in the diffractive optical element groups 19A-19C in the regions 51A-51C or by setting the regions 51A-51C transparent, the opening angles of the illumination light passing through the regions 51A-51C can be set to any angle of nearly 0, the first opening angle, the second opening angle, or the third opening angle, independently of each other.

In FIG. 25, the illumination light having passed through the illumination region where the diffractive optical element groups 19A-19C can be set travels through a relay optical system 13 consisting of lenses 13a and 13b and then is obliquely incident at a predetermined small angle of incidence to reflective faces of a large number of microscopic mirror elements 16 inclination angles about two orthogonal axes of each of which are variable, in a spatial light modulator (SLM) 14. A setting surface of the diffractive optical element groups 19A-19C and an average arrangement surface of the array of mirror elements 16 are approximately conjugate with respect to the relay optical system 13. The spatial light modulator 14 (SLM 14 hereinafter) has the array of mirror elements 16, a drive base unit 15 for supporting and driving each mirror element 16, and an SLM control system 17 for controlling the inclination angle of each mirror element 16.

Figure 26A:
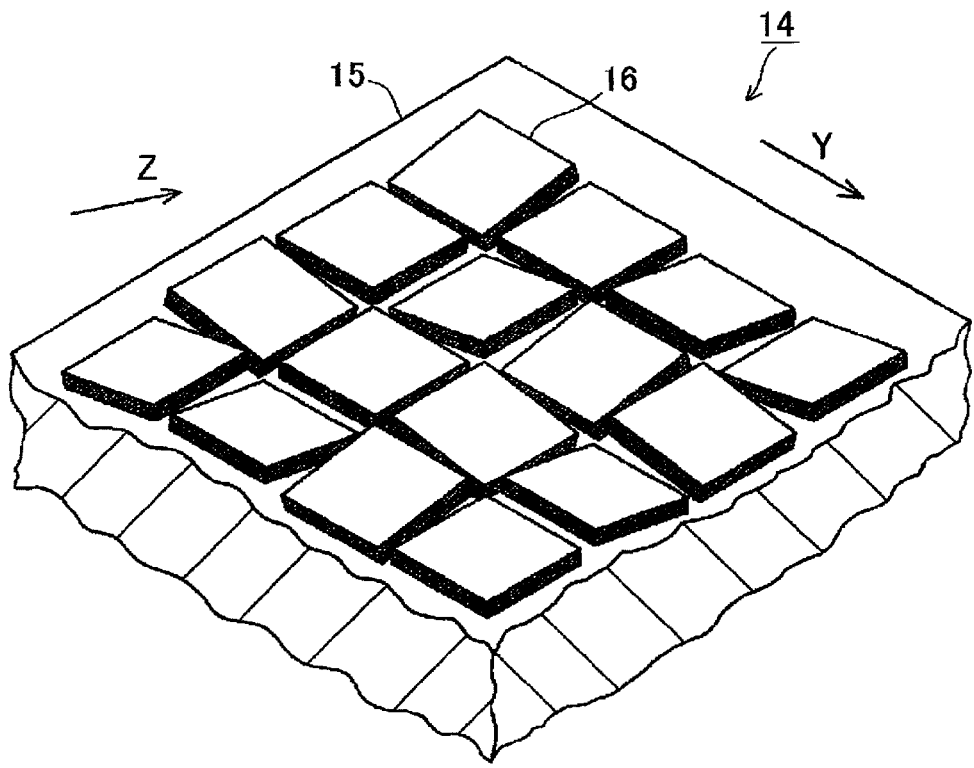
FIG. 26A is an enlarged perspective view showing a part of an array of mirror elements of the spatial light modulator in FIG. 25, and FIG. 26B a drawing showing an example of a light quantity distribution on an entrance plane (illumination pupil plane) in FIG. 25.

FIG. 26A is an enlarged perspective view showing a part of the SLM 14. In FIG. 26A, the array of mirror elements 16 arrayed in close proximity at constant pitches approximately in the Y-direction and in the Z-direction is supported on a surface of the drive base unit 15 of the SLM 14. As an example, the width of the mirror elements 16 is from several µm to several ten µm and the numbers of the mirror elements 16 arrayed approximately in the Y-direction and in the Z-direction are approximately from several ten to several hundred. In this case, the total number of mirror elements 16 is, for example, approximately from several thousand to 300,000.

The drive base unit 15 with the array of mirror elements 16 and the drive mechanism corresponding to it can be manufactured, for example, by use of the MEMS (Microelectromechanical Systems) technology. Such a spatial light modulator applicable herein is, for example, that disclosed in the specification of European Patent Application Publication EP 779530 or in the specification of U.S. Pat. No. 6,900,915. The mirror elements 16 are planar mirrors of a nearly square shape, but the shape may be any shape such as a rectangle.

Figure 28A:
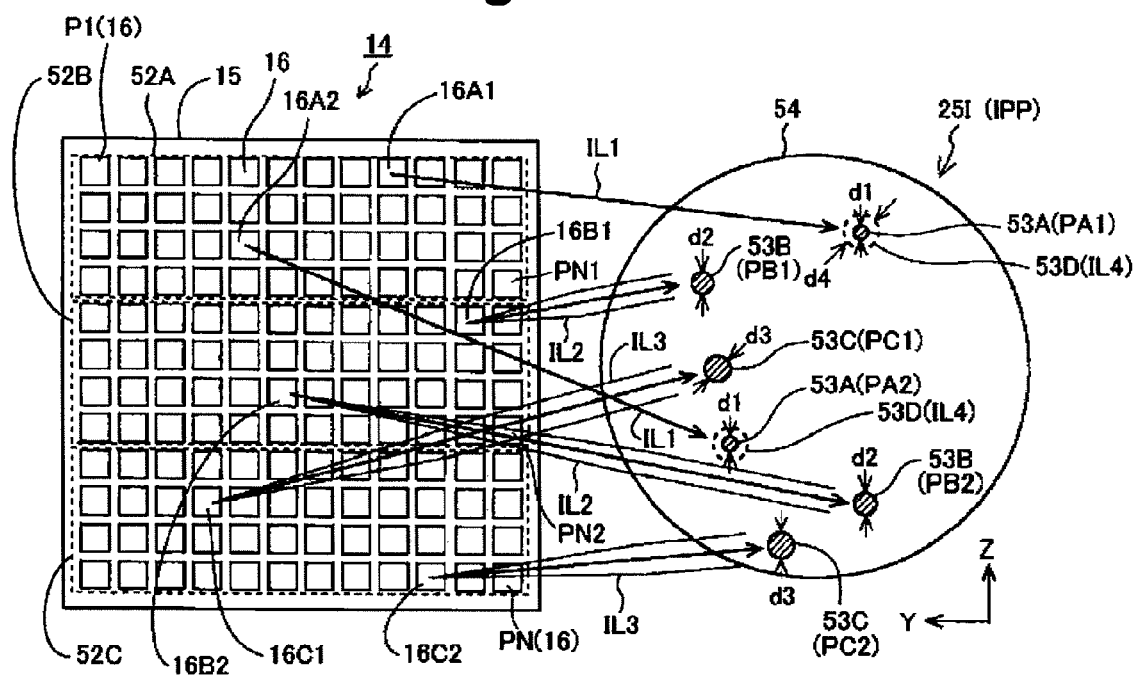
FIG. 28A is a drawing showing an example of dot patterns formed on the entrance plane (illumination pupil plane) by reflections from a plurality of mirror elements of the spatial light modulator, and FIG. 28B a drawing showing another example of dot patterns.

Furthermore, as shown in FIG. 28A, an array region of the array of mirror elements 16 of the SLM 14 is divided into first, second, and third array regions 52A, 52B, and 52C with a mutually identical width. When the total number of mirror elements 16 is N, the mirror elements 16 are arranged from the first position P1 to the N1-th (N1 is an integer approximately equal to N/3) position PN1, from the (N1+1)-th position to the N2-th (N2 is an integer approximately equal to 2N/3) position PN2, and from the (N2+1)-th position to the N-th position PN, respectively, in the array regions 52A, 52B, and 52C. The array regions 52A, 52B, and 52C of the SLM 14 are approximately conjugate with the regions 51A, 51B, and 51C, respectively, where the diffractive optical element groups 19A, 19B, and 19C in FIG. 27 can be set, with respect to the relay optical system 13 in FIG. 25.

Therefore, the illumination light beams IL1-IL4 with the opening angle being set at 0 or at any one of the first to third opening angles through the respective regions 51A-51C are incident to the array regions 52A-52C of the SLM 14. Since the illumination light impinging on each mirror element 16 is reflected as it is, the opening angles of the illumination light beams reflected by the mirror elements 16 in the array regions 52A-52C of the SLM 14 are approximately equal to the opening angles of the illumination light beams having passed through the respective regions 51A-51C. It is assumed herein that the magnification of the relay optical system 13 is approximately one.

In FIG. 25, the SLM 14 irradiates an entrance plane 25I of a below-described micro lens array 25 with reflections from the large number of mirror elements 16, according to an illumination condition, thereby to form a predetermined light quantity distribution (light intensity distribution) on the entrance plane 25I. As an example, where normal illumination or annular illumination is carried out, the SLM 14 reflects the illumination light to form a light intensity distribution in which intensity becomes high in a circular region or in an annular region, on the entrance plane 25I. In the case of dipolar or quadrupolar illumination being carried out, a light intensity distribution in which intensity becomes high in two or four regions is formed; when so-called optimized illumination is carried out, a light intensity distribution of a complicated shape optimized according to the pattern of the reticle R is formed. Information of illumination conditions according to reticles R is recorded in an exposure data file in a storage unit 39 such as a magnetic storage unit. The main control system 35 supplies information of an illumination condition read out from the exposure data file to a controller in the illumination control unit 36, and in accordance with the information, the controller controls the inclination angles of all the mirror elements 16 of the SLM 14 through the SLM control system 17 and sets the DOEs selected from the diffractive optical element groups 19A-19C in the illumination optical path or set the illumination optical path transparent through the drive mechanism 20 (the details of which will be described later).

The illumination light reflected by the large number of mirror elements 16 of the SLM 14 is incident along the optical axis AX of the illumination optical system ILS to an incidence optical system 21 for converting the illumination light IL into parallel light. The illumination light having passed through the incidence optical system 21 travels through a relay optical system 22 consisting of a first lens system 22a and a second lens system 22b to impinge on the entrance plane 25I of the micro lens array 25. The average arrangement plane of the array of mirror elements 16 and the entrance plane 25I are approximately in an optical Fourier transform relation. The micro lens array 25 is an array of a large number of microscopic lens elements arranged approximately in close contact in the Z-direction and the Y-direction and an exit plane of the micro lens array 25 is a pupil plane IPP of the illumination optical system ILS (a plane conjugate with the exit pupil). A surface illuminant consisting of a large number of secondary light sources (light source images) by wavefront division are formed on the pupil plane IPP (illumination pupil plane IPP hereinafter).

Since the micro lens array 25 is an array in which a large number of microscopic optical systems are arranged in parallel, a global light quantity distribution (light intensity distribution) on the entrance plane 25I is transferred to the illumination pupil plane IPP as exit plane as it is. In other words, the global light quantity distribution formed on the entrance plane 25I and the global light quantity distribution of the whole of secondary light source are approximately equal or demonstrate a high correlation. Here, the entrance plane 25I is a plane equivalent to the illumination pupil plane IPP (a plane where the light quantity distribution is approximately similar) and a shape of an arbitrary light quantity distribution of the illumination light formed on the entrance plane 25I (which is a shape of a region surrounded by a contour line where light intensity is at a predetermined level) becomes a pupil shape being a shape of a light quantity distribution on the illumination pupil plane IPP as it is. It is noted that a fly's eye lens may be used instead of the micro lens array 25. Furthermore, the cylindrical micro fly's eye lens disclosed, for example, in U.S. Pat. No. 6,913,373 may be used as the fly's eye lens.

Figure 26B:
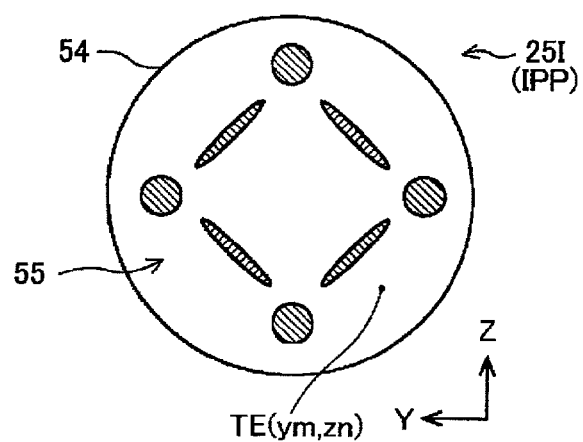

In the second embodiment, an illumination aperture stop 26 is set on the illumination pupil plane IPP. FIG. 26B shows an example of a target light quantity distribution 55 in a circumference 54 where the coherence factor (σ value) set by the illumination aperture stop 26 is 1 on the entrance plane 25I (and in turn on the illumination pupil plane IPP). The light quantity distribution 55 is, for example, a distribution optimized for the reticle R. In FIG. 25, as an example, the illumination light beams IL2, IL4 with the first and third opening angles from the set surface of the diffractive optical element groups 19A and 19C are incident to the array of mirror elements 16. In this case, the illumination light beam IL2 (or IL4) reflected by the mirror elements 16 forms a dot pattern 53B (or 53D) (cf. FIG. 28A) being a circular small light quantity distribution with a second smallest diameter d2 (or a maximum diameter d4) on the entrance plane 25I (illumination pupil plane IPP) of the micro lens array 25. Namely, the larger the opening angle of the illumination light incident to the mirror elements 16 of the SLM 14, the larger the diameter of a dot pattern of light incident to the entrance plane 25I after reflected by the mirror elements 16.

Furthermore, as shown in FIG. 27, let us suppose, for example, that while no DOE is set in the region 51A in the illumination region 50 (the transparent state) and the DOEs 19B1 and 19C2 are set in the respective regions 51B and 51C, the illumination region 50 is irradiated with the illumination light IL. At this time, as shown in FIG. 28A, the diameters of dot patterns 53A formed at arbitrary positions PA1, PA2 on the entrance plane 25I (and in turn on the illumination pupil plane IPP, the same also applies to the description below) by the illumination light IL1 reflected by arbitrary mirror elements 16A1, 16A2 in the first array region 52A of the SLM 14 (region approximately conjugate with the region 51A) are the minimum d1 in common. In addition, the diameters of dot patterns 53B formed at arbitrary positions PB1, PB2 on the entrance plane 25I by the illumination light IL2 reflected by arbitrary mirror elements 16B1, 16B2 in the second array region 52B of the SLM 14 (region approximately conjugate with the region 51B) are d2 in common and the diameters of dot patterns 53C formed at arbitrary positions PC1, PC2 on the entrance plane 25I by the illumination light IL3 reflected by arbitrary mirror elements 16C1, 16C2 in the third array region 53B of the SLM 14 (region approximately conjugate with the region 51C) are d3 in common. Furthermore, if the DOE 19A3 is set in the region 51A in FIG. 27, dot patterns 53D with the maximum diameter d4 indicated by dotted lines are formed at positions PA1, PA2 on the entrance plane 25I in FIG. 28.

In the second embodiment, as described above, the two-dimensional positions (positions in the Y-direction and the Z-direction) of dot patterns formed on the entrance plane 25I (illumination pupil plane IPP) by the illumination light reflected by the respective mirror elements 16 in the array regions 52a, 52B, and 52C of the SLM 14 can be arbitrarily set in a movable range including at least the region in the circumference 54 where the a value is 1. The two-dimensional positions of the dot patterns formed on the entrance plane 25I by the reflected light from the respective mirror elements 16 can be controlled by controlling the inclination angles about the two orthogonal axes of the respective mirror elements 16.

On the other hand, the diameters d, which are variables about states of the dot patterns formed on the entrance plane 25I by the illumination light reflected by the respective mirror elements 16 in the array regions 52A, 52B, and 52C, are set to any one of d1, d2, d3, and d4 in common for the respective array regions 52A, 52B, and 52C. The magnitudes of the diameters d1-d4 are in the relation below and the minimum diameter d1 is set, for example, smaller than the width in the transverse direction of the cross-sectional shape of each lens element forming the micro lens array 25.

$$d1<d2<d3<d4 \quad (1)$$

Figure 28B:
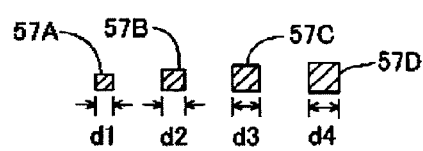

The diameter d of the dot pattern set in common for each of the array regions 52A-52C can be controlled based on which DOEs are selected from the diffractive optical element groups 19A-19C of the divergence angle varying unit 18 in FIG. 25 and set in the respective regions 51A-51C of the illumination optical path. In the second embodiment the dot patterns 53A-53D formed on the entrance plane 25I are small circles. In contrast to it, depending upon the numerical aperture of the relay optical system 22 in FIG. 25 or the like, it is also possible to form dot patterns 57A-57D of a nearly square shape (approximately similar to the shape of the mirror elements 16) with the respective widths on each side being, for example, d1-d4 as shown in FIG. 28B, on the entrance plane 25I by reflections from the mirror elements 16 of the SLM 14. The regions 52A-52C of the SLM 14 may be at least two and the types of the dot patterns 53A-53D or the like (the number of diameters or widths d1-d4) may be at least two types (e.g., only the dot patterns 53A and 53B).

In FIG. 25, a beam splitter BS1 is set between the first lens 22a and the second lens 22b of the relay optical system 22 and a beam split from the illumination light by the beam splitter BS1 is incident to a light receiving surface of a two-dimensional imaging device 24 of a CCD or CMOS type through a condensing lens 23. An imaging signal of the imaging device 24 is supplied to a characteristic measuring unit in the illumination control unit 36. The light receiving surface HP1 of the imaging device 24 is set in conjugate with the entrance plane 25I of the micro lens array 25 by the condensing lens 23. In other words, the light receiving surface of the imaging device 24 is also a surface substantially equivalent to the illumination pupil plane IPP and a light quantity distribution approximately similar to the light quantity distribution on the illumination pupil plane IPP is formed on the light receiving surface of the imaging device 24. The characteristic measuring unit in the illumination control unit 36 can measure the light quantity distribution (pupil shape) on the illumination pupil plane IPP from the detected signal by the imaging device 24.

It is noted that a monitor device for measuring the pupil shape of the illumination optical system ILS may be set on the reticle stage RST or on the wafer stage WST. The illumination light IL from the surface illuminant formed on the illumination pupil plane IPP travels via a first relay lens 28, a reticle blind (fixed field stop or variable field stop) 29, a second relay lens 30, an optical path bending mirror 31, and a condenser optical system 32 to illuminate, for example, an illumination region oblong in the X-direction on the reticle surface Ra, in a homogenous illuminance distribution. The illumination optical system ILS is constructed including the optical members from the beam expander 11 to the divergence angle varying unit 18, the relay optical system 13, the SLM 14, the optical members from the incidence optical system 21 to the micro lens array 25, and the optical system from the illumination aperture stop 26 to the condenser optical system 32. Each optical member of the illumination optical system ILS is supported on an unshown frame.

Furthermore, connected to the main control system 35 are an input/output device 34 for exchanging information such as the illumination condition for the reticle R, for example, with a host computer (not shown), an arithmetic unit 40 for determining the inclination angles of the respective mirror elements 16 of the SLM for obtaining a target light quantity distribution and the types of DOEs to be selected from the diffractive optical element groups 19A-19C, and the storage unit 39. The arithmetic unit 40 may be a function on software of a computer forming the main control system 35. An illumination device 8 is constructed including the light source 10, illumination optical system ILS, input/output device 34, illumination control unit 36, arithmetic unit 40, and storage unit 39.

Under the illumination light IL from the illumination optical system ILS, a pattern in the illumination region on the reticle R is projected at a predetermined projection magnification (e.g., ¼, ⅕, and so on) to an exposure region of one shot area on the wafer W, through the projection optical system PL telecentric on both sides (or only on one side, i.e., on the wafer side). The illumination pupil plane IPP is conjugate with a pupil plane of the projection optical system PL (plane conjugate with the exit pupil) and an aperture stop AS is set on the pupil plane of the projection optical system PL. The wafer W embraces one in which a surface of a base material of silicon or the like is coated with a photoresist (photosensitive material) in a predetermined thickness.

Furthermore, the reticle R is held as stuck on the top face of the reticle stage RST and the reticle stage RST is mounted so as to be movable at a constant speed in the Y-direction and movable at least in the X-direction, the Y-direction, and the θz direction, on a top face of an unshown reticle base (plane parallel to the XY plane). A two-dimensional position of the reticle stage RST is measured by an unshown laser interferometer and, based on this measurement information, the main control system 35 controls the position and speed of the reticle stage RST through a drive system 37 including a linear motor or the like.

On the other hand, the wafer W is held as stuck on the top face of the wafer stage WST through a wafer holder (not shown) and the wafer stage WST is movable in the X-direction and the Y-direction and movable at a constant speed in the Y-direction on a top surface of an unshown wafer base (plane parallel to the XY plane). A two-dimensional position of the wafer stage WST is measured by an unshown laser interferometer or encoder and, based on this measurement information, the main control system 35 controls the position and speed of the wafer stage WST through a drive system 38 including a linear motor or the like. It is noted that the apparatus is also provided with an alignment system (not shown) for performing alignment between the reticle R and the wafer W.

As a basic operation in exposure of the wafer W by the exposure apparatus EX, the main control system 35 reads an illumination condition for the reticle R from the exposure data file and sets the read illumination condition in the illumination control unit 36. Subsequently, the wafer W is moved to a scan start position with movement (step movement) of the wafer stage WST. Thereafter, emission of light from the light source 10 is started and, while the wafer W is exposed with an image of the pattern of the reticle R by the projection optical system PL, the reticle R and the wafer W are moved in synchronism at a speed ratio of the projection magnification through the reticle stage RST and the wafer stage WST, thereby implementing scanning exposure in one shot area on the wafer W with the pattern image of the reticle R. By step-and-scan operation to repeat the step movement and the scanning exposure of the wafer W as described above, all the shot areas on the wafer W are exposed with the image of the pattern of the reticle R under the optimal illumination condition.

Figure 29:
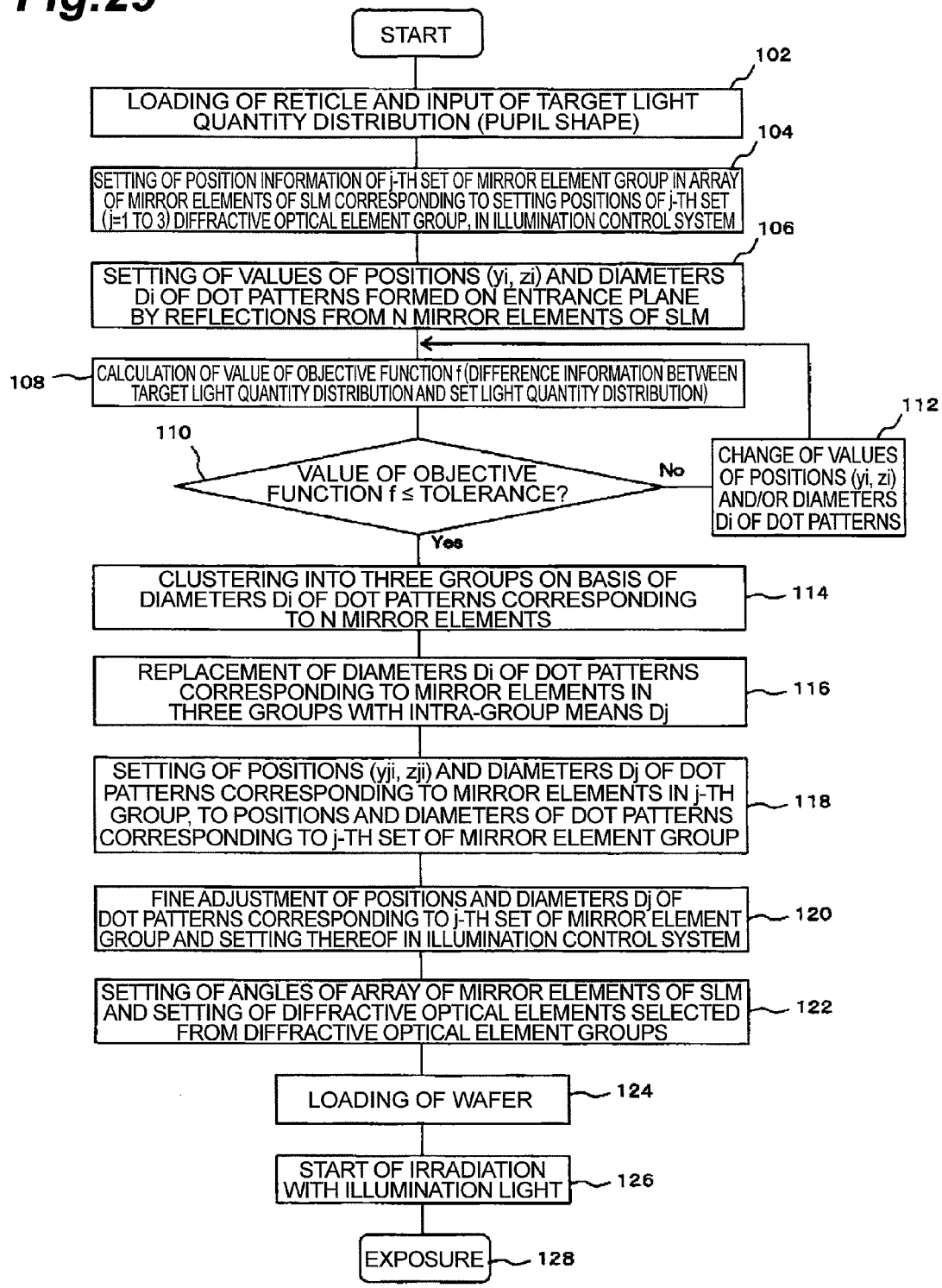
FIG. 29 is a flowchart showing an example of an operation of performing exposure with the pupil shape being set to a target shape.

Next, an example of an operation for setting the light quantity distribution (pupil shape) optimized for the reticle R on the illumination pupil plane IPP (entrance plane 25I), in the exposure apparatus EX will be described with reference to the flowchart of FIG. 29. This operation is controlled by the main control system 35. First, in step 102 of FIG. 29, the reticle R is loaded on the reticle stage RST in FIG. 25 and the input/output device 34 implements input of information of the light quantity distribution (target light quantity distribution) on the illumination pupil plane (or on the entrance plane 25I) computationally-optimized for the device pattern formed on the reticle R, into the arithmetic unit 40 through the main control system 35. The input information is also recorded in the exposure date file in the storage unit 39. Here, when a large number of grid points arrayed at pitches Δy and Δz in the Y-direction and in the Z-direction are set in the effective area surrounded by the circumference 54 where the σ value is 1 on the illumination pupil plane IPP in FIG. 26B, coordinates (ym, zn) in the Y-direction and the Z-direction of the n-th grip point at the m-th position in the Y-direction and at the n-th position in the Z-direction with respect to a predetermined origin (ya, za) are expressed as given below. It is noted that in the second embodiment the pitches Δy and Δz are equal but they may be different. Furthermore, the pitches Δy, Δz are set smaller than the diameter d1 of the minimum dot pattern 53A in FIG. 28A.

$$ym = ya + m\Delta y, \text{ where } m=0 \text{ to } M1 \quad (2A)$$

$$zn = za + n\Delta z, \text{ where } n=0 \text{ to } M2 \quad (2B)$$

M1 and M2 in these equations are integers larger than the number of the mirror elements 16 arrayed in the SLM 14. At this time, the target light quantity distribution is expressed as a set of light intensities TE(ym, zn) at all the grid points at the coordinates (ym, zn) in the effective area on the illumination pupil plane IPP as an example. As an example, the light intensities TE(ym, zn) are normalized so that an integrated value thereof in the effective area becomes 1. The target light quantity distribution is assumed to be, for example, the light quantity distribution 55 in FIG. 26B. The light quantity distribution 55 is also shown by dotted lines in FIG. 30A and FIG. 30B described below.

In the second embodiment, where the grid points at the coordinates (ym, zn) are regarded as pixels, the target light quantity distribution expressed by the light intensities TE(ym, zn) can also be regarded as a target image. In next step 104, the main control system 35 reads the position information (the numbers N1, N2, and N of the positions PN1, PN2, and PN) of the groups of the j-th sets (j=1, 2, and 3) of mirror elements 16 in the array regions 52A, 52B, and 52C of the SLM 14 in FIG. 28A from the exposure data file stored in the storage unit 39, for example, and sets the read position information in the controller of the illumination control unit 36. The main control unit 35 sets information of the numbers N1, N2, and N, the coordinates (ym, zn) on the illumination pupil plane IPP in Equations (2A), (2B), the diameters d1-d4 of the dot patterns 53A-53D formed by reflections from the mirror elements 16, and average light intensities in the dot patterns 53A-53D (or relative values thereof) in the arithmetic unit 40 as well.

In next step 106, the arithmetic unit 40 virtually sets center positions (yi, zi) and diameters Di (i=1 to N) of dot patterns to be formed on the entrance plane 25I (and in turn on the illumination pupil plane IPP) by reflections from the N mirror elements 16 of the SLM 14, to predetermined initial values. Values of the center positions (yi, zi) are set to any of the coordinates (ym, zn) (m=0 to M1, n=0 to M2) of the grid points in the effective area represented by Equations (2A), (2B) and the diameters Di are set to any of the diameters d1 to d4. In fact, the diameters of the dot patterns formed by reflections from the respective mirror elements 16 in the array regions 52A-52C of the SLM 14 are common, but it is assumed in this step 106 that the diameters Di of the dot patterns formed by reflections from all the mirror elements 16 of the SLM 14 are set to arbitrary values in a variable range (from d1 to d4 herein) independently of each other. The initial values of them may be an arbitrary combination in the variable range. It is noted that at this stage, the first to N-th dot patterns may be stored simply in correspondence to the first to N-th mirror elements 16 of the SLM 14, respectively.

In next step 108, the arithmetic unit 40 calculates light intensities D1E(ym, zn) (set light quantity distribution) of all the grid points represented by the coordinates (ym, zn) in the effective area of the entrance plane 25I, from the center positions (yi, zi) and the diameters Di of the N dot patterns set in step 106. The light intensities D1E(ym, zn) are also normalized so that an integrated value thereof in the effective area becomes 1. In the second embodiment, as an example, an objective function f having difference information between the light intensities TE(ym, zn) (target light quantity distribution) and the light intensities D1E(ym, zn) (set light quantity distribution) is defined as follows.

$$f=\Sigma\Sigma\{TE(ym,zn)-D1E(ym,zn)\}^2 \qquad (3)$$

The additions about the integers m, n in Equation (3) are carried out over all the grid points in the effective area of the entrance plane 25I (illumination pupil plane IPP). It is noted that the objective function f may be defined as a square root of the right-hand side of Equation (3) or the like. In next step 110, the arithmetic unit 40 determines whether the objective function f calculated from Equation (3) is not more than a predetermined tolerance. The tolerance is preliminarily set in the arithmetic unit 40, for example, from the input/output device 34 through the main control system 35. When the objective function f is larger than the tolerance, the operation shifts to step 112, where the arithmetic unit 40 changes the center positions (yi, zi) and/or the diameters Di (i=1 to N) of the N dot patterns set in step 106 (or in preceding step 112). In this step 112, it is also assumed that the diameters Di of the dot patterns formed by reflections from all the mirror elements 16 of the SLM 14 can be set to arbitrary values in the variable range (from d1 to d4 herein) independently of each other.

Thereafter, the operation moves to step 108, where the arithmetic unit 40 calculates the light intensities D1E(ym, zn) (set light quantity distribution) of all the grid points in the effective area of the entrance plane 25I, from the center positions (yi, zi) and the diameters Di of the N dot patterns changed in step 112, and then calculates the objective function f from Equation (3). In next step 110, the arithmetic unit 40 determines whether the calculated objective function f is not more than the aforementioned tolerance. When the objective function f is larger than the tolerance, the operation in steps 112, 108, and 110 is further repeated. On the other hand, when in step 110 the objective function f is not more than the tolerance, i.e., when the set light quantity distribution becomes approximately equal to the target light quantity distribution, the operation moves to step 114.

Figure 30A:
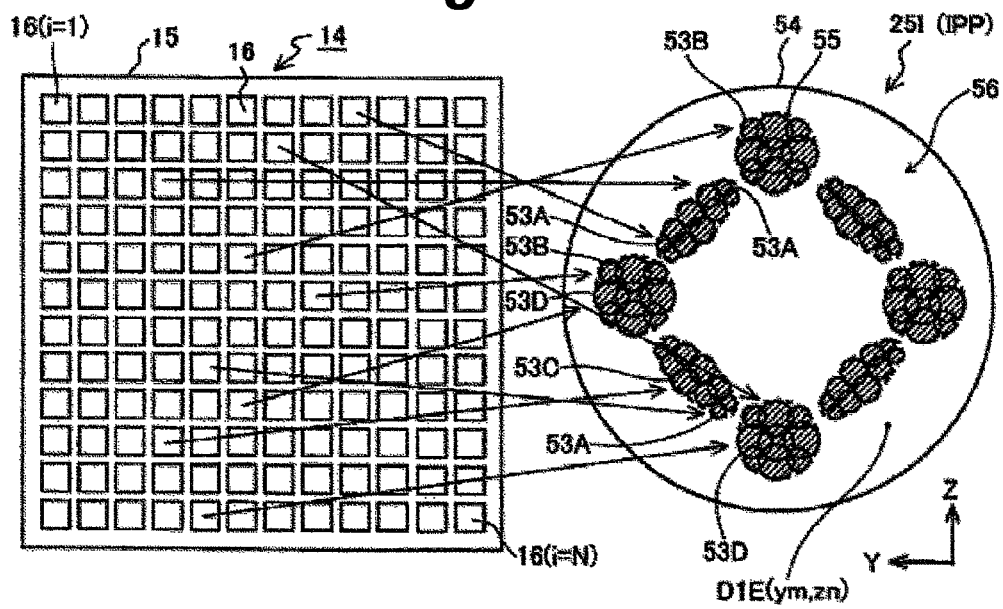
FIG. 30A is a drawing showing an example of a light quantity distribution formed on the entrance plane (illumination pupil plane), with relaxation of a condition about the diameters of the dot patterns formed by reflections from the array of mirror elements, and FIG. 30B a drawing showing an example of a light quantity distribution formed on the entrance plane (illumination pupil plane) with clustering of the dot patterns in FIG. 30A into three groups.
Figure 30B:
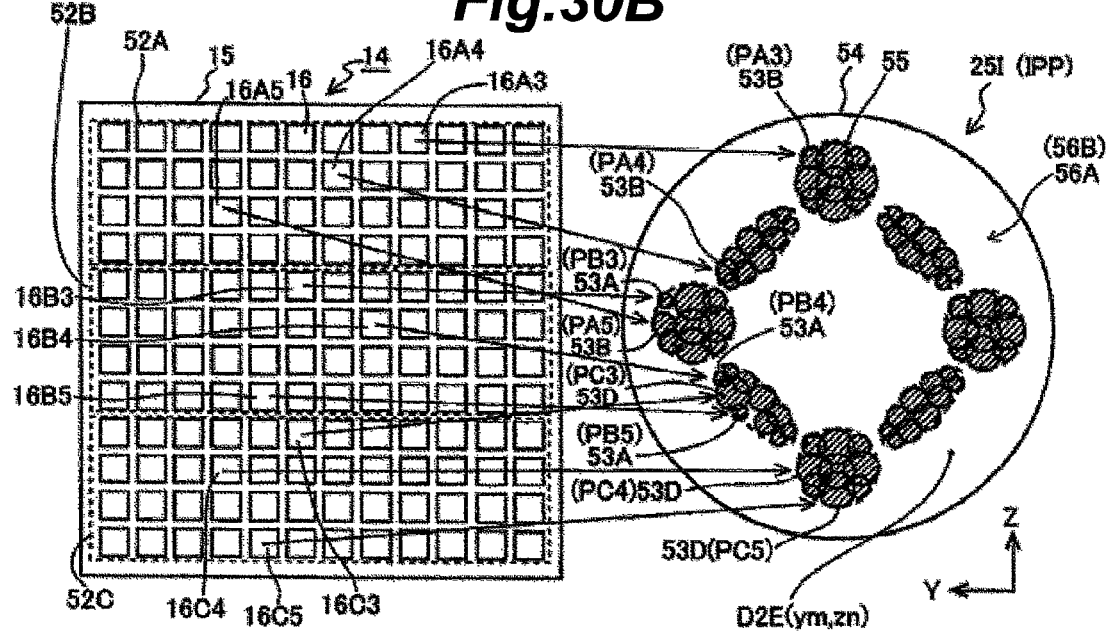

The set of light intensities D1E(ym, zn) of the grid points at the respective coordinates (ym, zn) in the effective area on the entrance plane 25I (illumination pupil plane IPP) in FIG. 30A, which has been obtained when the objective function f became not more than the tolerance in step 110, is defined as a first set light quantity distribution 56. The light quantity distributions of FIG. 30A and FIG. 30B are distributions virtually calculated by the arithmetic unit 40. In FIG. 30A, each mirror element 16 of SLM 14 can form any dot pattern out of the dot patterns 53A-53D with the diameters d1-d4 on the entrance plane 25I by its reflection.

Figure 31A:
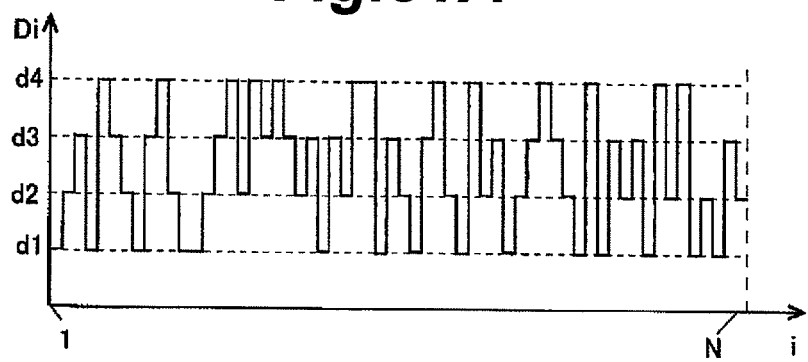
FIG. 31A is a drawing showing an example of a distribution of diameters d of dot patterns from N mirror elements, which is obtained with relaxation of the condition about the diameters of the dot patterns, FIG. 31B a drawing showing a state of clustering of the diameter distribution of the dot patterns in FIG. 31A into three groups, and FIG. 31C a drawing showing a state in which the diameters of dot patterns in the three groups in FIG. 31B are set to the same values.

FIG. 31A is a drawing concerning all (N) dot patterns forming the first set light quantity distribution 56 in FIG. 30A, which shows a collection of their diameters Di and array numbers i (i=1 to N) of the mirror elements 16 of the SLM 14 corresponding to them. Depending upon the array number i of each mirror element 16, the center position (yi, zi) (any of the coordinates (ym, zn)) of a corresponding dot pattern on the entrance plane 25I is specified. Then, in step 114, the arithmetic unit 40 performs clustering to partition the N dot patterns forming the first set light quantity distribution 56, into three groups each of which includes the same number of dot patterns as the number of mirror elements 16 in the three array regions 52A, 52B, and 52C of the SLM 14 in FIG. 28A, for example, so as to minimize the sum of discrepancies of the diameters Di. The clustering to be adopted in this case can be, for example, the K-means clustering (partitional optimization method) which is one of non-hierarchical clustering techniques. The clustering is performed, for example, in such a manner that evaluation functions of the respective groups are defined as square sums of differences between centroids (or modes or the like) of the diameters Di in the three groups and the diameters of the respective dot patterns in the groups and that the sum of these three evaluation functions becomes minimum. By the clustering, the dot patterns can be readily and accurately partitioned into three groups.

Figure 31B:

FIG. 31B shows an example of the result of the clustering to partition the diameters Di of the N dot patterns in FIG. 31A into first, second, and third groups 52D, 52E, and 52F. In FIG. 31B, values I1-I2, I3-I4, and I5-I6 of number i on the horizontal axis of the respective groups 52D, 52E, and 52F indicate ranges of array numbers of the mirror elements 16 of the SLM 14 corresponding to the dot patterns belonging to the respective groups 52D, 52E, and 52F. The center positions (yi, zi) on the entrance plane 25I of the corresponding dot patterns are specified by the values I1-I2 and others of the array numbers of the mirror elements 16. In this example, the highest-frequency values of the diameters Di of the dot patterns belonging to the groups 52D, 52E, and 52F are d2, d1, and d4, respectively.

Figure 31C:
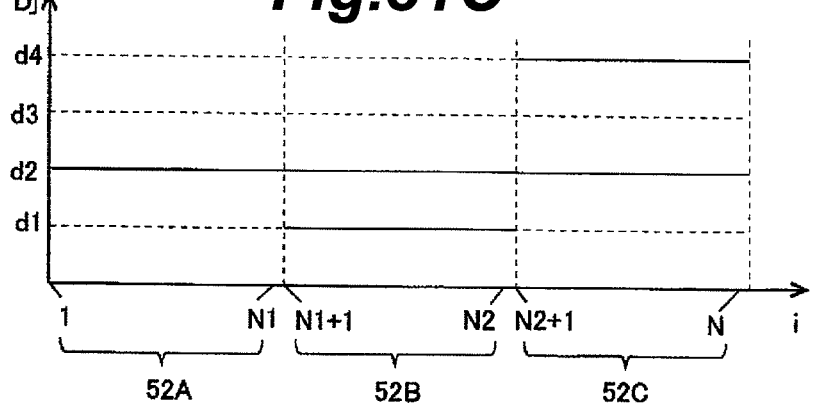

In step 114, the dot patterns may be partitioned into the three groups 52D, 52E, and 52F by a technique except for the clustering, e.g., by a technique of simply partitioning the image (set light quantity distribution) into three groups. In next step 116, the arithmetic unit 40 replaces the diameters Di of the dot patterns belonging to the three groups 52D, 52E, and 52F, with intra-group means Dj (j=1, 2, and 3). As an example, the intra-group means Dj are the modes of the diameters Di in the respective groups. As a result, the common diameters Dj in the respective groups 52D, 52E, and 52F in FIG. 31B are d2, d1, and d4 shown in FIG. 31C. It is noted that the array number i on the horizontal axis in FIG. 31C represents the array numbers of the first to N-th mirror elements 16 of the SLM 14 in FIG. 28A.

When in the first set light quantity distribution 56 in FIG. 30A the diameters Di of the dot patterns belonging to the groups 52D, 52E, and 52F are replaced by the common diameters Dj, a second set light quantity distribution 56A in FIG. 30B is obtained. In next step 118, the arithmetic unit 40 sets the center positions (yji, zji) and the common diameter Dj of the dot patterns belonging to the j-th (j=1, 2, or 3) group 52D, 52E, or 52F in FIG. 31B (the dot patterns corresponding to the I1-th to I2-th, I3-th to I4-th, or I5-th to I6-th mirror elements 16), to the center positions (yji, zji) and common diameter Dj of the dot patterns formed on the entrance plane 25I by reflections from the mirror elements 16 in the j-th array region 52A, 52B, or 52C (the mirror element group of the j-th set) of the SLM 14 in FIG. 30B (or FIG. 28A). This means that on the horizontal axis (the array number i of the mirror elements 16) in FIG. 31C, the region corresponding to the j-th group 52D, 52E, or 52F of FIG. 31B is regarded as the j-th array region 52A, 52B, or 52C.

In this case, in FIG. 30B, the diameters of the dot patterns 53B formed at the positions PA3-PA5 on the entrance plane 25I (and in turn on the illumination pupil plane IPP, the same also applies to the description hereinafter) by the illumination light beams reflected by the mirror elements 16A3-16A5 in the first array region 52A of the SLM 14 are d2 in common; the diameters of the dot patterns 53A formed at the positions PB3-PB5 on the entrance plane 25I by the illumination light beams reflected by the mirror elements 16B3-16B5 in the second array region 52B are d1 in common; the diameters of the dot patterns 53D formed at the positions PC3-PC5 on the entrance plane 25I by the illumination light beams reflected by the mirror elements 16C3-16C5 in the third array region 52C are d4 in common. In the second embodiment, the center positions (yji, zji) of the dot patterns can be set by the inclination angles about the two axes of the corresponding mirror elements 16 and the common diameters Dj (d1-d4) can be set by the divergence angle varying unit 18.

In next step 120, the arithmetic unit 40 calculates light intensities D2E(ym, zn) of the respective grid points at the coordinates (ym, zn) in the second set light quantity distribution 56A in FIG. 30B. Furthermore, it calculates the objective function f1 by replacing the light intensities D1E(ym, zn) in Equation (3) with the light intensities D2E(ym, zn). Then, using as initial values the center positions (yji, zji) and diameters Dj (j=1 to 3) of the dot patterns formed on the entrance plane 25I by the respective mirror elements 16 in the j-th (j=1 to 3) array regions 52A-52C set in step 118, the values of the center positions (yji, zji) and diameters Dj (j=1 to 3) of the dot patterns are finely adjusted so as to make the objective function f1 smaller. On this occasion, the diameters Dj of the dot patterns corresponding to the mirror elements 16 in the respective array regions 52A-52C can be adjusted in common only among d1 to d4. The light quantity distribution set on the entrance plane 25I in this manner is defined as a third set light quantity distribution 56B.

By this step 120, the light quantity distribution formed on the entrance plane 25I can be made closer to the target light quantity distribution. It is noted that this step 120 can be omitted. In next step 122, the arithmetic unit 40 records the values of the center positions (yji, zji) and the common diameters Dj of the dot patterns corresponding to the mirror elements 16 in the respective array regions 52A-52C of the SLM 14 determined in step 120 (information of the optimized illumination condition) into the exposure data file in the storage unit 39 through the main control system 35. Since the relationship between the inclination angles about the two axes in each mirror element 16 and the center positions (yji, zji) on the entrance plane 25I of the corresponding dot patterns is known and the values (d1-d4) of the common diameters Dj correspond to the DOEs 19A1-19A3 and others in FIG. 27, the inclination angles about the two axes of the mirror elements 16 in the respective array regions 52A-52C and the types (including transparency) of the DOEs 19A1-19A3 and others set in the regions 51A-51C corresponding to the array regions 52A-52C may be used as the information of the optimized illumination condition. The information of the optimized illumination condition is also supplied to the controller in the illumination control unit 36.

The controller in the illumination control unit 36 sets the inclination angles about the two axes of the respective mirror elements 16 in the array regions 52A-52C of the SLM 14 to the optimized illumination condition through the SLM control system 17 and arranges the DOEs (including transparency) in the diffractive optical element groups 19A-19C according to the diameters Dj of the optimized dot patterns in the regions 51A-51C corresponding to the array regions 52A-52C, through the drive mechanism 20. By this, the illumination condition of the illumination optical system ILS is optimized for the pattern of the reticle R.

In next step 124 an unexposed wafer W is loaded on the wafer stage WST; in next step 126 the irradiation of the illumination light IL from the light source 10 is started; in step 128 the exposure of the wafer W is carried out. On this occasion, since the illumination condition is optimized for the reticle R, the image of the pattern of the reticle R can be highly accurately projected to each shot area on the wafer W by the exposure. In addition, before the exposure is started in step 128, the characteristic measuring unit in the illumination control unit 36 may measure the light quantity distribution on the entrance plane 25I (illumination pupil plane IPP) while taking in the imaging signal of the imaging element 24. If it is found by the result of this measurement that the difference between the set light quantity distribution and the target light quantity distribution (or difference in a specific portion) exceeds a predetermined tolerance range, the controller in the illumination control unit 36 may adjust the inclination angles about the two axes of the respective mirror elements 16, for example, so as to finely adjust the positions of the dot patterns from the respective mirror elements 16 in the array regions 52A-52C of the SLM 14. Furthermore, the types of DOEs set in the regions 51A-51C may be changed for the respective array regions 52A-52C as occasion demands, thereby to adjust the diameters of the dot patterns for the respective array regions 52A-52C. This allows, for example, the illumination condition to be optimized in real time and the exposure to be performed with high accuracy, for example, even in the case where the pupil shape is changed by irradiation energy of the illumination light IL.

The effects and others of the second embodiment are as described below.

The exposure apparatus EX of the second embodiment is provided with the illumination device 8 for irradiating the reticle surface Ra (illumination target surface) with the light through the plurality of mirror elements 16 (optical elements) of the SLM 14. Furthermore, the method for forming the light quantity distribution as an image on the illumination pupil plane IPP by the illumination device 8 can also be regarded as an image forming method. This light quantity distribution forming method (image forming method) has: step 102 of setting the target light quantity distribution 55 (target image) on the illumination pupil plane IPP; and steps 106 to 112 of, concerning the N (N is an integer two or more orders of magnitude greater than K) dot patterns 53A and others (local regions) the respective positions of which can be controlled on the illumination pupil plane IPP and which are partitioned into three groups (in the case of K=3) for each of which the diameter as an example of the states of the dot patterns can be controlled, changing the N values (yi, zi) of the positions (center positions) and the N values Di of the diameters thereof on the illumination pupil plane IPP and determining the N first values (yi, zi) of the positions and the N values Di of the diameters so as to make smaller the value of the objective function f corresponding to the error between the first set light quantity distribution 56 (first image) obtained by arranging the N dot patterns 53A and others on the illumination pupil plane IPP, and the target light quantity distribution. Furthermore, the light quantity distribution forming method (image forming method) includes steps 114, 116 of determining the second values Dj of the diameters and the second values (yji, zji) of the positions for the three respective groups from the N values Di of the diameters.

Furthermore, the illumination device 8 is provided with the input/output device 34 for implementing the input of information of the target light quantity distribution (target image) on the illumination pupil plane IPP; the SLM 14 with the N mirror elements 16 which guide the light from the light source 10 to the respective dot patterns 53A and others (local regions) at positions variable on the illumination pupil plane IPP and which can be divided into the mirror element groups in the three (K=3) array regions 52A-52C; the three diffractive optical element groups 19A-19C (filter portions) for controlling the diameters of the dot patterns 53A and others in the three groups guided to the illumination pupil plane IPP by the three mirror element groups, group by group; the arithmetic unit 40 for determining the N first values of the positions and the N values Di of the diameters of the dot patterns 53A and others, depending on the error between the first set light quantity distribution (first image) obtained by arranging the N dot patterns 53A and others, and the target light quantity distribution, partitioning the N dot patterns into the three groups 52D-52F according to the N values of the diameters Di, and determining the common values Dj as values of the diameters Di for the three respective groups; and the condenser optical system 32 for illuminating the reticle surface Ra with the light from the second set light quantity distribution formed on the illumination pupil plane IPP while setting the positions of the corresponding dot patterns for the three respective mirror element groups and setting the diameters to Dj.

Since in the second embodiment the diameters as the variables about the states of the dot patterns can be controlled group by group for the three groups corresponding to the array regions 52A-52C, the number of values of the diameters is three (in the case of K=3), but if the number of values of the diameters is set to three from the beginning there is a possibility that the values of the diameters have little variation from the initial values, for example. Then, in steps 106 and 112, the condition is relaxed by setting the number of values of the diameters to N larger than three and three values are determined from the N values, so as to allow efficient and accurate determination of the values of the diameters, whereby the light quantity distribution (image) close to the target light quantity distribution (target image) can be set on the illumination pupil plane IPP.

In the second embodiment, steps 106 and 112 are arranged to set the number of values of the diameters of the dot patterns to the same N as the number of mirror elements 16, but the number of values of the diameters of the dot patterns may be set to N1 (N1 is an integer not more than N and larger than K). This means, for example, that the array of mirror elements 16 is divided approximately into N/2 groups and the diameters of the dot patterns corresponding to the mirror elements 16 in the respective groups are set to common values (d1-d4).

The illumination method of the second embodiment has: forming the light quantity distribution of the light from the light source 10 based on the target light quantity distribution, on the illumination pupil plane IPP with the use of the light quantity distribution forming method (image forming method) by the illumination device 8 of the second embodiment; and guiding the light from the illumination pupil plane IPP through the condenser optical system 32 to the reticle surface Ra. Furthermore, the exposure method of the second embodiment uses the foregoing illumination method.

Furthermore, the exposure apparatus EX of the second embodiment is the exposure apparatus for illuminating the pattern of the reticle R with the illumination light IL for exposure and implementing the exposure of the wafer W (substrate) with the illumination light IL via the pattern and the projection optical system PL, which is provided with the illumination device 8 of the second embodiment and which is configured so that the pattern is illuminated with the illumination light IL by the illumination device 8. Since the second embodiment allows the pattern of the reticle R to be illuminated readily under the optimized illumination condition, the wafer W can be exposed with the image of the pattern of the reticle R with high accuracy.

The foregoing second embodiment uses the SLM 14 in which the inclination angles about the two orthogonal axes of the mirror elements 16 can be controlled for setting the light intensity distribution (light quantity distribution) on the entrance plane 25I or on the illumination pupil plane IPP. However, the second embodiment is also applicable to a case where the spatial light modulator with an array of mirror elements a position in a normal direction to a reflective face of each of which can be controlled is used instead of the SLM 14. Furthermore, the second embodiment is also applicable to a case where, for example, an arbitrary light modulator with a plurality of optical elements a state (reflection angle, refraction angle, transmittance, or the like) of incident light to each of which can be controlled is used instead of the SLM 14.

In the aforementioned second embodiment, the diameters (or widths) of the dot patterns are used as the variables about the states of the respective groups of dot patterns. However, light quantities may be used as the variables about the states. In this case, we can use optical member groups in each of which a plurality of ND filters with different light transmittances are coupled, instead of the diffractive optical element groups 19A-19C. Furthermore, the apparatus may be configured to simultaneously adjust the diameters and light quantities of the dot patterns. In the second embodiment, the divergence angle varying unit 18 was configured with the diffractive optical element groups 19A-19C, but the divergence angle varying unit 18 can also be configured by use of an array of refractive optical elements such as a micro lens array or an array of reflective optical elements such as a mirror array, instead of the diffractive optical elements.

Furthermore, in the foregoing second embodiment, the setting surface of the diffractive optical element groups of the divergence angle varying unit 18 and the average arrangement surface of the array of mirror elements 16 were approximately conjugate with respect to the relay optical system 13, but the setting surface of the diffractive optical element groups of the divergence angle varying unit 18 may be located at a position off the plane conjugate with the average arrangement surface of the array of mirror elements 16 with respect to the relay optical system 13. For example, in the example of FIG. 25, the divergence angle varying unit 18 may be arranged in the optical path between the relay optical system 13 and the array of mirror elements 16.

Figure 32:
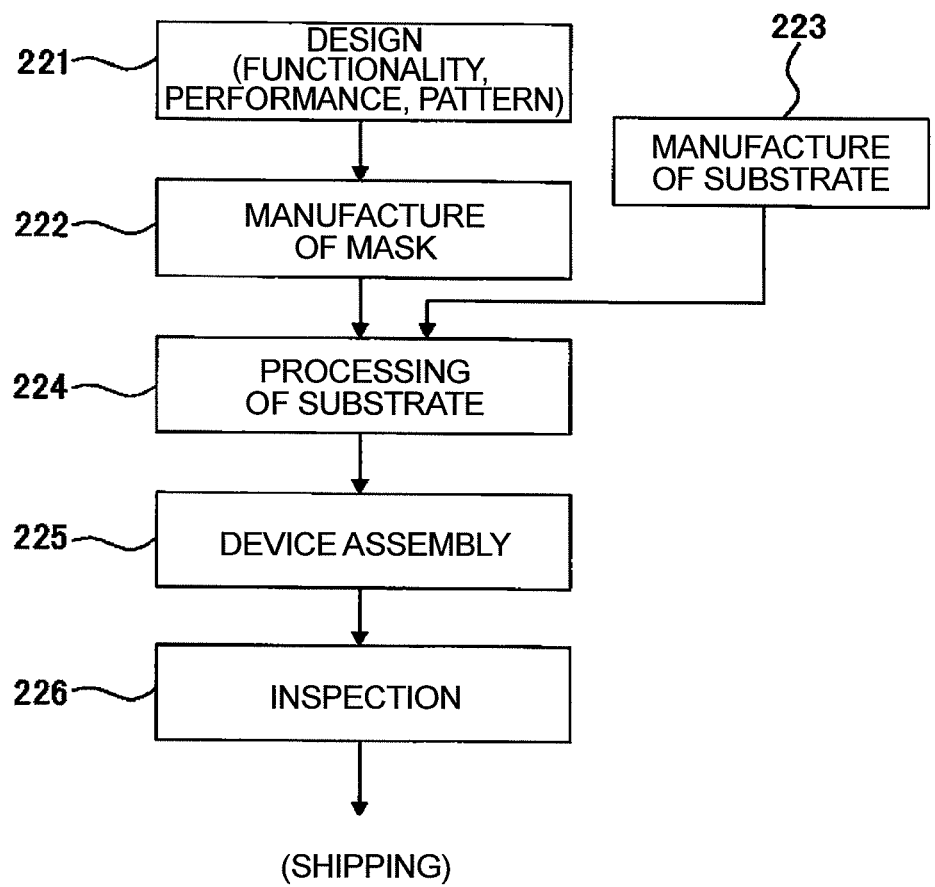
FIG. 32 is a flowchart showing an example of manufacturing steps of electronic devices.

Furthermore, the above second embodiment uses the micro lens array 25 which is the wavefront division type integrator in FIG. 25, as an optical integrator. However, the optical integrator to be used may be a rod type integrator as an internal reflection type optical integrator. Moreover, in manufacture of electronic devices (micro devices) such as semiconductor devices by use of the exposure apparatus EX or the exposure method in the above second embodiment, the electronic devices are manufactured, as shown in FIG. 32, through step 221 of performing design of functions and performance of devices, step 222 of manufacturing a mask (reticle) based on the foregoing design step, step 223 of manufacturing a substrate (wafer) as a base material of devices, substrate processing step 224 including a step of exposing the substrate with a pattern of the mask by the exposure apparatus EX or the exposure method of the aforementioned second embodiment, a step of developing the exposed substrate, and heating (curing) and etching steps of the developed substrate, device assembly step (including processing processes such as dicing step, bonding step, and packaging step) 225, inspection step 226, and so on.

In other words, the above device manufacturing method includes the step of exposing the substrate (wafer W) through the pattern of the mask, using the exposure apparatus EX or the exposure method of the above second embodiment, and the step of processing the exposed substrate (i.e., the development step of developing the resist on the substrate to form a mask layer corresponding to the pattern of the mask on the surface of the substrate, and the processing step of processing (heating and etching or the like) the surface of the substrate through the mask layer).

Since this device manufacturing method can implement highly accurate exposure with the pattern of the reticle, it can implement highly accurate manufacture of electronic devices. It is noted that the present invention can also be applied to the liquid immersion type exposure apparatus, for example, as disclosed in U.S. Pat. Published Application No. 2007/242247 or in European Patent Application Publication EP 1420298. Furthermore, the present invention can also be applied to the stepper type exposure apparatus.

The present invention is not limited to the application to the manufacturing processes of semiconductor devices, but can also be generally applied, for example, to manufacturing processes of liquid crystal display devices, plasma displays, etc. and to manufacturing processes of various devices (electronic devices) such as imaging devices (CMOS type, CCD, etc.), micro machines, MEMS (Microelectromechanical Systems), thin film magnetic heads, and DNA chips.

As described above, the present invention can be carried out in a variety of configurations without departing from the spirit and scope of the present invention, while not having to be limited to the above second embodiment.

REFERENCE SIGNS LIST

1 beam sending unit
2 light intensity homogenizing member
3 diffractive optical element (divergence angle providing member)
4 reimaging optical system
5 spatial light modulator
6 half wave plate (polarizing member)
7 relay optical system
8A micro fly's eye lens (optical integrator)
9 polarization conversion unit
10A condenser optical system
11A mask blind
12A imaging optical system
LS light source
DTr, DTw pupil intensity distribution measuring units
CR control system
M mask
MS mask stage
PL projection optical system
W wafer
WS wafer stage

The invention claimed is:

1. An illumination optical system which illuminates an illumination target surface with light, the illumination optical system comprising:
a spatial light modulator having a plurality of optical elements arrayed on a predetermined surface and individually controlled, the spatial light modulator being configured to variably form a light intensity distribution on an illumination pupil of the illumination optical system;
a divergence angle providing member arranged in a conjugate space in which a surface optically conjugate with the predetermined surface is disposed, the divergence angle providing member being configured to provide a divergence angle to an incident beam and emit the beam; and
a polarizing member arranged in a predetermined space in which the predetermined surface is disposed or in the conjugate space, the polarizing member being configured to change a polarization state of a partial beam which is a part of the light.

2. The illumination optical system according to claim 1, wherein the polarizing member is arranged on a first surface which is a surface in an illumination optical path of the illumination optical system and wherein the light passing the first surface is incident to the spatial light modulator.

3. The illumination optical system according to claim 1, wherein the polarizing member is arranged on a first surface which is a surface in an illumination optical path of the illumination optical system and wherein the light passing the first surface is incident to the divergence angle providing member.

4. The illumination optical system according to claim 1, wherein the polarizing member is arranged on a surface optically conjugate with the predetermined surface.

5. The illumination optical system according to claim 1, wherein the divergence angle providing member is arranged only in a first optical path in which at least a partial beam travels, and has such a characteristic that when a parallel beam is incident thereto, the divergence angle providing member converts the incident beam into a divergent beam with a predetermined divergence angle and emits the divergent beam.

6. The illumination optical system according to claim 5, comprising an input device for implementing input of light quantity distribution information of a target image on a first surface,
wherein the spatial light modulator has N optical elements, the optical elements being configured to guide the light to respective local regions at positions variable on the first surface and capable of being divided into K optical element groups, where N is an integer larger than K and K is an integer of not less than 2, and
the illumination optical system further comprises:
K filter portions configured to control variables about states of the local regions in K groups guided to the first surface by the K optical element groups, group by group;
an arithmetic unit configured to determine N first values of the positions and N1 values of the variables of the local regions, depending upon an error between a first image obtained by arranging N aforementioned local regions on the first surface and the target image, divide the N local regions into the K groups depending upon the N1 values of the variables, and determine common second values as values of the variables for the respective K groups, where N1 is an integer not more than N and larger than K; and
a condenser optical system configured to illuminate the illumination target surface with light from a light quantity distribution of a second image formed on the first surface while setting the positions of the corresponding local regions for the respective K optical elements, to the first values, and setting the variables to the second values.

7. The illumination optical system according to claim 6, wherein, for dividing the N local regions into the K groups depending upon the N1 values of the variables, the arithmetic unit is configured to implement clustering to partition the N local regions into K groups each with values of the variables having smaller discrepancies.

8. The illumination optical system according to claim 6, wherein the K filter portions are:
K filter member groups which are arranged at positions corresponding to the K optical element groups on a second surface conjugate with an average arrangement surface of the optical elements or on a plane in the vicinity thereof and in which divergence angles of light can be controlled in a plurality of stages independently of each other.

9. The illumination optical system according to claim 6, comprising a measuring device which measures a light quantity distribution of an image formed on the first surface, wherein the arithmetic unit is configured to correct the first values of the positions and the second values of the variables, based on the measurement result by the measuring device.

10. The illumination optical system according to claim 6, wherein the N1 values of the variables are N values.

11. The illumination optical system according to claim 6, wherein the optical elements are reflective elements whose inclination angles about two intersecting axes can be controlled.

12. The illumination optical system according to claim 1, wherein the divergence angle providing member comprises: a first region having such a characteristic that when a parallel beam is incident thereto, the first region converts the incident beam into a first divergent beam with a first divergence angle and emits the first divergent beam; and a second region having such a characteristic that when a parallel beam is incident thereto, the second region converts the incident beam into a second divergent beam with a second divergence angle and emits the second divergent beam.

13. The illumination optical system according to claim 12, comprising a light intensity distribution setting unit arranged in an optical path on the entrance side of the divergence angle providing member, the light intensity distribution setting unit being configured to set a light intensity distribution in which an intensity of light incident to the second region is higher than an intensity of light incident to the first region.

14. The illumination optical system according to claim 1, wherein a plurality of beams with mutually different divergence angles are emitted from the divergence angle providing member and wherein the plurality of beams with the different divergence angles pass at mutually different positions on a plane crossing the optical axis of the illumination optical system.

15. The illumination optical system according to claim 1, wherein the divergence angle providing member is interchangeable with another divergence angle providing member with a different characteristic.

16. The illumination optical system according to claim 15, wherein a first divergence angle distribution which is defined as a distribution on a plane crossing the optical axis of the illumination optical system, of divergence angles of beams emitted from the divergence angle providing member with incidence of a parallel beam to the divergence angle providing member and a second divergence angle distribution which is defined as a distribution on the plane crossing the optical axis of the illumination optical system, of divergence angles of beams emitted from the other divergence angle providing member with incidence of a parallel beam to the other divergence angle providing member are distributions different from each other.

17. The illumination optical system according to claim 1, wherein the polarizing member has: a first polarizing element configured to change a first beam incident thereto into light in a first polarization state; and a second polarizing element configured to change a second beam incident thereto into light in a second polarization state, and
wherein the second beam is parallel to the first beam.

18. The illumination optical system according to claim 1, wherein the polarizing member is configured to provide a phase difference between a first polarization component of an incident beam and a second polarization component thereof in a polarization state different from that of the first polarization component.

19. The illumination optical system according to claim 1, wherein the polarizing member has a wave plate arranged only in a first optical path in which the partial beam travels.

20. The illumination optical system according to claim 1, wherein the polarizing member has an azimuth rotator arranged only in a first optical path in which the partial beam travels.

21. The illumination optical system according to claim 1, comprising an optical integrator,
wherein the polarizing member is arranged in an optical path on an incidence side of the optical integrator.

22. The illumination optical system according to claim 1, comprising a light intensity homogenizing member arranged on a second predetermined surface in an optical path on the entrance side of the spatial light modulator, the light intensity homogenizing member being configured to make homogeneity in the predetermined surface of an intensity distribution of light incident to the predetermined surface higher than homogeneity in the second predetermined surface of an intensity distribution of light incident to the second predetermined surface.

23. The illumination optical system according to claim 22, wherein the light intensity homogenizing member has: a wavefront division element for implementing wavefront division of an incident beam into a plurality of beams; and a relay optical system which superimposes the plurality of beams resulting from the wavefront division by the wavefront division element, on the predetermined surface.

24. The illumination optical system according to claim 23, wherein the wavefront division element is arranged at a front focal position of the relay optical system and wherein a rear focal position of the relay optical system is located at the predetermined surface.

25. The illumination optical system according to claim 23, comprising a beam detection unit which detects at least one of a position in a plane crossing the optical path of the light incident to the predetermined surface, and an angle to the predetermined surface, of the light incident to the predetermined surface, based on light extracted from an optical path between the wavefront division element and the spatial light modulator.

26. The illumination optical system according to claim 1, comprising a polarization conversion unit arranged in the vicinity of the illumination pupil, the polarization conversion unit being configured to convert linearly-polarized incident light with a polarization direction along a predetermined direction, into circumferentially-polarized emergent light with a polarization direction along a tangent direction to a circle centered on the optical axis of the illumination optical system or into radially-polarized emergent light with a polarization direction along a radial direction of the circle.

27. The illumination optical system according to claim 26, wherein the polarization conversion unit has a polarization conversion member which is made of an optical material with optical rotatory power and which has a form in which thickness varies along a circumferential direction of the circle centered on the optical axis.

28. The illumination optical system according to claim 27, wherein the polarization conversion member has a shape in which thickness continuously varies along the circumferential direction of the circle centered on the optical axis.

29. The illumination optical system according to claim 1, wherein the spatial light modulator has a plurality of mirror elements two-dimensionally arrayed in the predetermined surface, and a drive unit for individually controlling and driving postures of the plurality of mirror elements.

30. The illumination optical system according to claim 1, comprising a distribution forming optical system arranged in an optical path between the spatial light modulator and the illumination pupil, the distribution forming optical system being configured to image a far field pattern formed in a far field by the plurality of optical elements of the spatial light modulator, on the illumination pupil.

31. The illumination optical system according to claim 30, wherein the distribution forming optical system is configured to convert a distribution of angular directions of emergent beams from the spatial light modulator into a position distribution on a cross section of an emergent beam from the distribution forming optical system.

32. The illumination optical system according to claim 30, wherein a front focal position of the distribution forming optical system is located in the predetermined space and wherein a rear focal position of the distribution forming optical system is located in a pupil space of the illumination optical system.

33. The illumination optical system according to claim 1, which is used in combination with a projection optical system which forms a surface optically conjugate with the illumination target surface, wherein the illumination pupil is a position optically conjugate with an aperture stop of the projection optical system.

34. An exposure apparatus comprising the illumination optical system according to claim 1 which illuminates a predetermined pattern, the exposure apparatus being configured to expose a photosensitive substrate with the predetermined pattern.

35. The exposure apparatus according to claim 34, comprising a projection optical system which forms an image of the predetermined pattern on the photosensitive substrate, wherein the illumination pupil is a position optically conjugate with an aperture stop of the projection optical system.

36. A device manufacturing method comprising:
performing the exposure of the photosensitive substrate with the predetermined pattern, using the exposure apparatus according to claim 34;
developing the photosensitive substrate on which the predetermined pattern has been transferred, to form a mask layer in a shape corresponding to the predetermined pattern on a surface of the photosensitive substrate; and
processing the surface of the photosensitive substrate through the mask layer.

37. An illumination optical system which illuminates an illumination target surface with light, the illumination optical system comprising:

a spatial light modulator having a plurality of optical elements arrayed on a predetermined surface and individually controlled, the spatial light modulator being configured to form a light intensity distribution on an illumination pupil of the illumination optical system; and a divergence angle providing member arranged in a conjugate space in which a surface optically conjugate with the predetermined surface is disposed, the divergence angle providing member being configured to provide a divergence angle to at least a partial beam which is a part of the light, to generate a plurality of beams with different divergence angles.

38. The illumination optical system according to claim 37, wherein the plurality of beams with the mutually different divergence angles are emitted from the divergence angle providing member and wherein the plurality of beams with the different divergence angles pass at mutually different positions on a plane crossing the optical axis of the illumination optical system.

39. The illumination optical system according to claim 37, wherein the divergence angle providing member is arranged in a first optical path in which the partial beam travels, and has such a characteristic that when a parallel beam is incident thereto, the divergence angle providing member converts the incident beam into a divergent beam with a predetermined divergence angle and emits the divergent beam.

40. The illumination optical system according to claim 37, wherein the divergence angle providing member comprises: a first region having such a characteristic that when a parallel beam is incident thereto, the first region converts the incident beam into a first divergent beam with a first divergence angle and emits the first divergent beam; and a second region having such a characteristic that when a parallel beam is incident thereto, the second region converts the incident beam into a second divergent beam with a second divergence angle and emits the second divergent beam.

41. The illumination optical system according to claim 40, comprising a light intensity distribution setting unit arranged in an optical path on the entrance side of the divergence angle providing member, the light intensity distribution setting unit is configured to set a light intensity distribution in which an intensity of light incident to the second region is higher than an intensity of light incident to the first region.

42. The illumination optical system according to claim 37, wherein the divergence angle providing member is interchangeable with another divergence angle providing member with a different characteristic.

43. The illumination optical system according to claim 42, wherein a first divergence angle distribution which is defined as a distribution on a plane crossing the optical axis of the illumination optical system, of divergence angles of beams emitted from the divergence angle providing member with incidence of a parallel beam to the divergence angle providing member and a second divergence angle distribution which is defined as a distribution on the plane crossing the optical axis of the illumination optical system, of divergence angles of beams emitted from the other divergence angle providing member with incidence of a parallel beam to the other divergence angle providing member are distributions different from each other.

44. The illumination optical system according to claim 37, comprising a polarizing member arranged in a predetermined space in which the predetermined surface is disposed or in the conjugate space, the polarizing member being configured to change a polarization state of the partial beam.

45. The illumination optical system according to claim 44, wherein the polarizing member has: a first polarizing element configured to change a first beam incident thereto into light in a first polarization state; and a second polarizing element configured to change a second beam incident thereto into light in a second polarization state, and
wherein the second beam is parallel to the first beam.

46. The illumination optical system according to claim 44, wherein the polarizing member has a wave plate arranged only in a first optical path in which the partial beam travels.

47. The illumination optical system according to claim 44, wherein the polarizing member has an azimuth rotator arranged only in a first optical path in which the partial beam travels.

48. The illumination optical system according to claim 44, comprising an optical integrator,
wherein the polarizing member is arranged in an optical path on an incidence side of the optical integrator.

* * * * *